(12) United States Patent
Yu et al.

(10) Patent No.: US 11,862,700 B2
(45) Date of Patent: Jan. 2, 2024

(54) SEMICONDUCTOR DEVICE STRUCTURE INCLUDING FORKSHEET TRANSISTORS AND METHODS OF FORMING THE SAME

(71) Applicant: TAIWAN SEMICONDUCTOR MANUFACTURING COMPANY, LTD., Hsinchu (TW)

(72) Inventors: Jia-Ni Yu, New Taipei (TW); Kuo-Cheng Chiang, Hsinchu (TW); Mao-Lin Huang, Hsinchu (TW); Lung-Kun Chu, New Taipei (TW); Chung-Wei Hsu, Hsinchu (TW); Chun-Fu Lu, Hsinchu (TW); Chih-Hao Wang, Hsinchu (TW); Kuan-Lun Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 99 days.

(21) Appl. No.: 17/207,573

(22) Filed: Mar. 19, 2021

(65) Prior Publication Data
US 2022/0302275 A1  Sep. 22, 2022

(51) Int. Cl.
| | |
|---|---|
| *H01L 29/423* | (2006.01) |
| *H01L 21/8238* | (2006.01) |
| *H01L 27/092* | (2006.01) |
| *H01L 29/66* | (2006.01) |

(52) U.S. Cl.
CPC .......... *H01L 29/42392* (2013.01); *H01L 21/823828* (2013.01); *H01L 21/823857* (2013.01); *H01L 27/092* (2013.01); *H01L 29/66545* (2013.01)

(58) Field of Classification Search
CPC .............. H01L 27/0886; H01L 29/785; H01L 21/823431; H01L 29/66795; H01L 21/823821; H01L 23/5389; H01L 27/0924; H01L 21/76229; H01L 23/5384; H01L 21/823481; H01L 21/823878
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |

(Continued)

*Primary Examiner* — Brian Turner
(74) *Attorney, Agent, or Firm* — NZ Carr Law Office

(57) ABSTRACT

A semiconductor device structure, along with methods of forming such, are described. The semiconductor device structure includes a first dielectric feature extending along a first direction, the first dielectric feature comprising a first dielectric layer having a first sidewall and a second sidewall opposing the first sidewall, a first semiconductor layer disposed adjacent the first sidewall, the first semiconductor layer extending along a second direction perpendicular to the first direction, a second dielectric feature extending along the first direction, the second dielectric feature disposed adjacent the first semiconductor layer, and a first gate electrode layer surrounding at least three surfaces of the first semiconductor layer, and a portion of the first gate electrode layer is exposed to a first air gap.

17 Claims, 46 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0323949 A1* | 11/2017 | Loubet | H01L 29/66439 |
| 2019/0237336 A1* | 8/2019 | Wang | H01L 29/78696 |
| 2020/0006356 A1* | 1/2020 | Ando | H01L 21/02532 |
| 2020/0006525 A1* | 1/2020 | Crum | H01L 29/42392 |
| 2020/0035567 A1* | 1/2020 | Chanemougame | H01L 29/401 |
| 2020/0373300 A1* | 11/2020 | Zhang | H01L 29/78696 |
| 2021/0028068 A1* | 1/2021 | Dentoni Litta | H01L 29/6656 |
| 2022/0231020 A1* | 7/2022 | Frougier | H01L 29/42392 |

* cited by examiner

SEMICONDUCTOR DEVICE STRUCTURE INCLUDING FORKSHEET TRANSISTORS AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-19A are cross-sectional side views of various stages of manufacturing the semiconductor device structure taken along cross-section A-A of FIG. 12, in accordance with some embodiments.

FIGS. 13B-19B are cross-sectional side views of various stages of manufacturing the semiconductor device structure taken along cross-section B-B of FIG. 12, in accordance with some embodiments.

DETAILED DESCRIPTION

Figure 1:
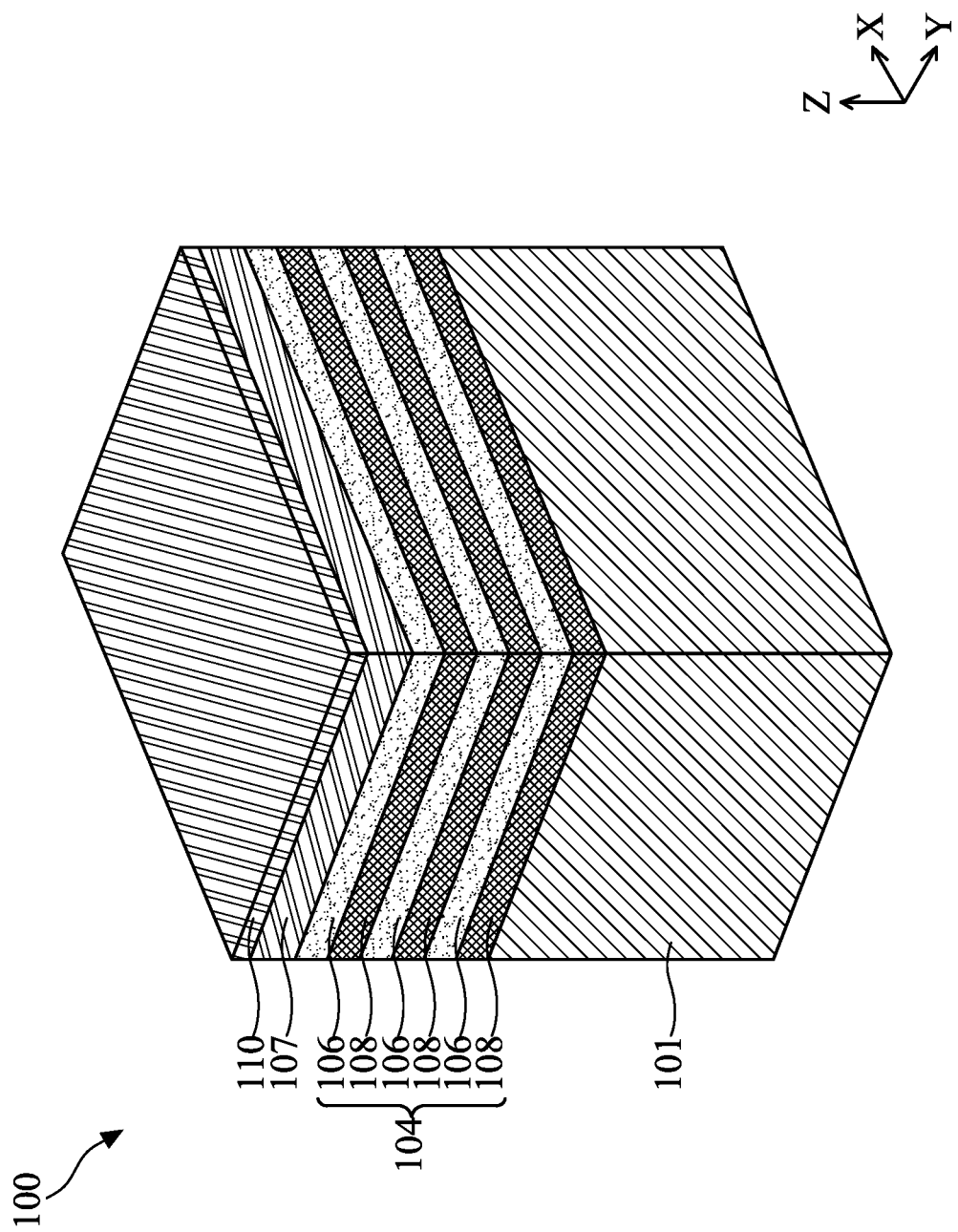
FIGS. 1-3 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-34B show exemplary sequential processes for manufacturing a semiconductor device structure 100, in accordance with some embodiments. It is understood that additional operations can be provided before, during, and after processes shown by FIGS. 1-34B, and some of the operations described below can be replaced or eliminated, for additional embodiments of the method. The order of the operations/processes may be interchangeable.

As shown in FIG. 1, a stack of semiconductor layers 104 is formed over a substrate 101. The substrate 101 may be a semiconductor substrate. As shown in FIG. 1, a semiconductor device structure 100 includes the stack of semiconductor layers 104 formed over a surface (e.g., front side) of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate 101 to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottommost buffer layer to 70 atomic percent germanium for the top-most buffer layer.

The substrate 101 may include various regions that have been doped with impurities (e.g., dopants having p-type or n-type conductivity). Depending on circuit design, the dopants may be, for example boron for an p-type (or p-channel) field effect transistor (FET) and phosphorus for an n-type (or n-channel) FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. For example, at least three surfaces of the nanosheet channel(s) may be surrounded by the gate electrode, and the transistor is a forksheet transistor. The semiconductor device structure 100 may include a nanosheet transistor and/or a forksheet transistor. The nanosheet transistors may be referred to as nanowire transistors, gate-all-around (GAA) transistors, multi-bridge channel (MBC) transistors, or any transistors having the gate electrode surrounding the channels.

It is noted that while three layers of the first semiconductor layers 106 and three layers of the second semiconductor layers 108 are alternately arranged as illustrated in FIG. 1, it is for illustrative purposes and not intended to be limiting beyond what is specifically recited in the claims. It is contemplated that any number of first and second semiconductor layers 106, 108 can be formed in the stack of semiconductor layers 104, and the number of layers depending on the predetermined number of channels for the semiconductor device structure 100. In some embodiments, the number of first semiconductor layers 106, which is the number of channels, is between 2 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The substrate 101 may include a sacrificial layer 107 on the stack of semiconductor layers 104. The sacrificial layer 107 protects the stack of semiconductor layers 104 during the subsequent processes and is removed along with a portion of a cladding layer (FIG. 11) prior to formation of the sacrificial gate stack (FIG. 12). In cases where the first semiconductor layer 106 of the stack of semiconductor layers 104 is Si, the sacrificial layer 107 includes SiGe epitaxially grown on the first semiconductor layer 106.

As will be described in more detail below, the first semiconductor layers 106 may serve as channels for the semiconductor device structure 100 and the thickness is chosen based on device performance considerations. In some embodiments, each first semiconductor layer 106 has a thickness ranging from about 1 nanometer (nm) to about 20 nm, such as about 3 nm to about 10 nm. The sacrificial layer 107 may have a thickness that is equal, less, or greater than the thickness of the first semiconductor layer 106. The thickness of the sacrificial layer 107 may range from about 2 nm to 50 nm. The second semiconductor layers 108 may eventually be removed and serve to define a vertical distance between adjacent nanosheet channels for the semiconductor device structure 100 and the thickness is chosen based on device performance considerations. In some embodiments, each second semiconductor layer 108 has a thickness ranging from about 5 nm to about 20 nm, such as about 8 nm to 16 nm. If the thickness of the second semiconductor layer 108 is less than 5 nm, the space created as a result of removal of the second semiconductor layers 108 may be too small for the subsequent gate electrode layer to get in and form around the first semiconductor layers 106. On the other hand, if the thickness of the second semiconductor layer 108 is greater than 20 nm, the manufacturing cost is increased without significant advantage and the scaling down of the device is compromised.

A mask structure 110 is formed over the sacrificial layer 107. The mask structure 110 may include an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The mask structure 110 may be formed by any suitable deposition process, such as chemical vapor deposition (CVD) process.

Figure 2:
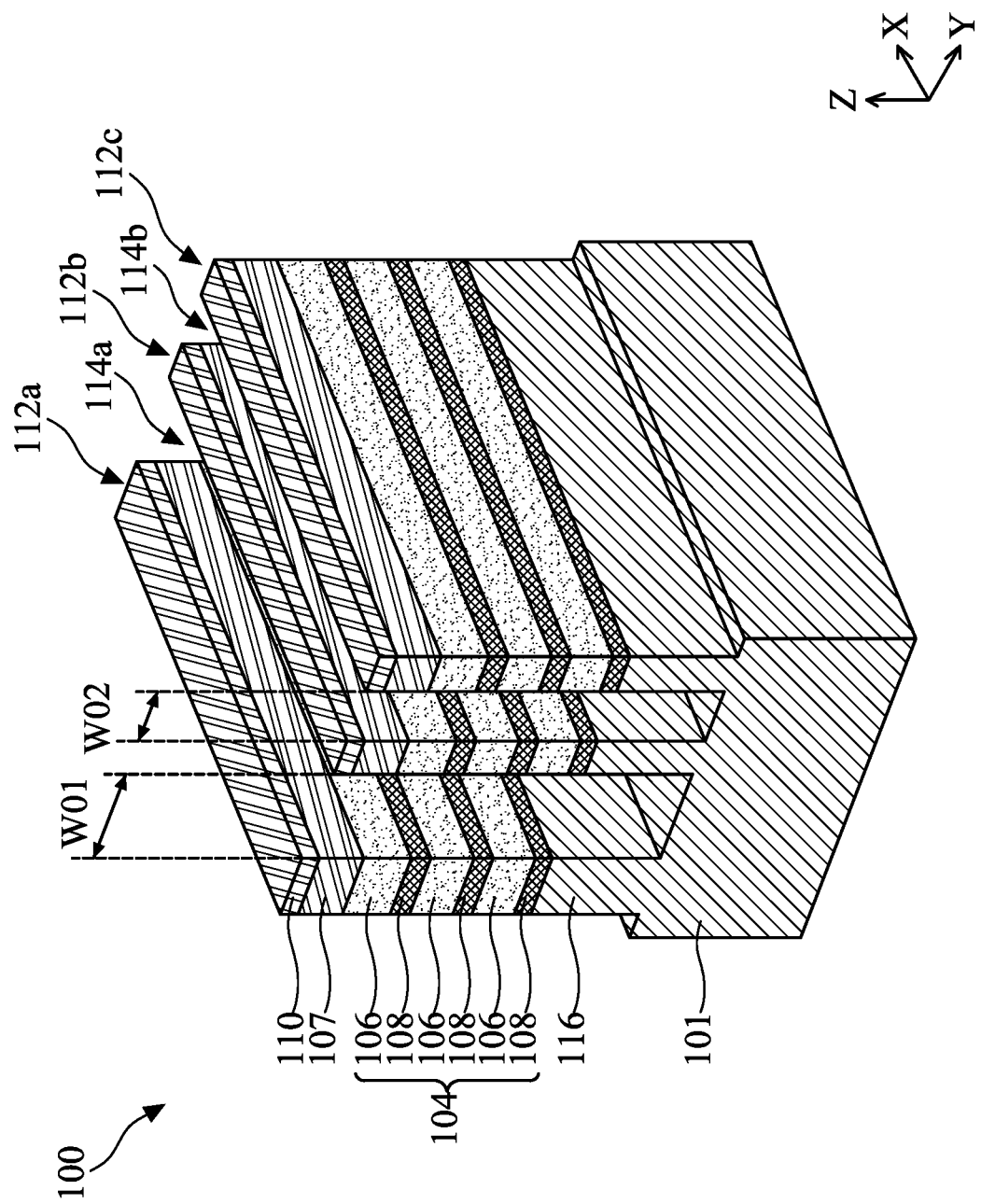

FIG. 2 is a perspective view of one of the various stages of manufacturing the semiconductor device structure 100, in accordance with some embodiments. As shown in FIG. 2, fin structures 112 (112a-112c) are formed from the stack of semiconductor layers 104. Each fin structure 112 has an upper portion including the semiconductor layers 106, 108 and a well portion 116 formed from the substrate 101. The fin structures 112 may be fabricated using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 (e.g., 114a, 114b) in unprotected regions through the mask structure 110, through the stack of semiconductor layers 104, and into the substrate 101, thereby leaving the plurality of extending fin structures 112 (e.g., 112a, 112b, 112c). The trenches 114 extend along the X direction. The trenches 114 may be etched using a dry etch (e.g., RIE), a wet etch, and/or combination thereof.

As shown in FIG. 2, the trenches 114a and 114b are formed with different widths between the fin structures 112a, 112b, 112c. The trench 114a is formed between the fin structure 112a and the fin structure 112b and has a width W01, which corresponds to the first distance D1 shown in FIG. 4. The trench 114b is formed between the fin structure 112b and the fin structure 112c and has a width W02, which corresponds to the second distance D2 shown in FIG. 4. The width W02 may be equal, less, or greater than the width W01 of the trench 114a. In the embodiment shown in FIG. 2, the width W01 is greater than the width W02. The width of the trenches 114a, 114b may vary upon the width of the fin structures 112a, 112b, 112c, which varies depending on the channel width of the devices needed in the semiconductor device structure 100. As described above, the first semiconductor layers 106 may serve as channels in a nanosheet and/or forksheet transistor device. The devices with a wider channel, such as the device fabricated from the fin structure 112a, may be more suitable for high-speed applications, such as a NAND device. The devices with a narrower channel, such as the device fabricated from the fin structures 112b, 112c, may be more suitable for low-power and low-leakage applications, such as an inverter device. Therefore, trenches with wider width (e.g., trench 114a) may be formed in regions where devices/transistors require higher voltage current and/or higher performance, while trenches with narrower width (e.g., trench 114b) may be formed in regions where greater density of devices/transistors is desired.

Figure 3:
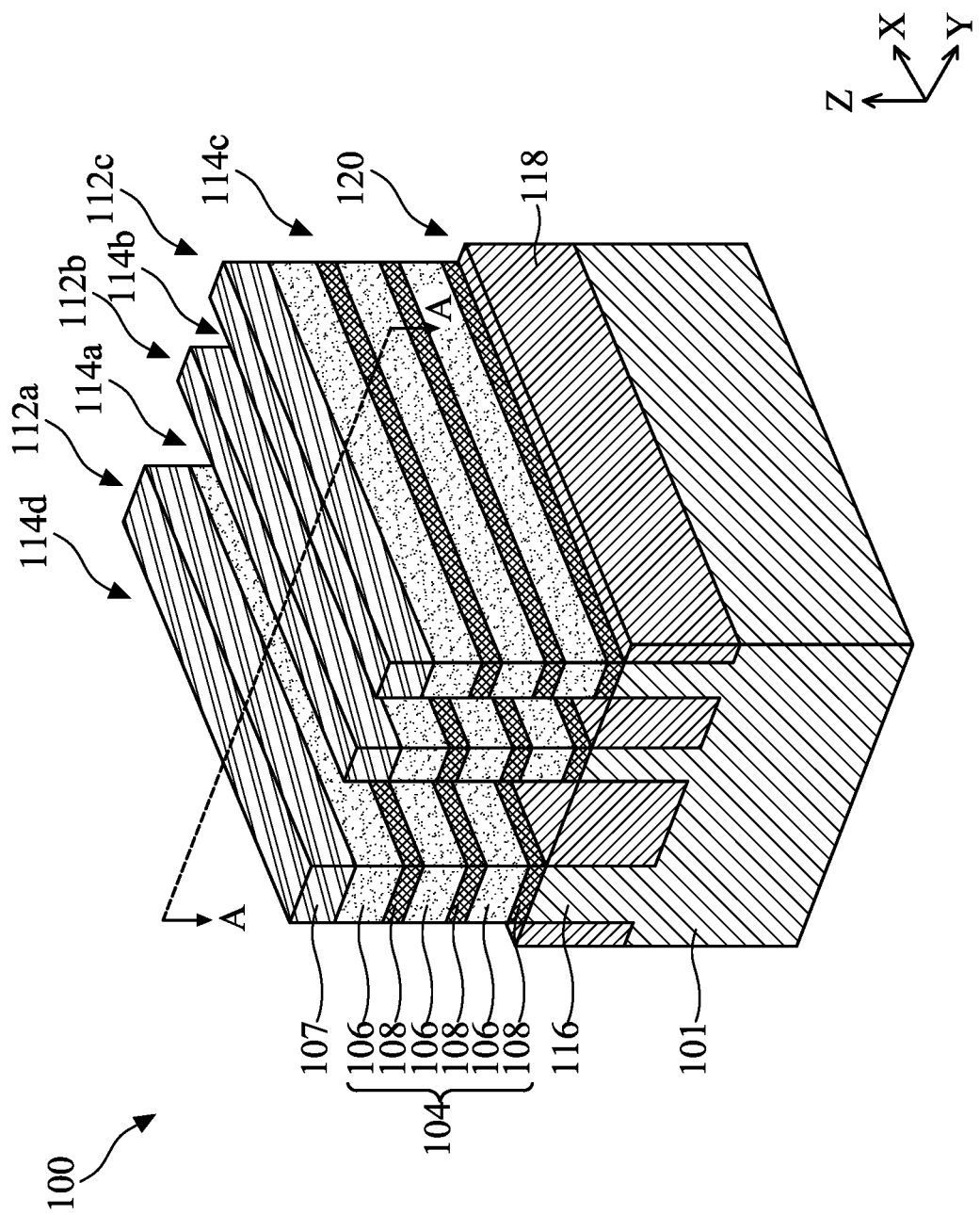

FIG. 3 is a perspective view of one of the various stages of manufacturing the semiconductor device structure 100, in accordance with some embodiments. After the fin structures 112 are formed, an insulating material 118 is formed on the substrate 101. The insulating material 118 fills the trenches 114 (FIG. 2) between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120, as shown in FIG. 3. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or slightly below a surface of the second semiconductor layer 108 in contact with the well portion 116 formed from the substrate 101. Thereafter, the mask structures 110 is removed by any suitable process, such as ashing, dry etch, wet etch, or a combination thereof.

Figure 4:
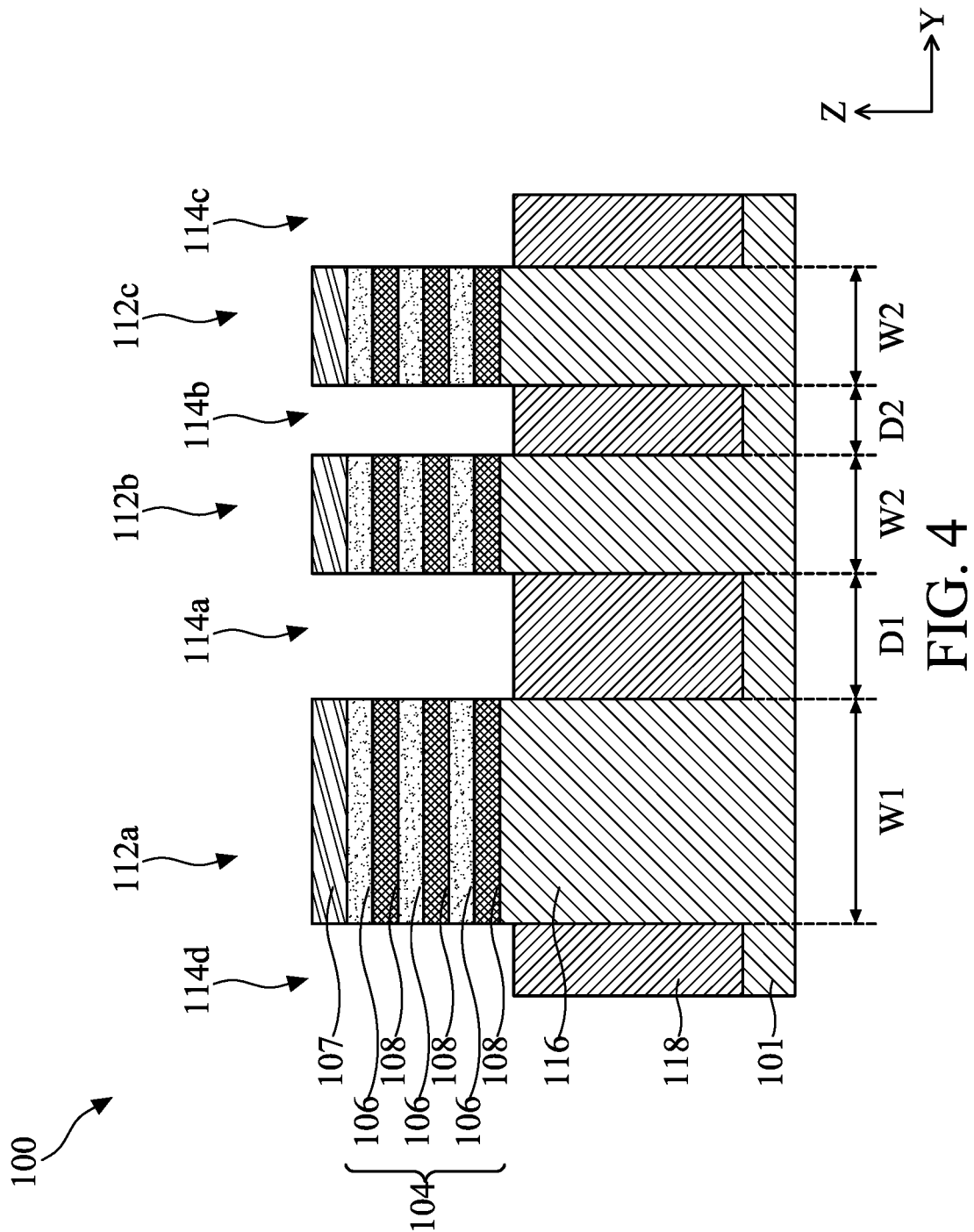
FIGS. 4-11 are cross-sectional side views of various stages of manufacturing the semiconductor device structure taken along cross-section A-A of FIG. 3, in accordance with some embodiments.

FIGS. 4-11 are cross-sectional side views of various stages of manufacturing the semiconductor device structure taken along cross-section A-A of FIG. 3, in accordance with some embodiments. As shown in FIG. 4, the semiconductor device structure 100 has three fin structures 112a, 112b, and 112c formed along the Y direction. The fin structure 112a may have a first width W1, and the fin structures 112b, 112c may each has a second width W2. In the embodiment shown in FIG. 4, the first width W1 is greater than the second width W2. The widths W1 and W2 may correspond to the device's channel width. In one embodiment, the width W2 is in a range between 5 nm to about 120 nm, for example about 10 nm to about 100 nm.

Figure 10:
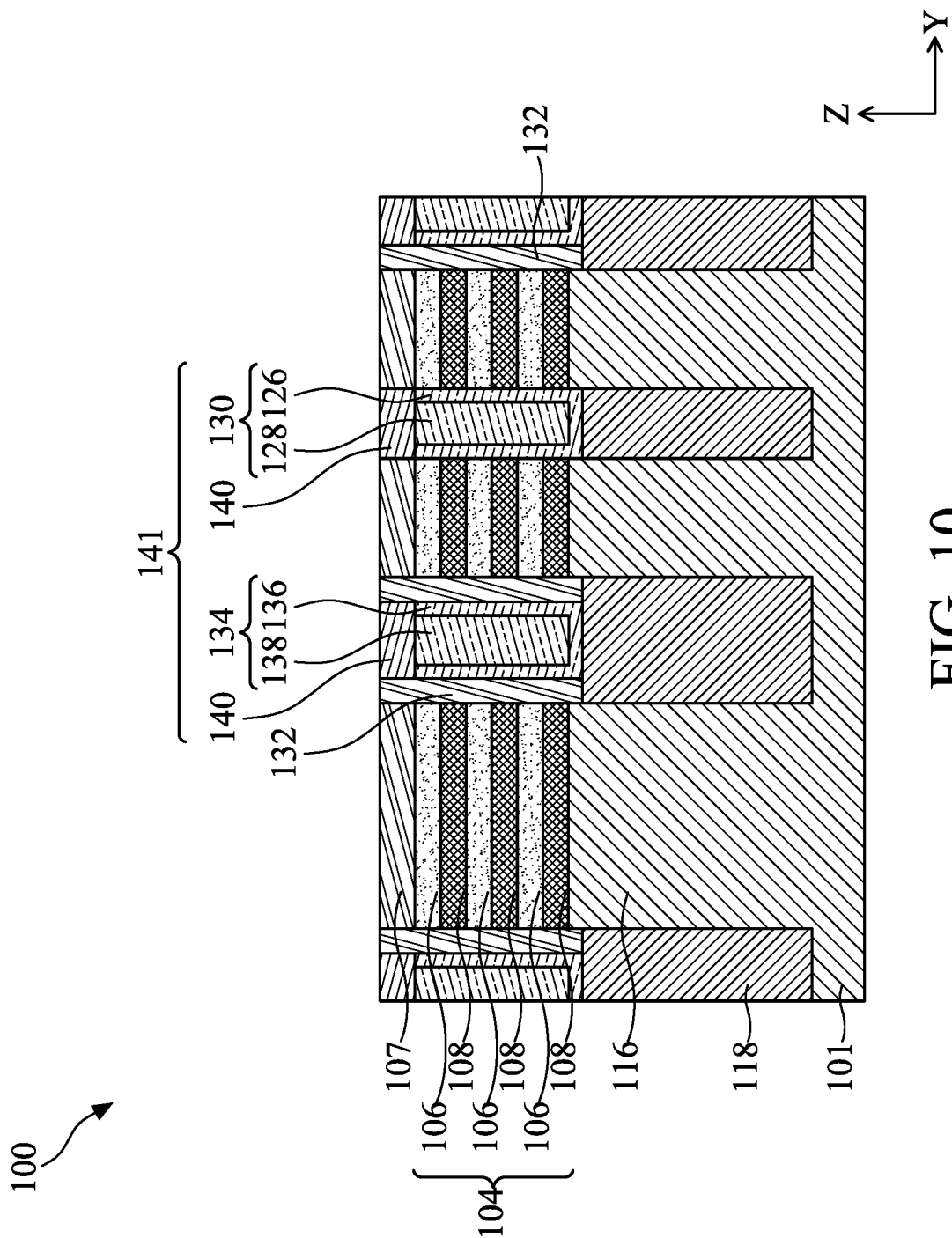

As discussed above, the distances between adjacent fins 112a, 112b, and 112c may vary depending on the devices to be formed in the area. In some embodiments, adjacent fin structures used to form similar devices may be spaced apart by a first distance D1, and adjacent fin structures used to form different devices may be spaced apart by a second distance D2. The distance D1 or D2 between adjacent fin structures may be defined by the distance between a first sidewall of one fin structure and a second sidewall of the adjacent fin structure facing the first sidewall. The first distance D1 and the second distance D2 define the width of the subsequent first and second dielectric features 130, 134 (FIG. 10). In one embodiment shown in FIG. 4, the first distance D1 is greater than the second distance D2. The second distance D2 may be in a range from about 2 nm to about 40 nm, for example about 3 nm to about 30 nm. With the smaller distance D2 (i.e., reduced fin-to-fin spacing) between the fin structures 112b and 112c, layers of a first dielectric feature 130 (FIG. 6) subsequently formed in the trench 114b may merge, while the trench 114a between the fin structures 112a and 112b remains open after the deposition of layers of the first dielectric feature 130 due to the wider distance D1. The merged layers of the first dielectric feature 130 allow the nanosheet channels to attach to both sides of the first dielectric feature 130 and form forksheet transistors at a later stage. The reduced fin-to-fin spacing and fork-like nanosheet transistors enable greater device density (even with greater channel width) and superior area and performance scalability.

Depending on the application, the trenches 114c and 114d may have a width corresponding to the first distance D1 or the second distance D2. In some embodiments, a fin structure (not shown) having a width corresponding to W1 may be disposed adjacent to and spaced apart the fin structure 112a by the trench 114d. Likewise, a fin structure (not shown) having a width corresponding to W2 may be disposed adjacent to and spaced apart the fin structure 112c by the trench 114c.

Figure 5:
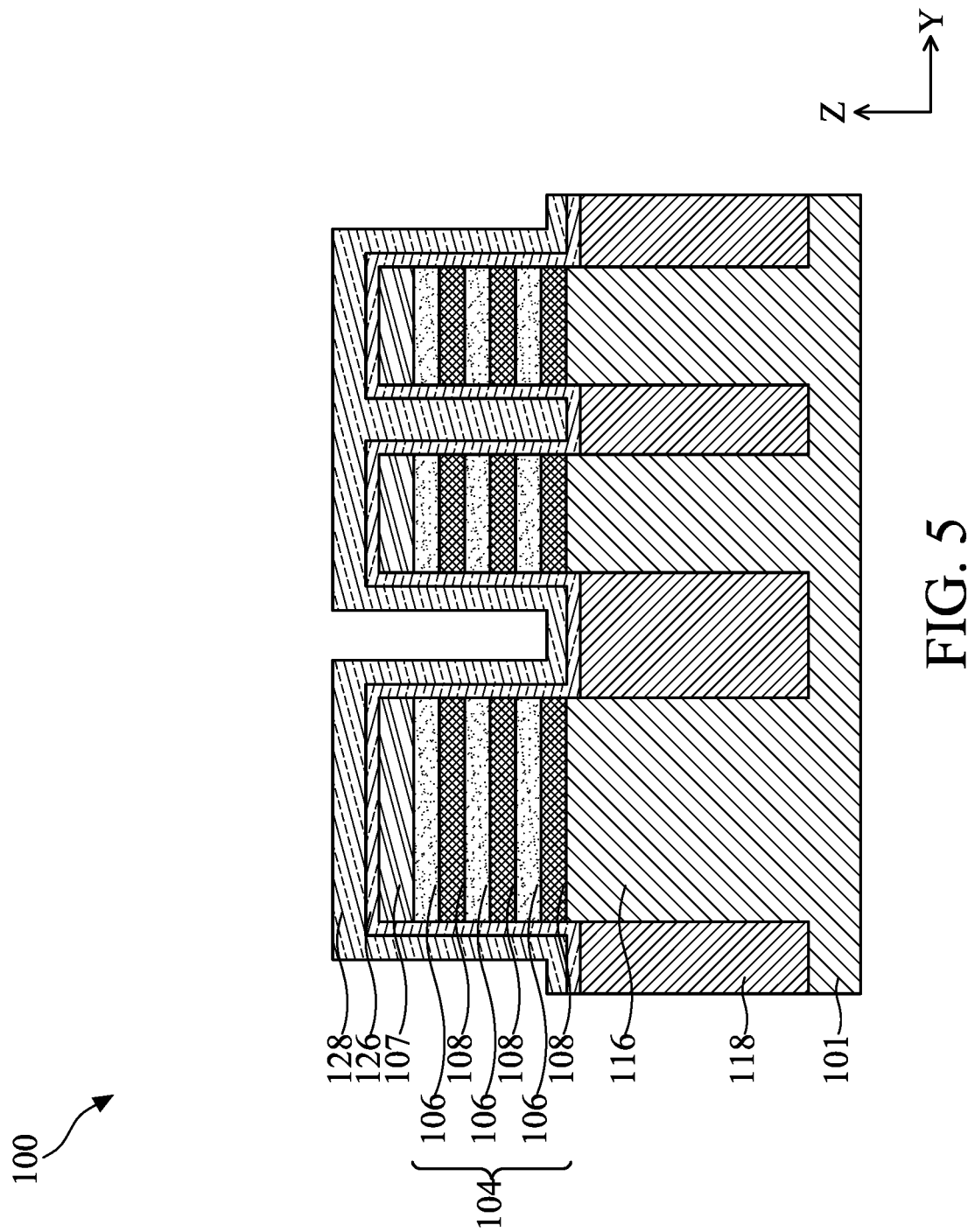

As shown in FIG. 5, a first dielectric layer 126 is formed on the exposed surfaces of the semiconductor device structure 100 and in the trenches 114a, 114b, 114c, 114d (FIG. 4). The first dielectric layer 126 may include a high-K material having a K value of 7 or above. Exemplary materials may include, but are not limited to $HfO_2$, $ZrO_2$, $HfAlO_x$, $HfSiO_x$, $Al_2O_3$, etc. The first dielectric layer 126 may be formed by a conformal process, such as an ALD process. The first dielectric layer 126 may be formed on the exposed surface of the insulating material 118 at the bottom of the trenches 114a, 114b, 114c, 114d and on the exposed portions of the fin structures 112a, 112b, 112c (e.g., first and second semiconductor layers 106, 108 and the sacrificial layer 107). The first dielectric layer 126 may have a thickness ranging from about 0.5 nm to about 10 nm.

Next, a second dielectric layer 128 is formed on the first dielectric layer 126 in the trench 114a, 114b, 114c, 114d, and over the fin structures 112a, 112b, 112c. The second dielectric layer 128 fills the trench 114b (FIG. 4) due to the small distance D2 but not the trench 114a (FIG. 4). The second dielectric layer 128 may include a low-K dielectric material (e.g., a material having a K value lower than 7). In some embodiments, the second dielectric layer 128 is a silicon-containing low-K dielectric material such as $SiO_2$, SiN, SiCN, SiOC, or SiOCN. The second dielectric layer 128 may be formed by a conformal process, such as an ALD process. The second dielectric layer 128 may have a thickness ranging from about 5 nm to about 30 nm. If the thickness of the second dielectric layer 128 is less than about 5 nm, the trench 114b may not be filled. On the other hand, if the thickness of the second dielectric layer 128 is greater than about 30 nm, the trench 114a may be filled.

Figure 6:
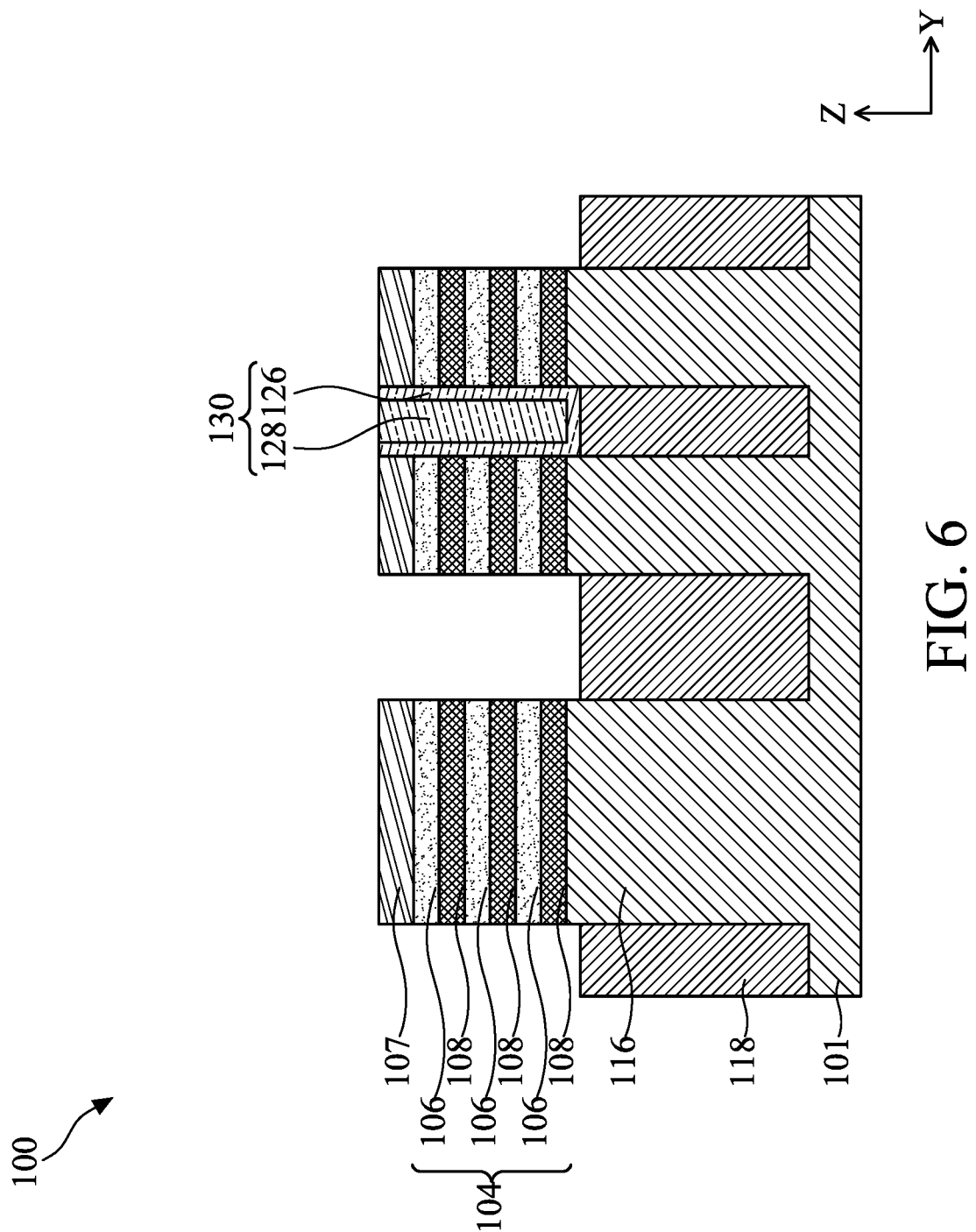

As shown in FIG. 6, the first dielectric layer 126 and the second dielectric layer 128 are recessed. The recess of the first dielectric layer 126 and the second dielectric layer 128 may be performed by any suitable removal process, such as dry etch, wet etch, or a combination thereof. The removal process may be selective etch processes that remove portions of the first dielectric layer 126 and the second dielectric layer 128 but not the sacrificial layers 107, the first semiconductor layers 106, the second semiconductor layers 108, and the insulating material 118. Because the trench 114a (FIG. 4) is not completely filled and has a larger dimension (i.e., first distance D1) in the Y direction compared to that of the trench 114b (FIG. 4), the etchant removes more of the first dielectric layer 126 and the second dielectric layer 128 in the trench 114a than the first dielectric layer 126 and the second dielectric layer 128 in the trench 114b. As a result, the first dielectric layer 126 and the second dielectric layer 128 in the trench 114a are etched at a faster rate than the etch rate of the first dielectric layer 126 and the second dielectric layer 128 in the trench 114b. In cases where the first dielectric layer 126 and the second dielectric layer 128 include different materials, and a first etch process may be performed to recess the second dielectric layer 128 followed by a second etch process to recess the first dielectric layer 126. While not shown, the tops of the first dielectric layer 126 and the second dielectric layer 128 may have a concave profile due to etching effects from the removal process.

The removal process is performed until the first dielectric layer 126 and the second dielectric layer 128 in the trenches 114a, 114c, 114d are completely etched away. The removal process also removes the first dielectric layer 126 and the second dielectric layer 128 on exposed surfaces of the fin structure 112a, 112b, 112c and the insulating material 118. As a result of the removal process, the first dielectric layer 126 and the second dielectric layer 128 on exposed surfaces of the semiconductor device structure 100 are removed except for the first dielectric layer 126 and the second dielectric layer 128 filled in the trench 114b. The first dielectric layer 126 and the second dielectric layer 128 in the trench 114b may be referred to herein as a first dielectric feature 130. As shown below in FIG. 7, the sidewalls 127 (127a, 127b) and the bottom 129 of the second dielectric layer 128 are in contact with the first dielectric layer 126. The sidewall 127a opposes the sidewall 127b, and the bottom 129 connects the sidewall 127a to sidewall 127b.

Figure 7:
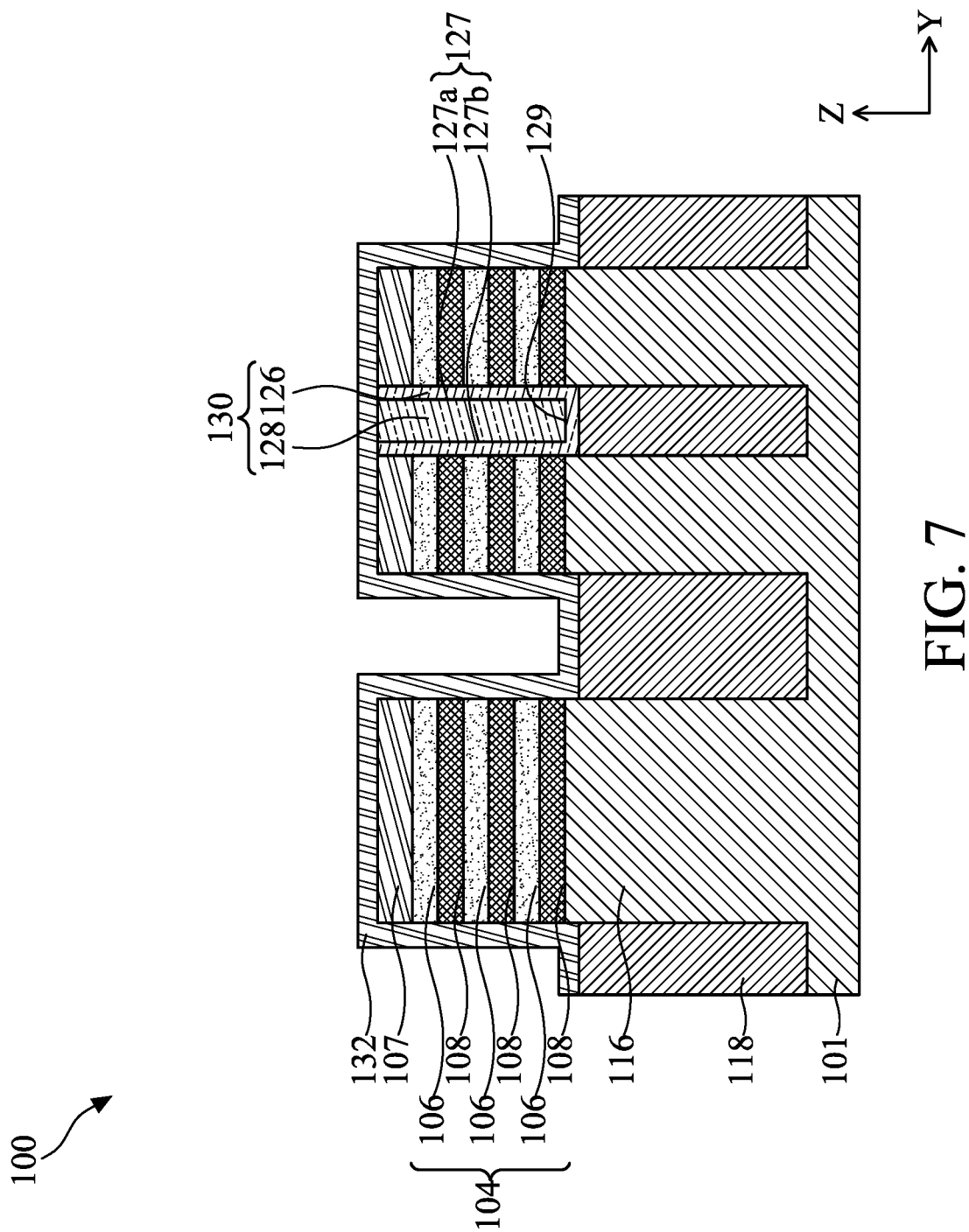

As shown in FIG. 7, a cladding layer 132 is formed on the exposed surfaces of the stack of semiconductor layers 104, the dielectric feature 130 (e.g., a top surface of the first dielectric layer 126 and a top surface of the second dielectric layer 128), and the insulating material 118. The cladding layer 132 may be formed by a conformal process, such as an ALD process. The cladding layer 132 may have substantially the same thickness ranging from about 2 nm to about 20 nm, for example about 5 nm to about 13 nm. The thickness of the cladding layer 132 formed on the sidewalls of the fin structures 112a, 112b, 112c may define the space for an IL 178 (FIG. 29), a HK dielectric layer 180 (FIG. 29), and first/second gate electrode layers 182/184 (FIG. 29) to be formed therein after subsequent removal of the cladding layers 132. Thus, if the thickness of the cladding layer 132 is more than about 20 nm, the trench 114a may be filled, resulting in the second dielectric feature 134 and the subsequent layers from not forming in the trench 114a. In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 include SiGe. The cladding layer 132 and the second semiconductor layer 108 may be removed subsequently to create space for the gate electrode layer.

Figure 8:
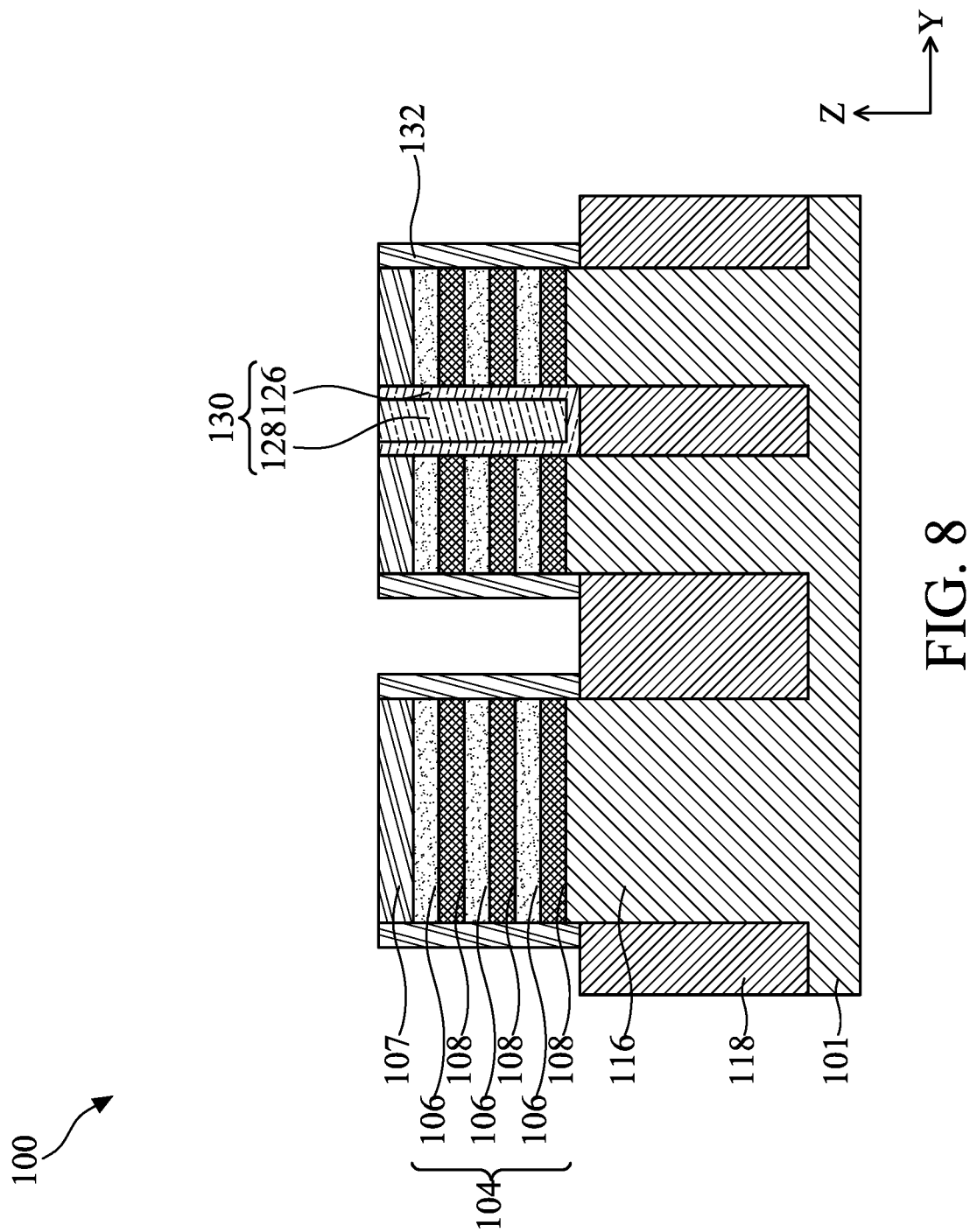

As shown in FIG. 8, portions of the cladding layer 132 are removed. The removal of the cladding layer 132 may be performed by any suitable removal process, such as dry etch, wet etch, or a combination thereof. The removal process may be an anisotropic etch process to remove the cladding layer 132 formed on horizontal surfaces of the fin structures 112a, 112b, 112c (e.g., top surfaces of the sacrificial layer 107, the first dielectric layer 126 and the second dielectric layer 128) and on the insulating material 118. The removal process does not remove the cladding layer 132 formed on vertical surfaces of the fin structures 112a, 112b, 112c.

Figure 9:
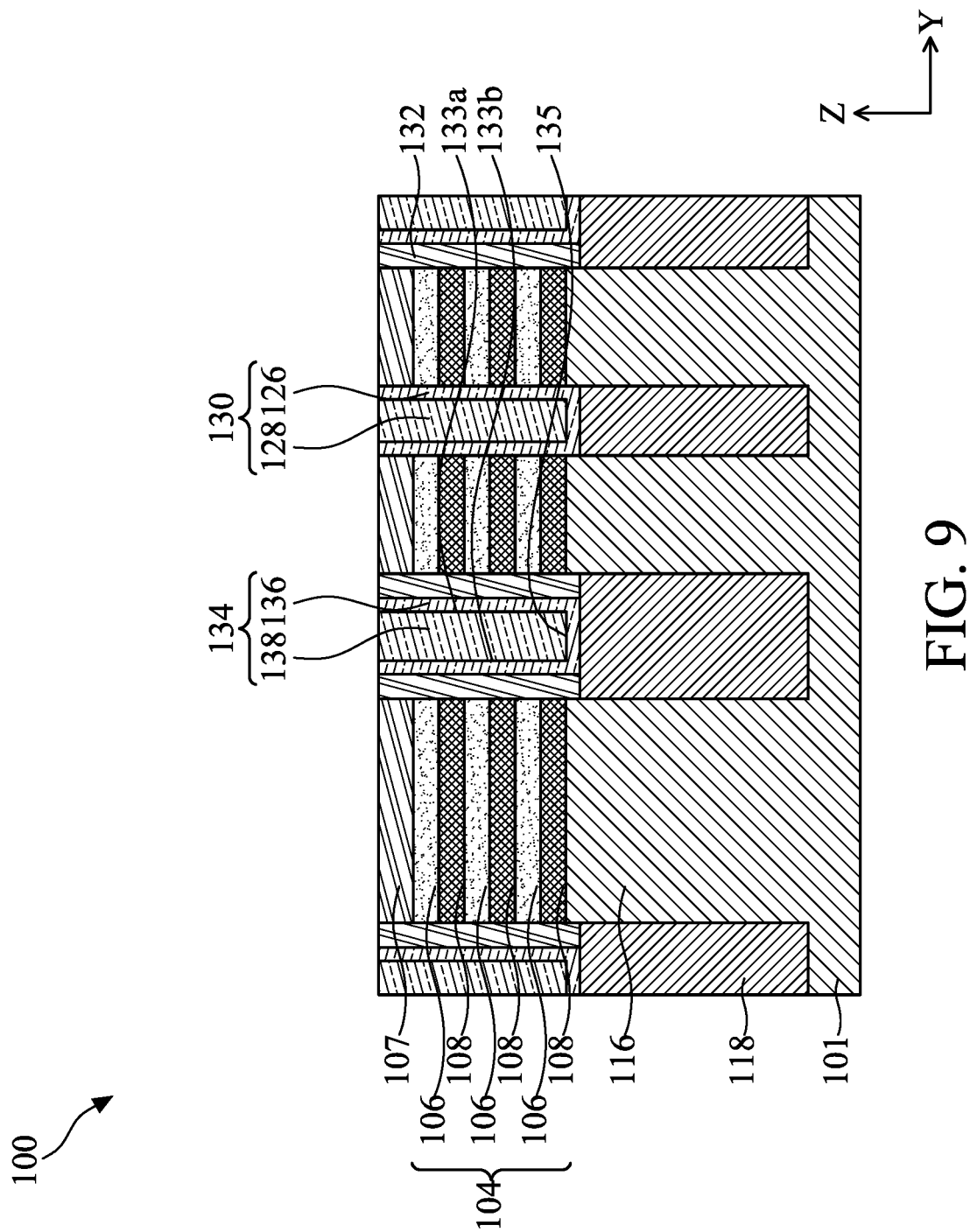

As shown in FIG. 9, a second dielectric feature 134 is formed in the trenches 114a, 114c, 114d (FIG. 4). The second dielectric feature 134 includes a third dielectric layer 136 and a fourth dielectric layer 138 formed on the third dielectric layer 136. The third dielectric layer 136 may include the same material and have substantially the same thickness as the first dielectric layer 126. Likewise, the fourth dielectric layer 138 may include the same material as the second dielectric layer 128. The second dielectric feature 134 may be formed in a similar fashion as the first dielectric feature 130. For example, the third dielectric layer 136 may be formed on the cladding layer 132 and on the exposed surface of the insulating material 118 at the bottom of the trenches 114a, 114c, 114d and on the exposed portions of the first dielectric feature (e.g., top surfaces of the first and second dielectric layers 126, 128), using a conformal process, such as an ALD process. The fourth dielectric layer 138 is then formed in the trenches 114a, 114c, 114d and over the fin structures 112a, 112b, 112c and the first dielectric feature 130. The fourth dielectric layer 138 may be formed by a flowable process, such as an FCVD process. The fourth dielectric layer 138 may have a thickness ranging from about 2 nm to about 15 nm. The fourth dielectric material 138 fills the trenches 114a, 114c, 114d. Thus, if the thickness of the fourth dielectric layer 138 is less than about 2 nm, the trenches 114a, 114c, 114d may not be filled.

Next, a planarization process is performed to expose the top surfaces of the third dielectric layer 136, the cladding layer 132, the sacrificial layer 107, the fourth dielectric layer 138, the first dielectric layer 126, and the second dielectric layer 128, as shown in FIG. 9. The planarization process may be any suitable process, such as a CMP process. As the result of the planarization process, the second dielectric feature 134 is formed in the trenches 114a, 114c, 114d (FIG. 4). The sidewalls 133 (133a, 133b) and the bottom 135 of the fourth dielectric layer 138 are in contact with the third dielectric layer 136. The sidewall 133a opposes the sidewall 133b, and the bottom 135 connects the sidewall 133a to sidewall 133b.

As shown in FIG. 10, portions of the first dielectric feature 130 and the second dielectric feature 134 are recessed. The recess of the first dielectric feature 130 and the second dielectric feature 134 may be performed by any suitable process, such as dry etch, wet etch, or a combination thereof. In cases where the first and second dielectric features 130, 134 are formed of the same material, the recess of the first dielectric feature 130 and the second dielectric feature 134 may be a selective process so that the semiconductor material of the sacrificial layers 107 and the cladding layers 132 are not substantially affected. The recess process may be controlled so that the tops of the first and second dielectric features 130, 134 are substantially at the same level as or below a top surface of the topmost first semiconductor layer 106 in the stack of semiconductor layers 104. In some embodiments, the top surface of the first and second dielectric features 130, 134 may be about 0 nm to about 10 nm below the level of the top surface of the topmost first semiconductor layer 106. As a result of the recess process, trenches (not shown) are formed above the first and second dielectric features 130, 134 and between adjacent fin structures 112.

Next, a dielectric layer 140 is formed in each trench formed above the first and second dielectric features 130, 134 and between adjacent fins 112. Suitable materials may include, but are not limited to, SiO, SiN, SiON, SiCN, SiOCN, HfSi$_x$O$_y$, ZrSi$_x$O$_y$, AlSi$_x$O$_y$, HfO$_2$, ZrO$_2$, HfAlO$_x$, Al$_2$O$_3$, any suitable material having a K value greater than that of silicon oxide, etc. The dielectric layer 140 may be formed by any suitable process, such as a CVD, PECVD, FCVD, or ALD process. The dielectric layer 140 may have a height along the Z direction ranging from about 10 nm to about 30 nm. The dielectric layer 140 may be utilized to separate, or cut-off, the subsequently formed gate electrode layers. Thus, if the height is less than about 10 nm, the gate electrode layers may not be sufficiently cut-off. On the other hand, if the height is greater than about 30 nm, the manufacturing cost is increased without significant advantage.

The dielectric layer 140 may be initially formed in the trenches (not shown) formed as a result of removal of the portions of the first and second dielectric features 130, 134. Portions of the dielectric layer 140 formed over the sacrificial layer 107 and the cladding layer 132 are then removed by a planarization process so that the top surfaces of the sacrificial layer 107 and the cladding layer 132 are substantially co-planar with the top surfaces of the dielectric layer 140. The dielectric layer 140 and each of the first dielectric feature 130 and the second dielectric feature 134 together may be referred to as a dielectric structure 141. The dielectric structures 141 can separate the subsequent S/D epitaxial features and the gate electrode layers between different FETs. In some embodiments, the dielectric structure 141 is a hybrid fin, which can include a single dielectric material or two or more dielectric materials.

Figure 11:
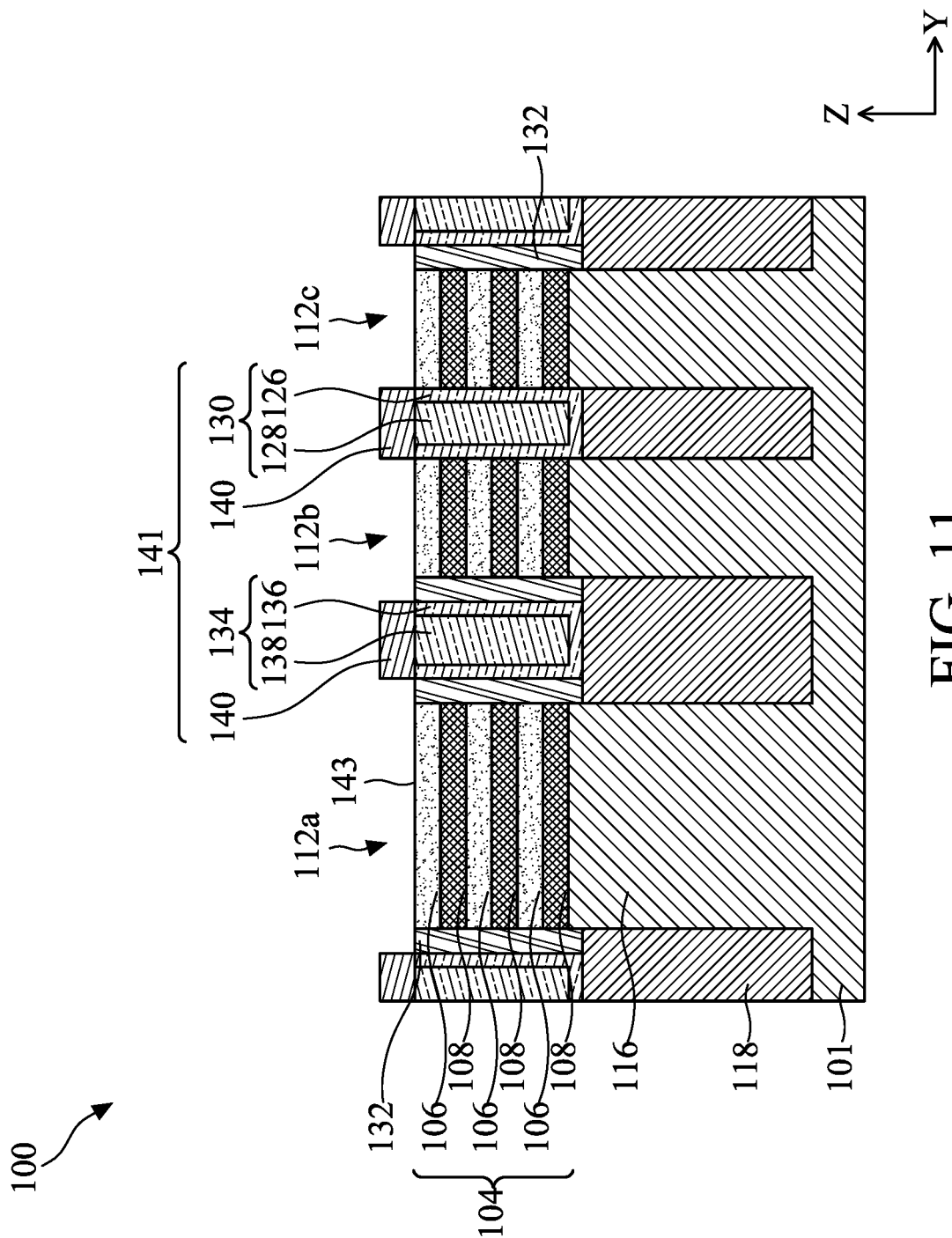
Figure 12:
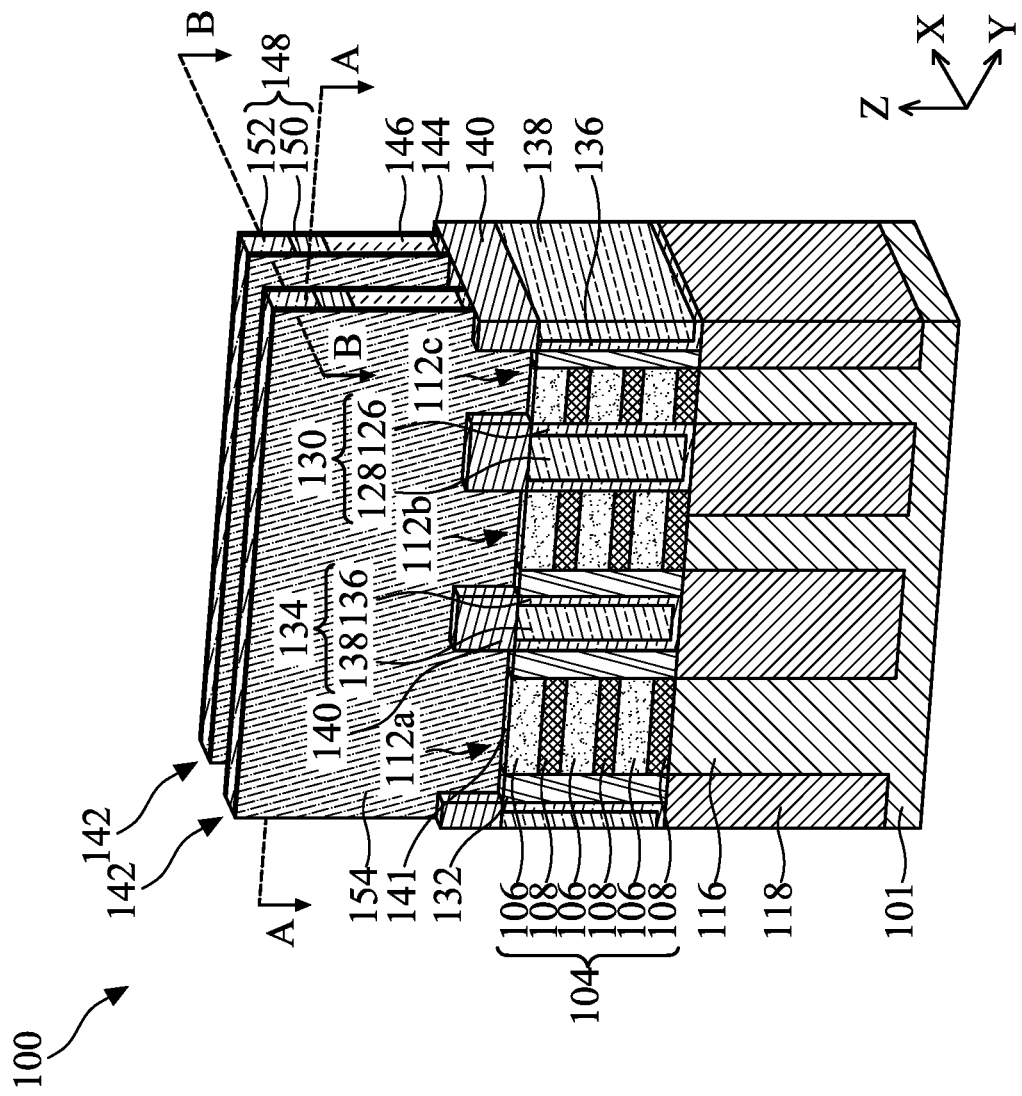
FIG. 12 is a perspective view of one of the various stages of manufacturing the semiconductor device structure, in accordance with some embodiments.

As shown in FIG. 11, the sacrificial layers 107 and portions of the cladding layers 132 are removed. The removal of the sacrificial layers 107 and the recess of the cladding layers 132 may be performed by any suitable etch process, such as dry etch, wet etch, or a combination thereof. The etch process may be controlled so that the remaining cladding layers 132 are substantially at the same level as the top surface 143 of the topmost first semiconductor layer 106 in the stack of semiconductor layers 104. In cases where the cladding layers 132 and the sacrificial layers 107 are made of SiGe, the etch process may be a selective etch process that removes the cladding layers 132 and the sacrificial layers 107, but does not remove the layers of the dielectric structures 141 (e.g., first and second dielectric features 130, 134). The removal of the sacrificial layers 107 exposes the top surfaces of the fin structures 112a, 112b, 112c.

Figure 13A:
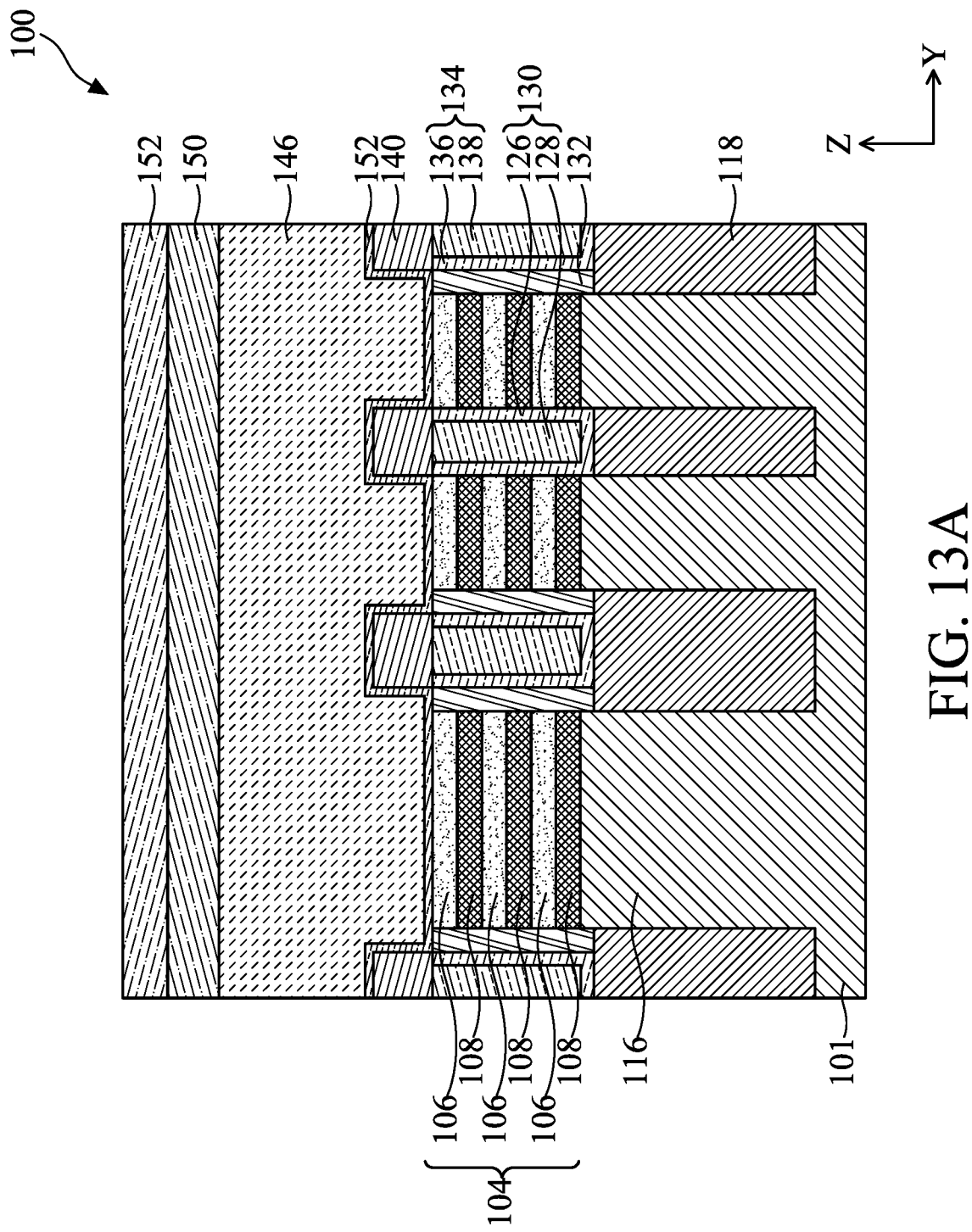
Figure 13B:
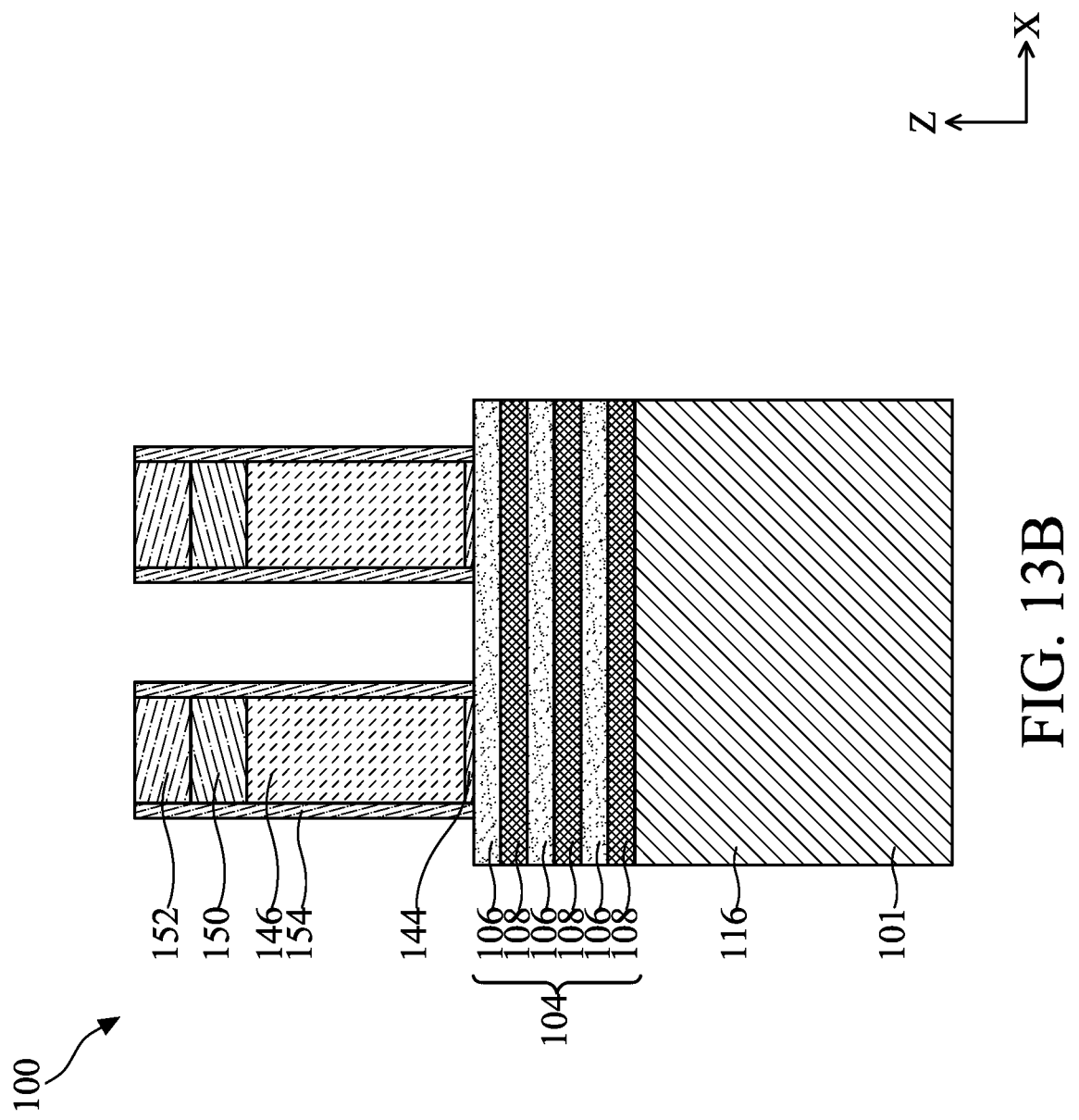

FIG. 12 is a perspective view of one of the various stages of manufacturing the semiconductor device structure 100, in accordance with some embodiments. FIGS. 13A-19A are cross-sectional side views of various stages of manufacturing the semiconductor device structure 100 taken along cross-section A-A of FIG. 12, in accordance with some embodiments. Cross-section A-A is in a plane of sacrificial gate stacks 142 along the Y direction. FIGS. 13B-19B are cross-sectional side views of various stages of manufacturing the semiconductor device structure 100 taken along cross-section B-B of FIG. 12, in accordance with some embodiments. Cross-section B-B is in a plane perpendicular to cross-section A-A and is in the fin structure 112c along the X direction. As shown in FIGS. 12, 13A and 13B, one or more sacrificial gate stacks 142 are formed on the semiconductor device structure 100. The sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as SiO$_2$, SiN, a high-K dielectric material, and/or other suitable dielectric material. In some embodiments, the sacrificial gate dielectric layer 144 may be deposited by a CVD process, a subatmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 142 may be formed by first depositing blanket layers of the sacrificial gate dielectric layer 144, the sacrificial gate electrode layer 146, and the mask structure 148, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 142, the stacks of semiconductor layers 104 of the fins 112a, 112b, 112c are partially exposed on opposite sides of the sacrificial gate stack 142. While two sacrificial gate stacks 142 are shown, the number of the sacrificial gate stacks 142 is not limited to two. More than two sacrificial gate stacks 142 may be arranged along the X direction in some embodiments.

Next, a spacer 154 is formed on the sidewalls of the sacrificial gate stacks 142. The spacer 154 may be formed by first depositing a conformal layer that is subsequently etched back to form sidewall spacers 154. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112a, 112b, 112c, the cladding layers 132, the third dielectric layers 136, and the fourth dielectric layers 138, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

Figure 14A:
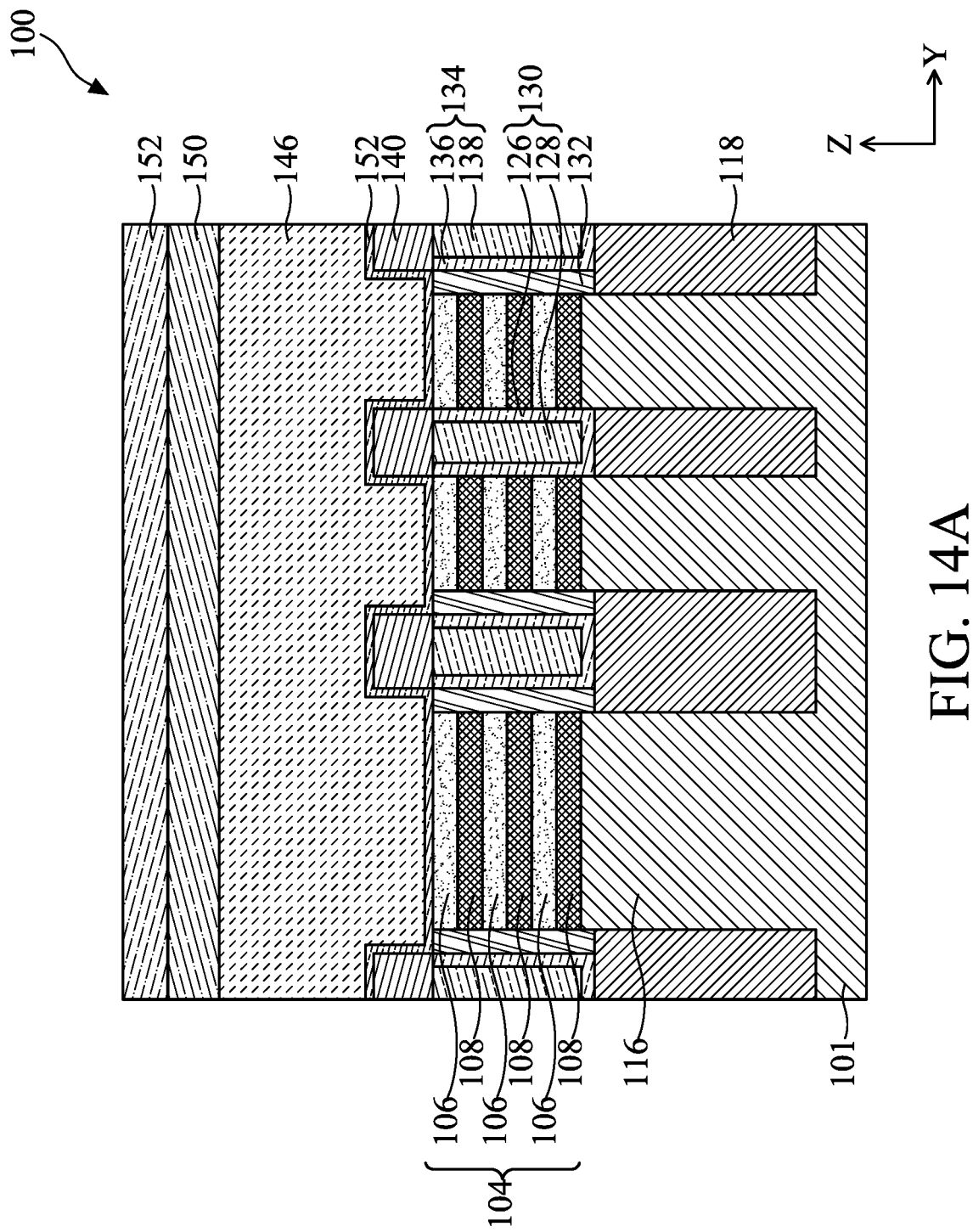
Figure 14B:
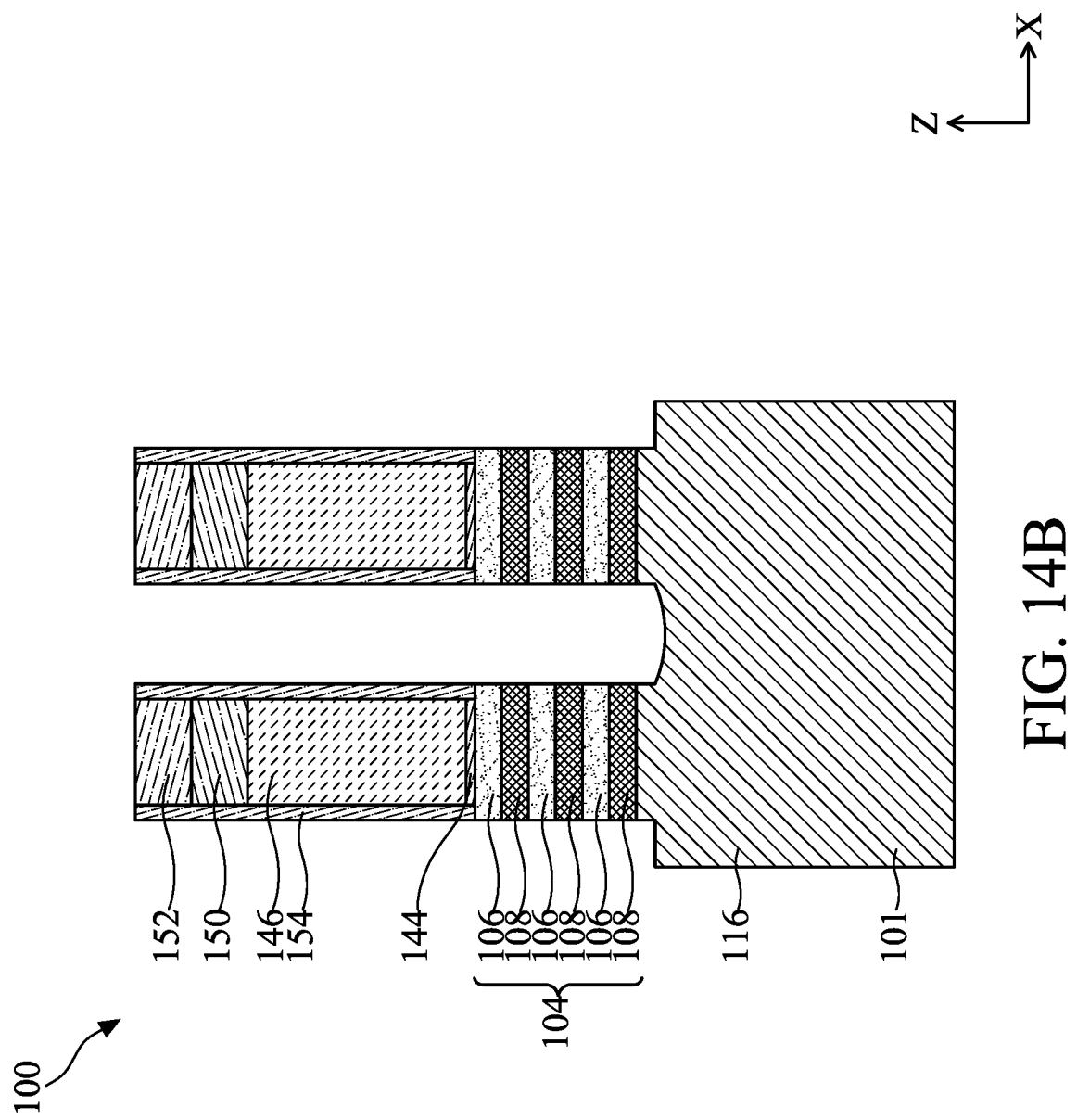

In FIGS. 14A and 14B, exposed portions of the fin structures 112a, 112b, 112c and exposed portions of the cladding layers 132 not covered by the sacrificial gate stacks 142 and the spacers 154 are selectively recessed by using one or more suitable etch processes, such as dry etch, wet etch, or a combination thereof. Portions of the dielectric layer 140 may also be removed or recessed. In some embodiments, exposed portions of the stacks of semiconductor layers 104 of the fin structures 112a, 112b, 112c are removed, exposing portions of the well portions 116 of the substrate 101. For example, the exposed portions of the fin structures 112a, 112b, 112c may be recessed to a level at or below the top surface of the insulating material 118. The etch processes may include an etch process that recesses the exposed portions of the fin structures 112a, 112b, 112c and the exposed portions of the cladding layers 132.

At this stage, end portions of the stacks of semiconductor layers 104 under the sacrificial gate stacks 142 and the spacers 154 have substantially flat surfaces which may be flush with corresponding spacers 154, as shown in FIG. 14B. In some embodiments, the end portions of the stacks of semiconductor layers 104 under the sacrificial gate stacks 142 and spacers 154 are slightly horizontally etched.

Figure 15A:
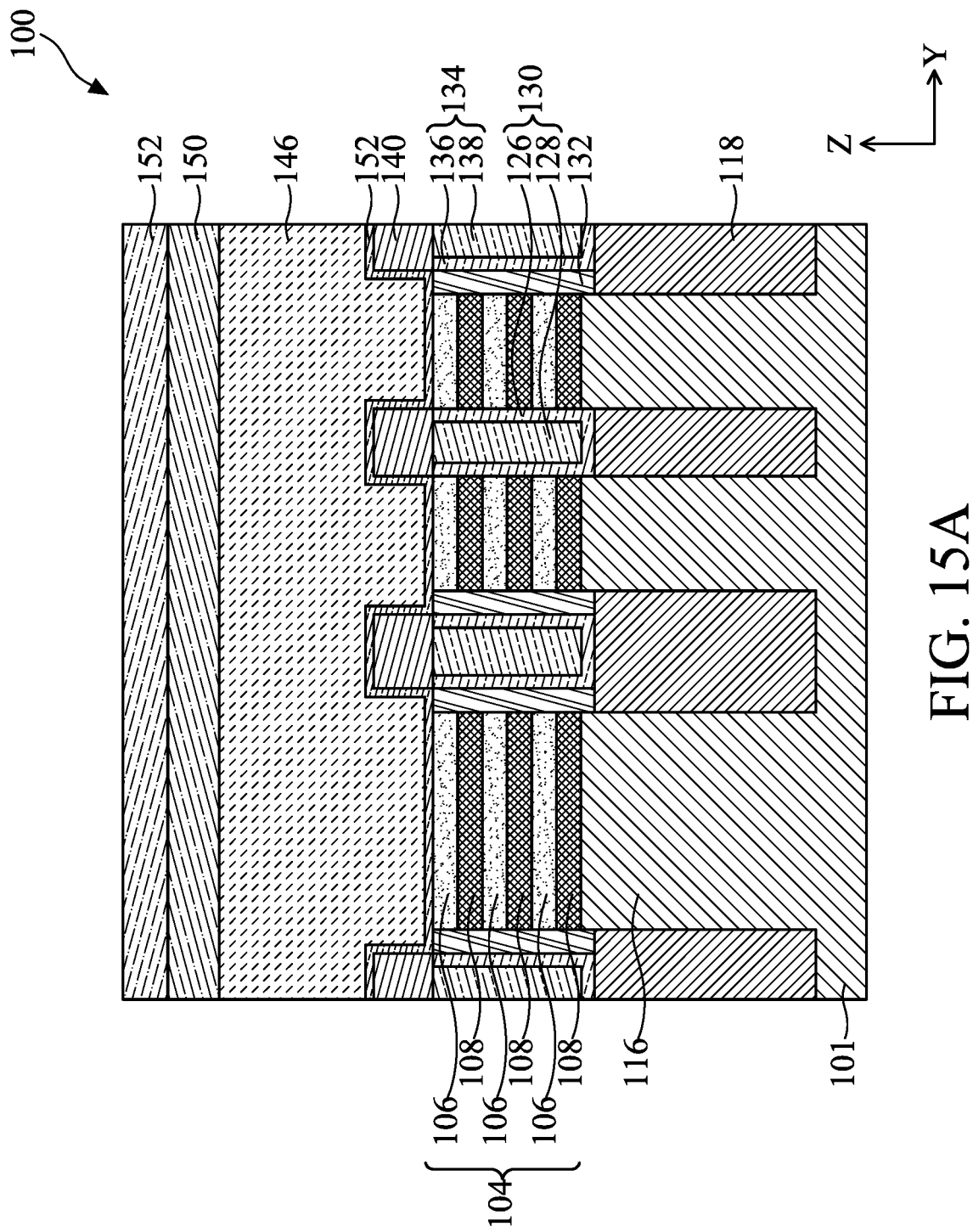
Figure 15B:
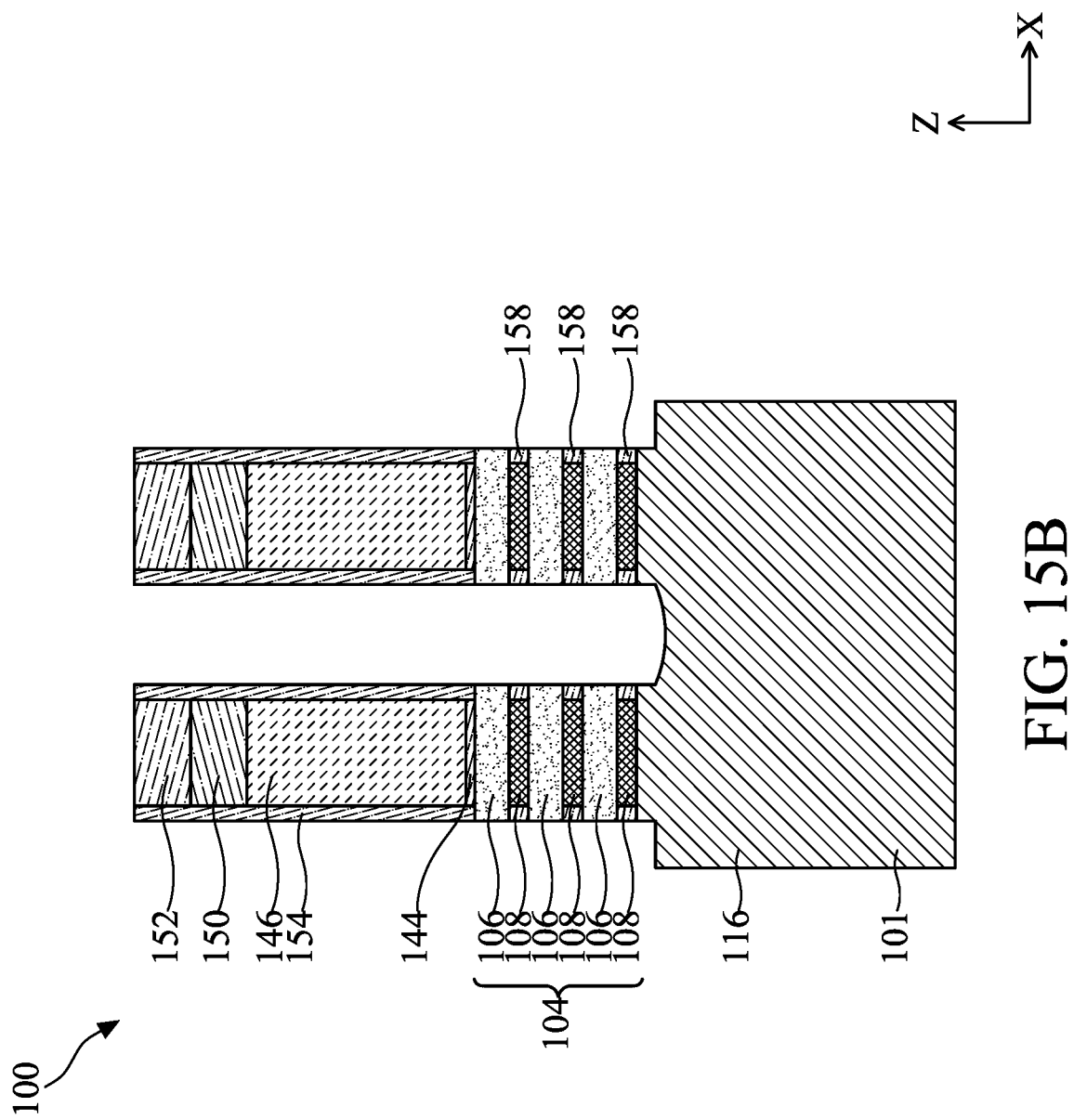

In FIGS. 15A and 15B, the edge portions of each second semiconductor layer 108 and the edge portions of the cladding layers (not shown) are removed to form a gap. In some embodiments, the portions of the semiconductor layers 108 are removed by a selective wet etching process that does not remove the first semiconductor layers 106. For example, in cases where the second semiconductor layers 108 are made of SiGe, and the first semiconductor layers 106 are made of silicon, a selective wet etching including an ammonia and hydrogen peroxide mixtures (APM) may be used.

Next, dielectric spacers 158 are formed in the gaps formed as the result of removal of the second semiconductor layer 108 and the cladding layers, as shown in FIG. 15B. In some embodiments, the dielectric spacers 158 may be made of a low-K dielectric material, such as SiON, SiCN, SiOC, SiOCN, or SiN. In some embodiments, the dielectric spacers 158 may be formed by first forming a conformal dielectric layer using a conformal deposition process, such as ALD, followed by an anisotropic etching to remove portions of the conformal dielectric layer other than the dielectric spacers 158. The dielectric spacers 158 may be protected by the first semiconductor layers 106 during the anisotropic etching process.

Figure 16A:
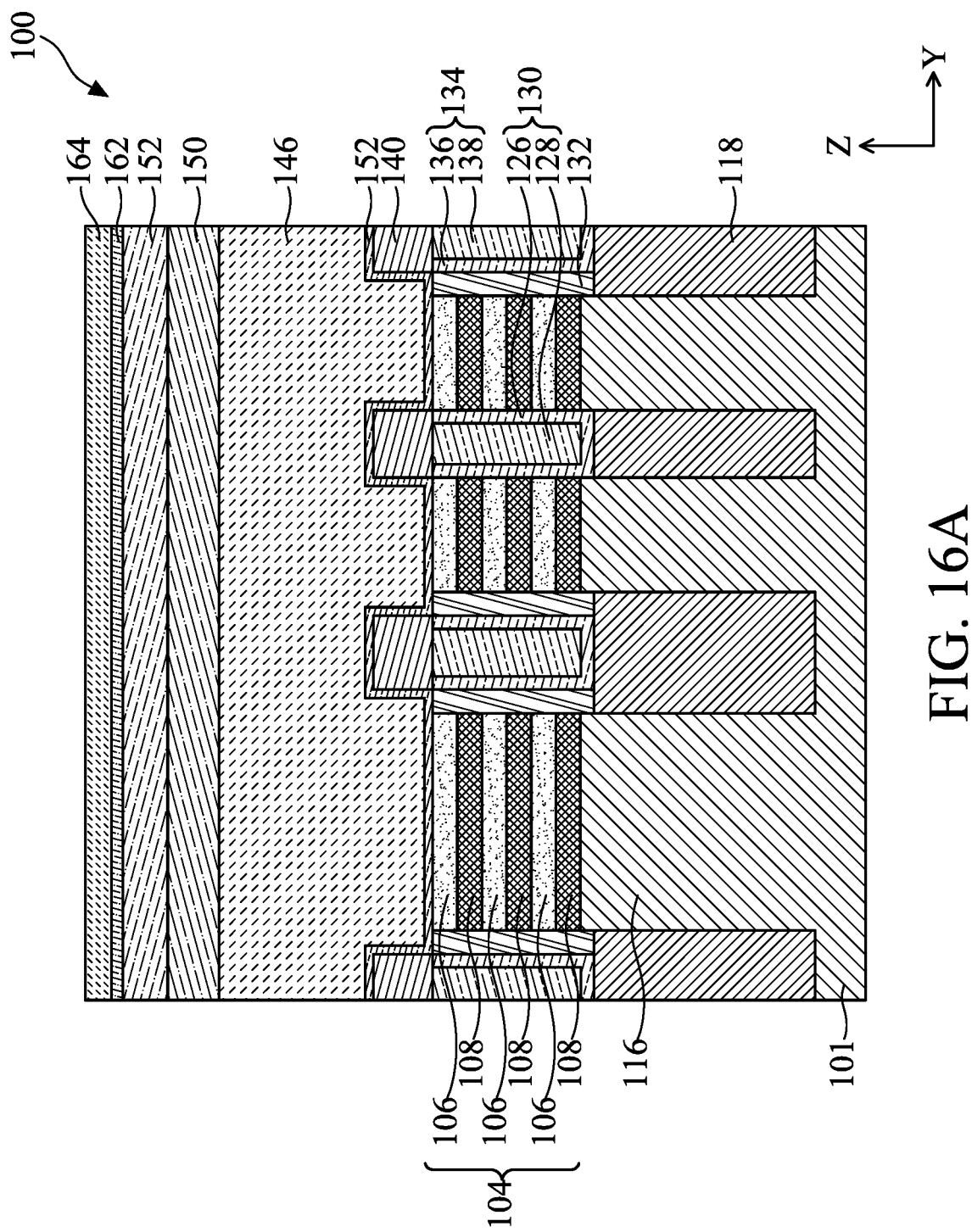
Figure 16B:
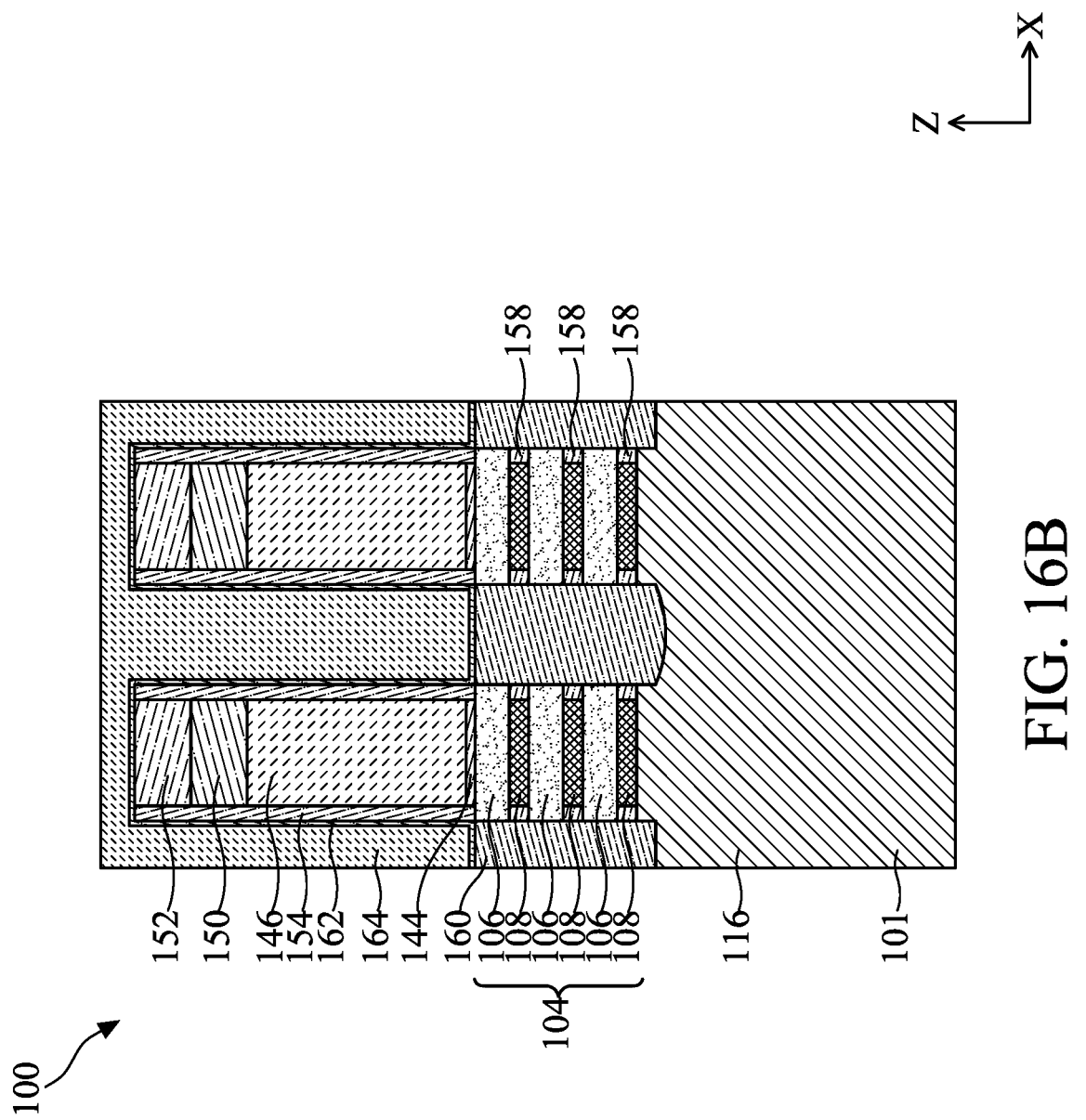

In FIGS. 16A and 16B, epitaxial S/D features 160 are formed on the well portions 116 of the fin structures 112a, 112b, 112c. For n-channel FETs, the epitaxial S/D features 160 may include one or more layers of Si, SiP, SiC, SiCP, or a group III-V material (InP, GaAs, AlAs, InAs, InAlAs, InGaAs). In some embodiments, the epitaxial S/D features 160 may be doped with n-type dopants, such as phosphorus (P), arsenic (As), etc., for n-type devices. For p-channel FETs, the epitaxial S/D features 160 may include one or more layers of Si, SiGe, SiGeB, Ge, or a group III-V material (InSb, GaSb, InGaSb). In some embodiments, the epitaxial S/D features 160 may be doped with p-type dopants, such as boron (B).

The epitaxial S/D features 160 may grow both vertically and horizontally to form facets, which may correspond to crystalline planes of the material used for the substrate 101. The epitaxial S/D features 160 are formed by an epitaxial growth method using CVD, ALD or MBE. The epitaxial S/D features 160 are in contact with the first semiconductor layers 106 and dielectric spacers 158, as shown in FIG. 16B. The epitaxial S/D features 160 may be the S/D regions. For example, one of a pair of epitaxial S/D features 160 located on one side of the stack of semiconductor layers 104 can be a source region, and the other of the pair of epitaxial S/D features 160 located on the other side of the stack of semiconductor layers 104 can be a drain region. A pair of epitaxial S/D features 160 includes a source epitaxial feature 160 and a drain epitaxial feature 160 connected by the channels (i.e., the first semiconductor layers 106). In this disclosure, a source and a drain are interchangeably used, and the structures thereof are substantially the same. Depending on the circuit design, the devices on the fin structures 112a and 112c may be designed for p-channel FETs and the devices on the fin structure 112b may be designed for n-channel FETs, or vice versa.

After the formation of the epitaxial S/D features 160, a contact etch stop layer (CESL) 162 may be formed on the epitaxial S/D features 160, the dielectric structures 140, the cladding layers 132, and the sacrificial gate stack 142, as shown in FIGS. 16A and 16B. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162. The materials for the ILD layer 164 may include an oxide formed from tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figure 17A:
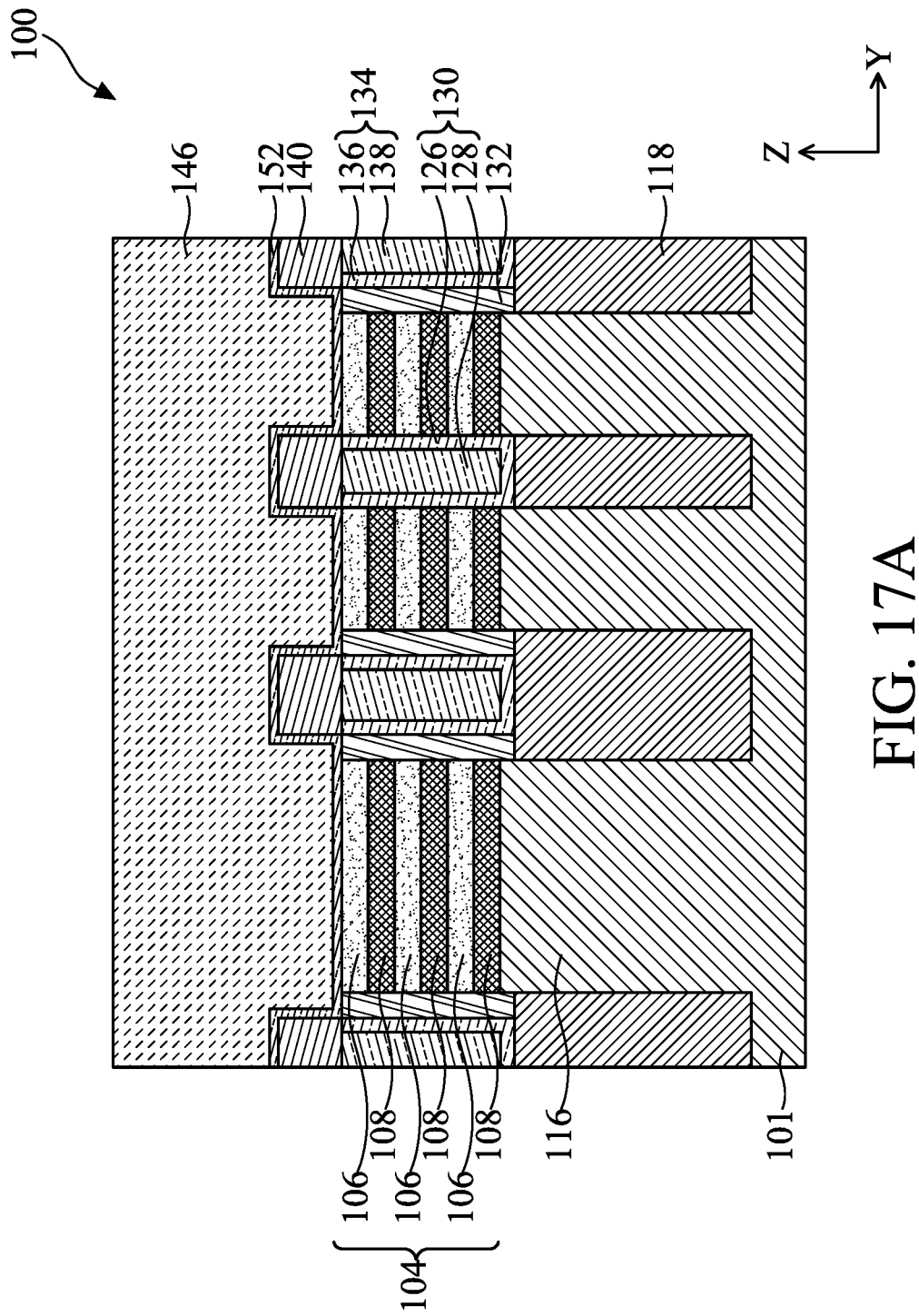
Figure 17B:
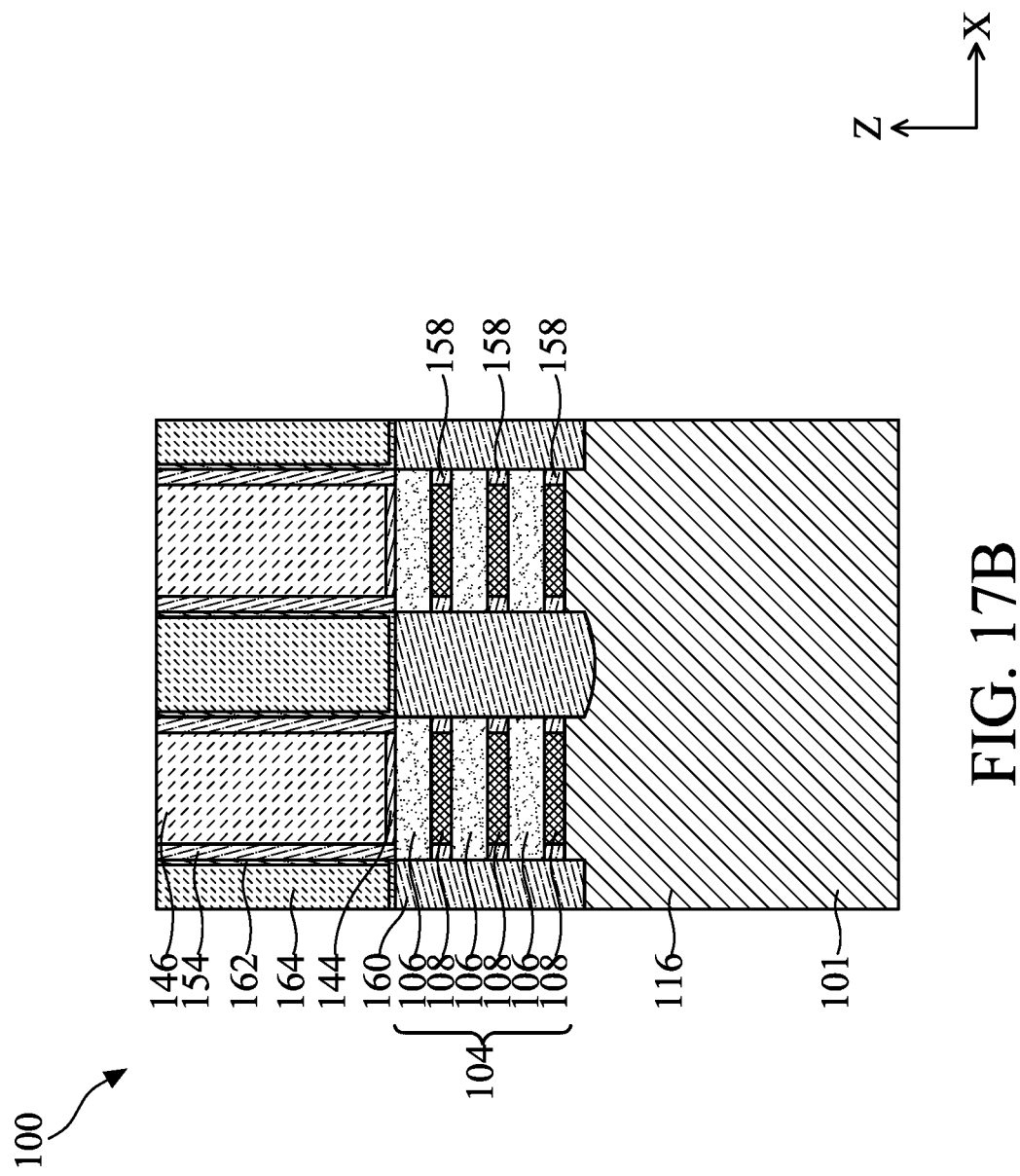

In FIGS. 17A and 17B, a planarization process is performed to expose the sacrificial gate electrode layer 146. The planarization process may be any suitable process, such as a CMP process. The planarization process removes portions of the ILD layer 164 and the CESL 162 disposed on the sacrificial gate stacks 142. The ILD layer 164 may be recessed to a level below the top of the sacrificial gate electrode layer 146. In some cases, a nitrogen-containing layer (not shown), such as a SiCN layer, may be formed on the recessed ILD layer 164 to protect the ILD layer 164 during subsequent etch processes.

Figure 18A:
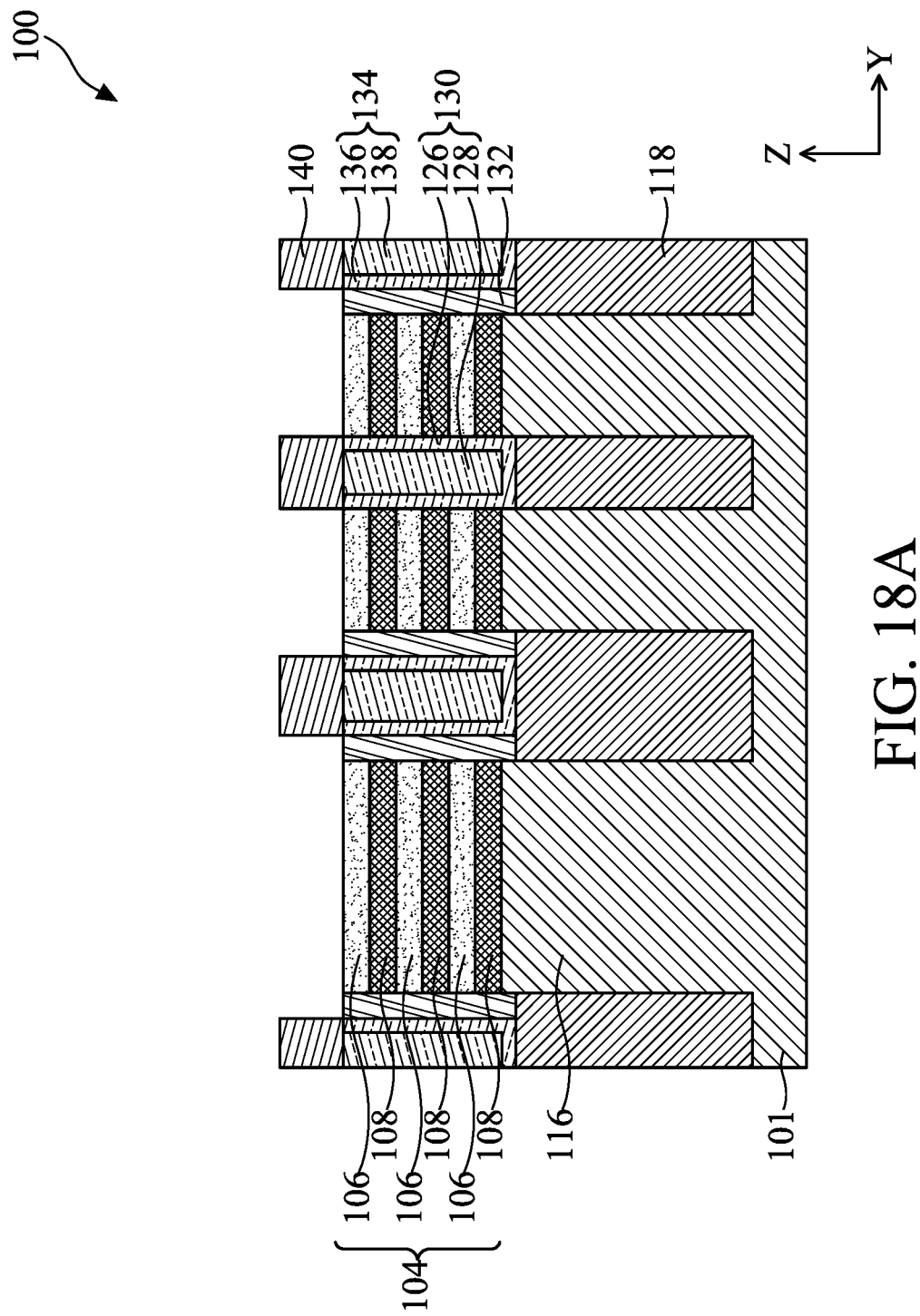
Figure 18B:
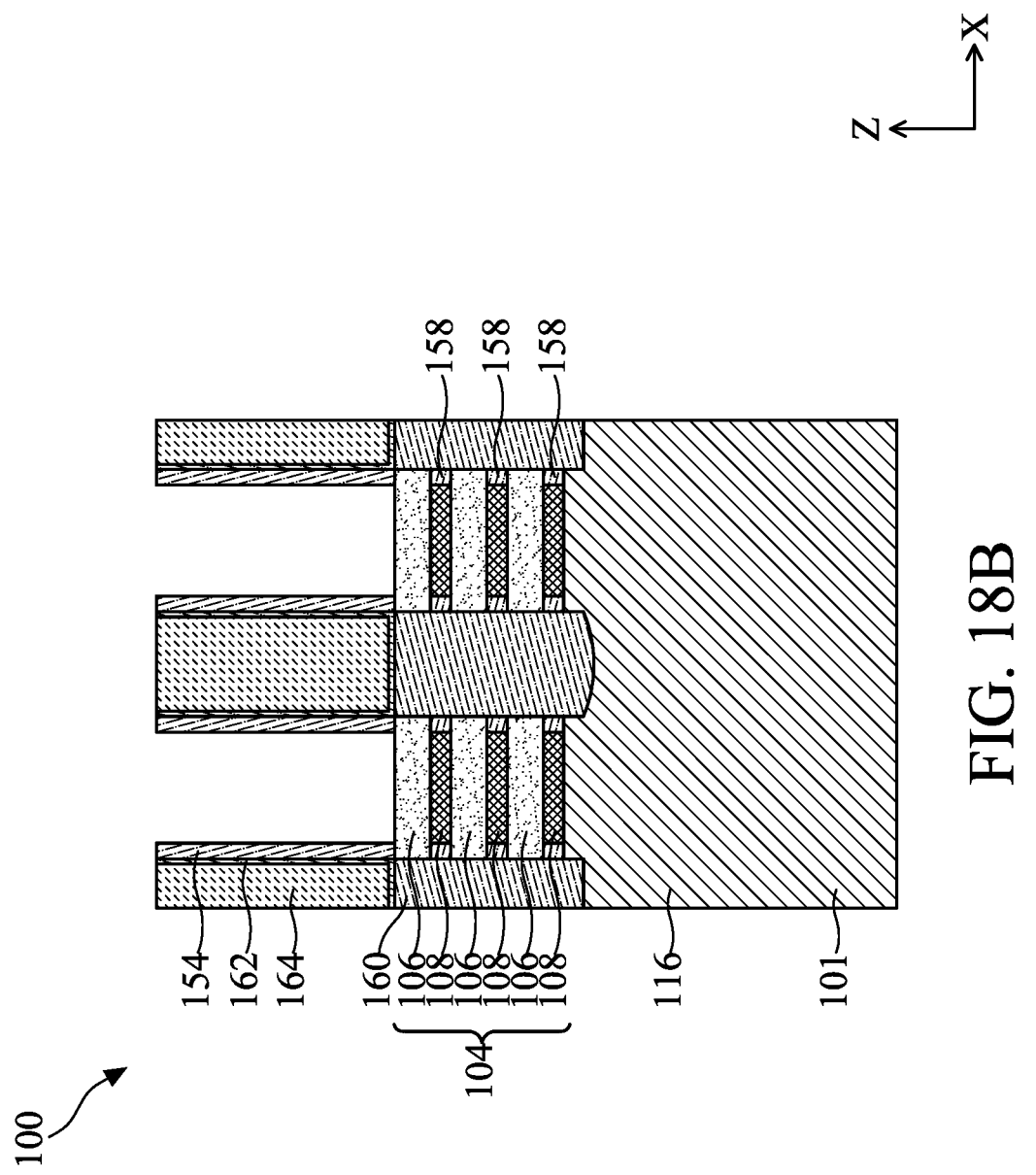

In FIGS. 18A and 18B, the sacrificial gate electrode layer 146 (FIG. 17B) and the sacrificial gate dielectric layer 144 (FIG. 17B) are removed, exposing the top surfaces of the cladding layers 132 and the stacks of semiconductor layers 104. The sacrificial gate electrode layer 146 may be first removed by any suitable process, such as dry etch, wet etch, or a combination thereof, followed by the removal of the sacrificial gate dielectric layer 144, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 146 but not the spacers 154, the dielectric structures 140, and the CESL 162.

Figure 19A:
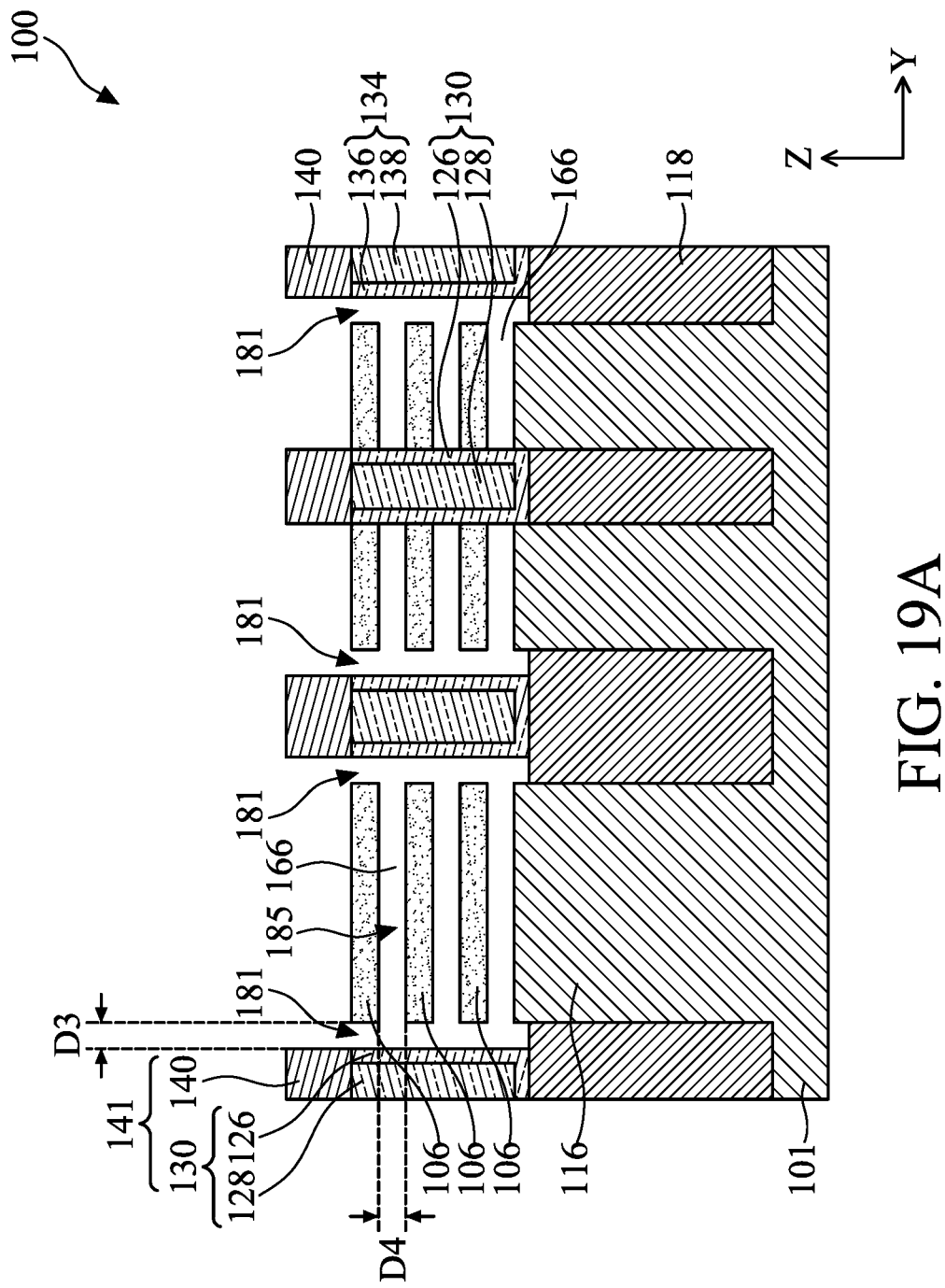
Figure 19B:
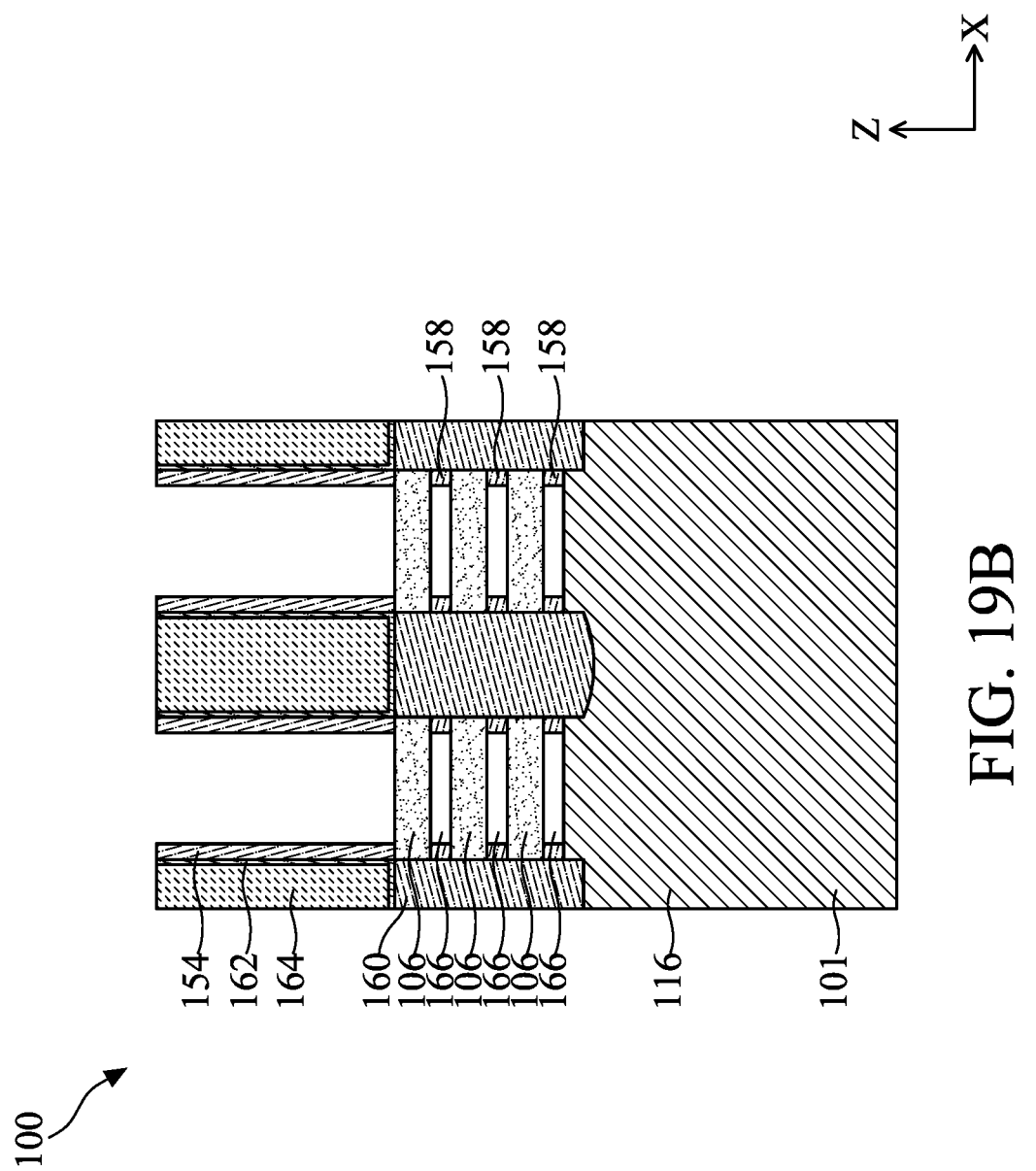

In FIGS. 19A and 19B, the cladding layers 132 and the second semiconductor layers 108 are removed. The removal process exposes the dielectric spacers 158 and the first semiconductor layers 106. The removal process may be any suitable processes, such as dry etch, wet etch, or a combination thereof. The removal process may be a selective etch process that removes the cladding layers 132 and the second semiconductor layers 108 but not the first semiconductor layers 106, the spacers 154, the dielectric structures 140, and the CESL 162. In cases where the cladding layers 132 and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106 protruded from opposing sides of the first dielectric feature 130. Specifically, each of the first semiconductor layers 106 has a first end in contact with the first dielectric layer 126 and a second end extending away from the first end, as shown in FIG. 19A. The portion of the first semiconductor layers 106 not covered by the dielectric spacers 158 may be exposed in the openings 166. Each first semiconductor layer 106 serves as a nanosheet channel of the nanosheet transistor/fork-like gate nanosheet transistor.

Upon removal of the cladding layers 132 and the second semiconductor layers 108, an end cap region 181 is formed between distal ends of the first semiconductor layers 106 and sidewalls of the dielectric features 130, 134. In some embodiments, the end cap region 181 has a spacing D3 along the Y direction ranging between about 5 nm to about 13 nm. That is, the dielectric structure 141 is spaced apart from the distal ends of the first semiconductor layers 106 by the spacing D3. If the spacing D3 is less than 5 nm, the subsequent IL 178 and HK dielectric layer 180 (FIG. 20) may immaturely block the end cap regions 181 at distal ends of the topmost first semiconductor layers 106, which in turn prevents the subsequent layers (e.g., dummy material 183 and gate electrode layers 182, 184, etc.) from getting in and forming around the first semiconductor layers 106. On the other hand, if the spacing D3 is greater than 13 nm, the benefit of scaling down of the device is compromised. The removal of the second semiconductor layers 108 also forms a channel-to-channel region 185 between the immediately adjacent nanosheet channels (i.e., adjacent first semiconductor layers 106). The channel-to-channel region 185 has a spacing D4 along the Z direction ranging between about 8 nm to about 16 nm. In various embodiments, the spacing D4 is greater than the spacing D3. In one embodiment, the ratio of the spacing D4 to the spacing D3 (D4:D3) is about 1:1 to about 3.2:1, for example about 1.2:1 to about 1.6:1.

Figure 20:
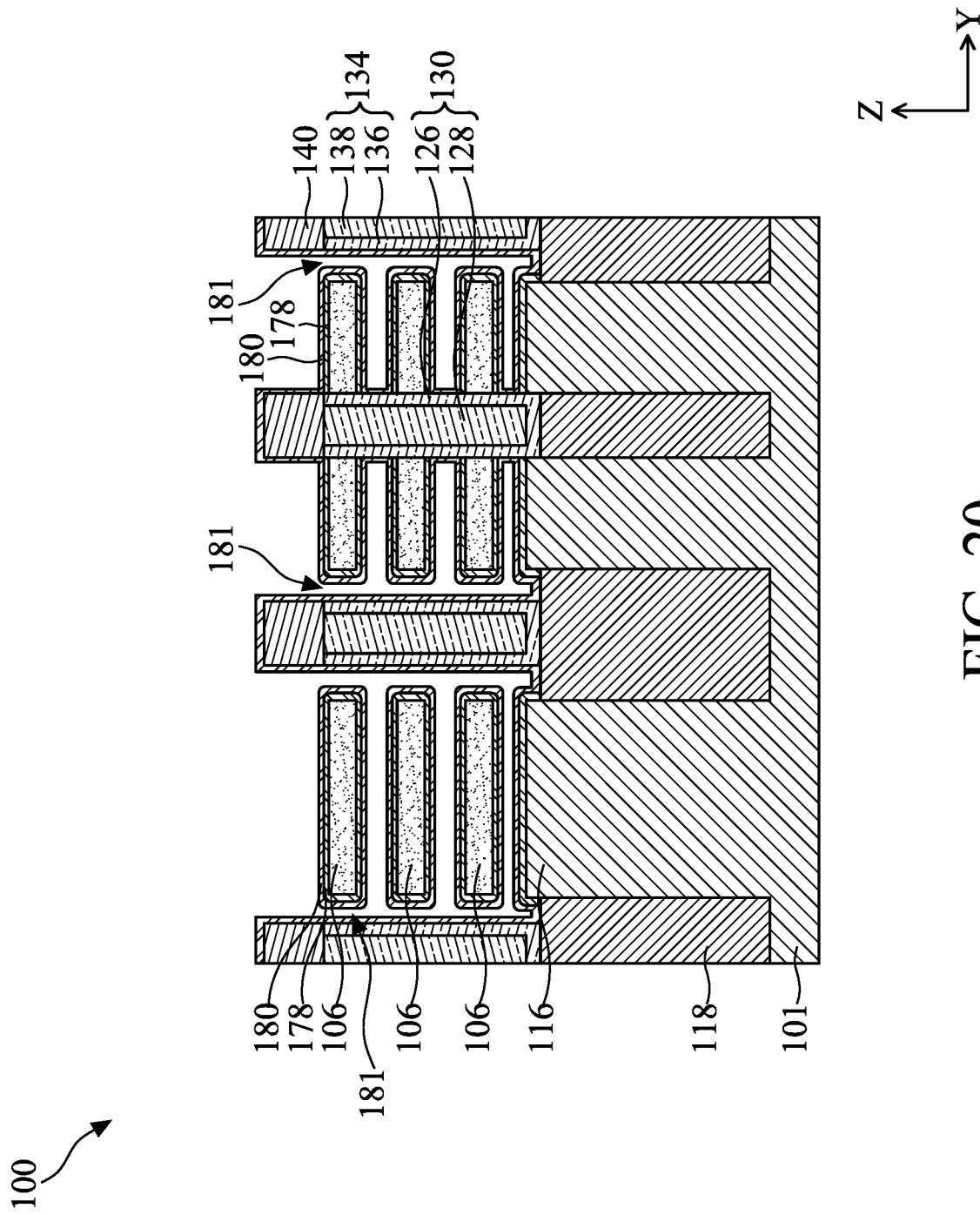
FIGS. 20-29 and 31 are cross-sectional views of the semiconductor device structure taken along cross-section A-A of FIG. 12 during various stages of manufacturing, in accordance with some embodiments.

FIGS. 20-29 and 31 are cross-sectional views of the semiconductor device structure 100 taken along cross-section A-A of FIG. 12 during various stages of manufacturing, in accordance with some embodiments. In FIG. 20, after the cladding layers 132 and the second semiconductor layers 108 are removed, an interfacial layer (IL) 178 is formed to surround at least three surfaces (except for the surface being in contact with the first dielectric layer 126) of the first semiconductor layers 106. In some embodiments, a portion of the IL 178 may be in contact with the first dielectric layer 126. In some embodiments, the IL 178 may also form on the exposed surfaces of the well portion 116 of the substrate 101. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD.

Next, a high-K (HK) dielectric layer 180 is formed on the exposed surfaces of the semiconductor device structure 100. In some embodiments, the HK dielectric layer 180 is formed on the IL 178, the insulating material 118, the dielectric layer 140, and on the exposed surfaces of the first and second dielectric features 130, 134 (e.g., the first dielectric layers 126 and the third dielectric layers 136), as shown in FIG. 20. The HK dielectric layer 180 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. In some embodiments, the HK dielectric layer 180 may include or made of the same material as the sacrificial gate dielectric layer 144.

The HK dielectric layer 180 may be a conformal layer formed by a conformal process, such as an ALD process or a CVD process.

The thickness of the IL 148 and the HK dielectric layer 180 is chosen based on device performance considerations. In some embodiments, the IL 178 has a thickness ranging from about 0.5 nm to about 2 nm, for example about 1 nm. The HK dielectric layer 180 may have a thickness of about 0.5 nm to about 3 nm, for example about 1.5 nm to about 1.8 nm. The combined thickness of the IL 178 and the HK dielectric layer 180 reduces the spacing D3 (FIG. 19) of the end cap regions 181. If the combined thickness of the IL 178 is greater than about 5 nm, the subsequent layers (e.g., dummy material 183 in FIG. 21 and gate electrode layers 182, 184 in FIG. 29) may immaturely merge with the HK dielectric layer 180 and block the end cap regions 181 at distal ends of the topmost first semiconductor layers 106, which in turn prevents the subsequent layers from forming on the HK dielectric layer 180 and around the first semiconductor layers 106. On the other hand, if the combined thickness of the IL 178 and the HK dielectric layer 180 is less than about 1 nm, the IL 178 and the HK dielectric layer 180 may not function properly as intended and result in reliability issues such as increased leakage current and/or deteriorated capacitance characteristics.

Figure 21:
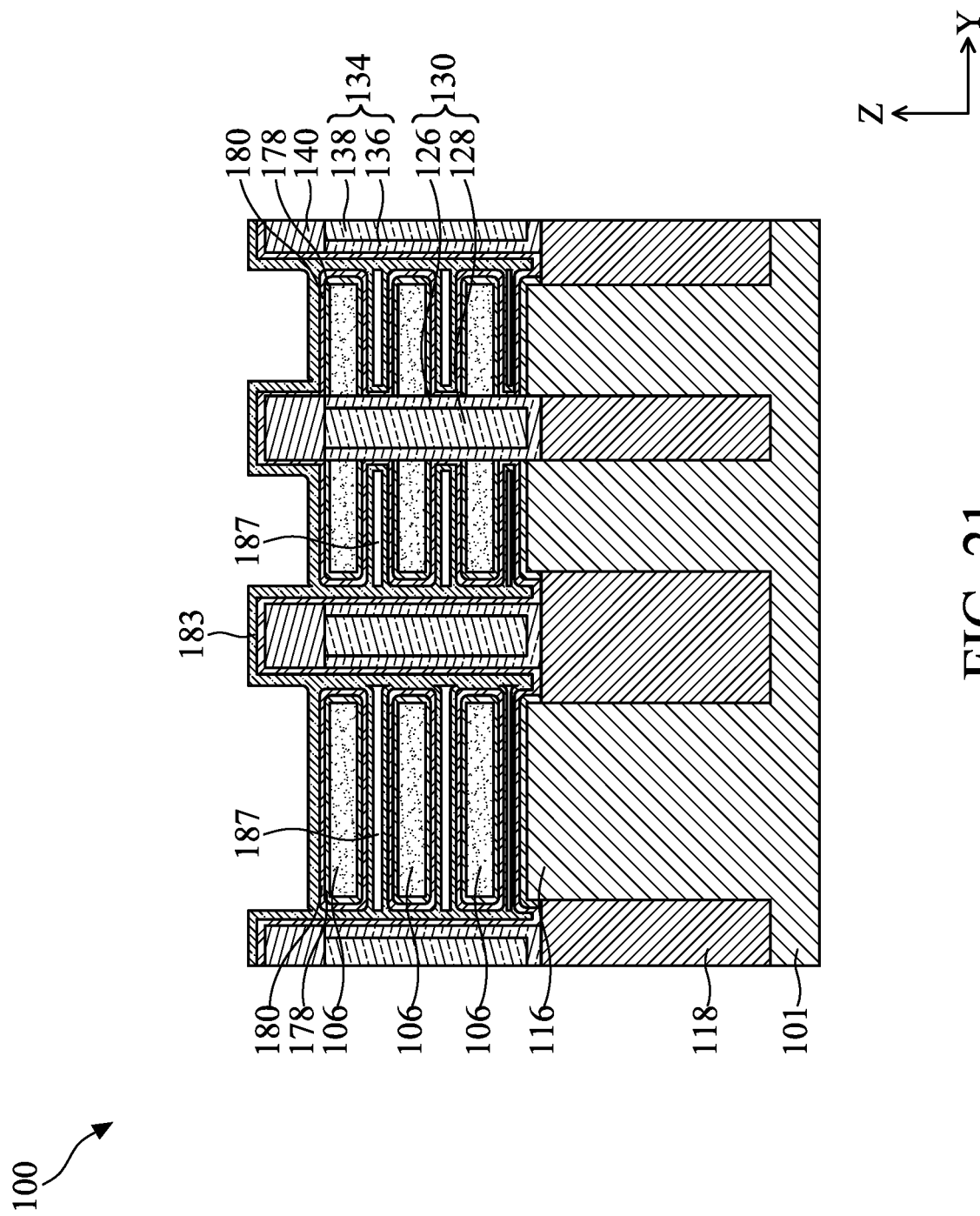

In FIG. 21, after the formation of the IL 178 and the HK dielectric layer 180, a dummy material 183 is formed on the exposed surfaces of the semiconductor device structure 100. Particularly, the dummy material 183 is formed on the HK dielectric layer 180 to surround a portion of each first semiconductor layer 106 and on the HK dielectric layer 180 that is in contact with the dielectric layer 140 and the first and second dielectric features 130, 134. The dummy material 183 is deposited to help subsequent patterning process and will be removed at later stage. Since the spacing D3 of the end cap regions 181 is smaller than the spacing D4 of the channel-to-channel regions 185, the dummy material 183 formed over the first semiconductor layers 106 and the dummy material 183 formed over the first and second dielectric features 130, 134 are eventually merged as the thickness of the dummy material 183 increases. The dummy material 183 merged at the end cap regions 181 prevents the subsequent dummy material 183 from filling in the channel-to-channel regions 185 between the first semiconductor layers 106, resulting in air gaps 187 formed in the channel-to-channel regions 185. The material of the dummy material 183 is chosen to have different etch selectivity and/or oxidation rates than the subsequent gate electrode layers. The dummy material 183 may include an oxygen-containing material and/or a nitrogen-containing material. Exemplary materials of the dummy material 183 may include, but are not limited to, SiOx, AlOx, ZrO2, SiN, TiN, or the like, or any combination thereof. In one embodiment, the dummy material 183 is a conformal layer formed by a conformal process, such as an ALD process or a CVD process.

Figure 22:
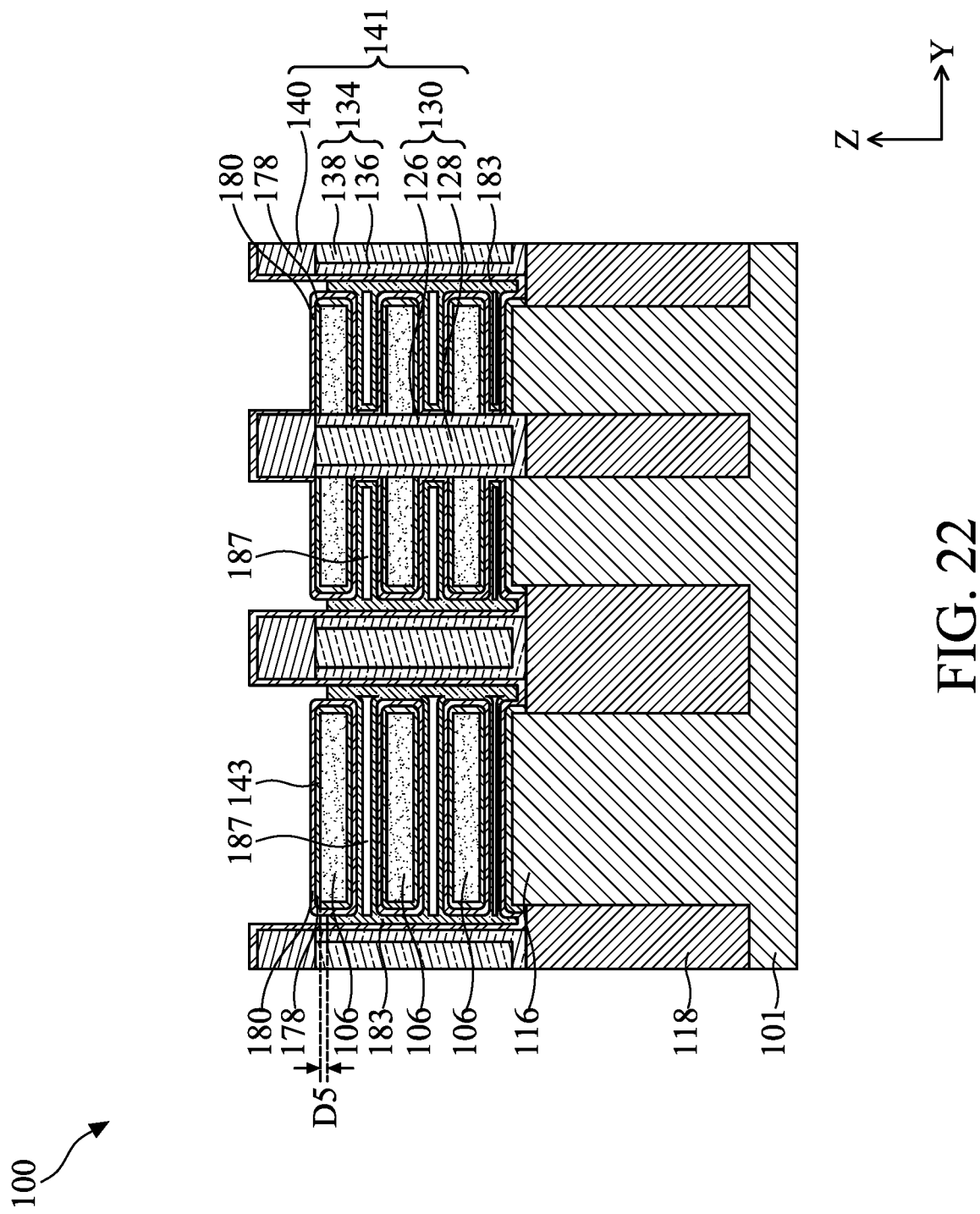

In FIG. 22, after the formation of the dummy material 183, the dummy material 183 is recessed by a removal process. The recess of the dummy material 183 provides a space for the subsequent mask material 189 (FIG. 23), which protects the dummy material 183 at the p-channel FETs during subsequent removal of the dummy material 183 at the n-channel FETs. The removal process may be a selective etch process that removes the dummy material 183 but does not substantially remove the HK dielectric layer 180. In some embodiments, the removal process is a controlled isotropic process so that portions of the dummy material 183 over the dielectric layer 140 and the top surface 143 of the topmost first semiconductor layer 106 are removed, while the dummy material 183 between the distal ends of the first semiconductor layers 106 and the first and second dielectric features 130, 134 remains substantially intact. As a result of the removal process, the top of the dummy material 183 may be recessed to a level below the top surface of the dielectric layer 140. In some embodiments, the top of the dummy material 183 is at a level between the top surface of the dielectric layer 140 and the top surface of the topmost first semiconductor layer 106. In some embodiments, a portion of the dummy material 183 is further recessed to a level into the end cap region 181 of the topmost first semiconductor layer 106. In such a case, the dummy material 183 may be recessed to a level at or below the top surface 143 of the topmost first semiconductor layer 106. In cases where the thickness of the first semiconductor layer 106 (i.e., channel height) is about 3 nm to about 10 nm, the distance D5 between the top of the dummy material 183 and the top surface 143 of the topmost first semiconductor layer 106 may be 0 nm to about 1.5 nm.

Figure 23:
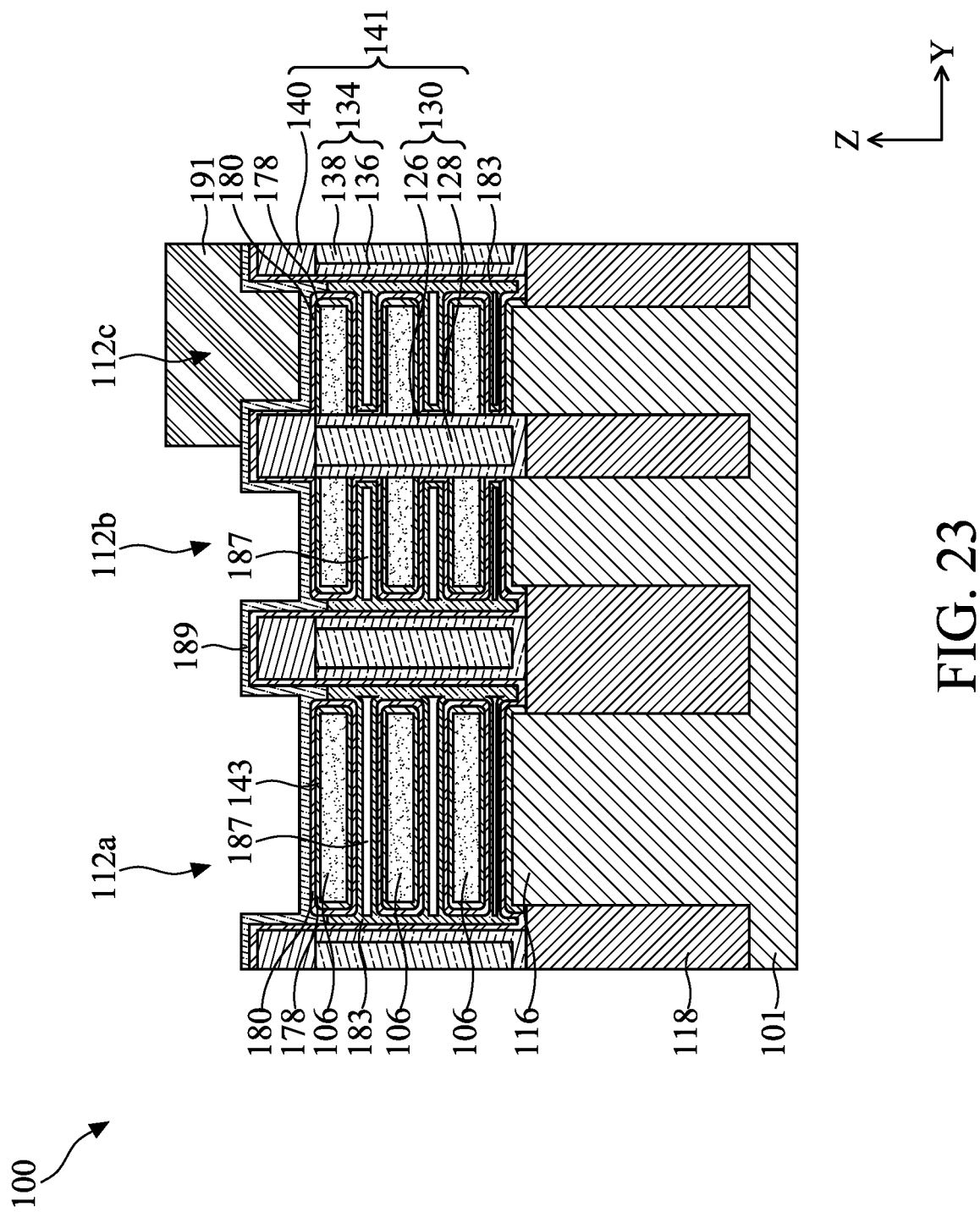

In FIG. 23, after the recess of the dummy material 183, a mask layer 189 is formed on the exposed surfaces of the semiconductor device structure 100. The mask layer 189 is formed over the dielectric layer 140 and the topmost first semiconductor layers 106. Portions of the mask layer 189 also fill the end cap regions 181 and are in contact with the dummy material 183 at the end cap regions 181. The mask layer 189 protects the dummy material 183 at the p-channel FETs from being over-etched during subsequent removal of the dummy material 183 at the n-channel FETs. The formation of the mask layer 189 increases the critical dimension of the dielectric structures 141 which provides extra footing for the subsequent resist layer 191. The mask layer 189 may include an oxygen-containing material and/or a nitrogen-containing material. Exemplary materials of the mask layer 189 may include, but are not limited to, SiOx, AlOx, ZrO2, SiN, TiN, or the like, or any combination thereof. In some embodiments, the mask layer 189 and the dummy material 183 are formed from different material. In one embodiment, the mask layer 189 is a conformal layer formed by a conformal process, such as an ALD process or a CVD process.

Figure 26:
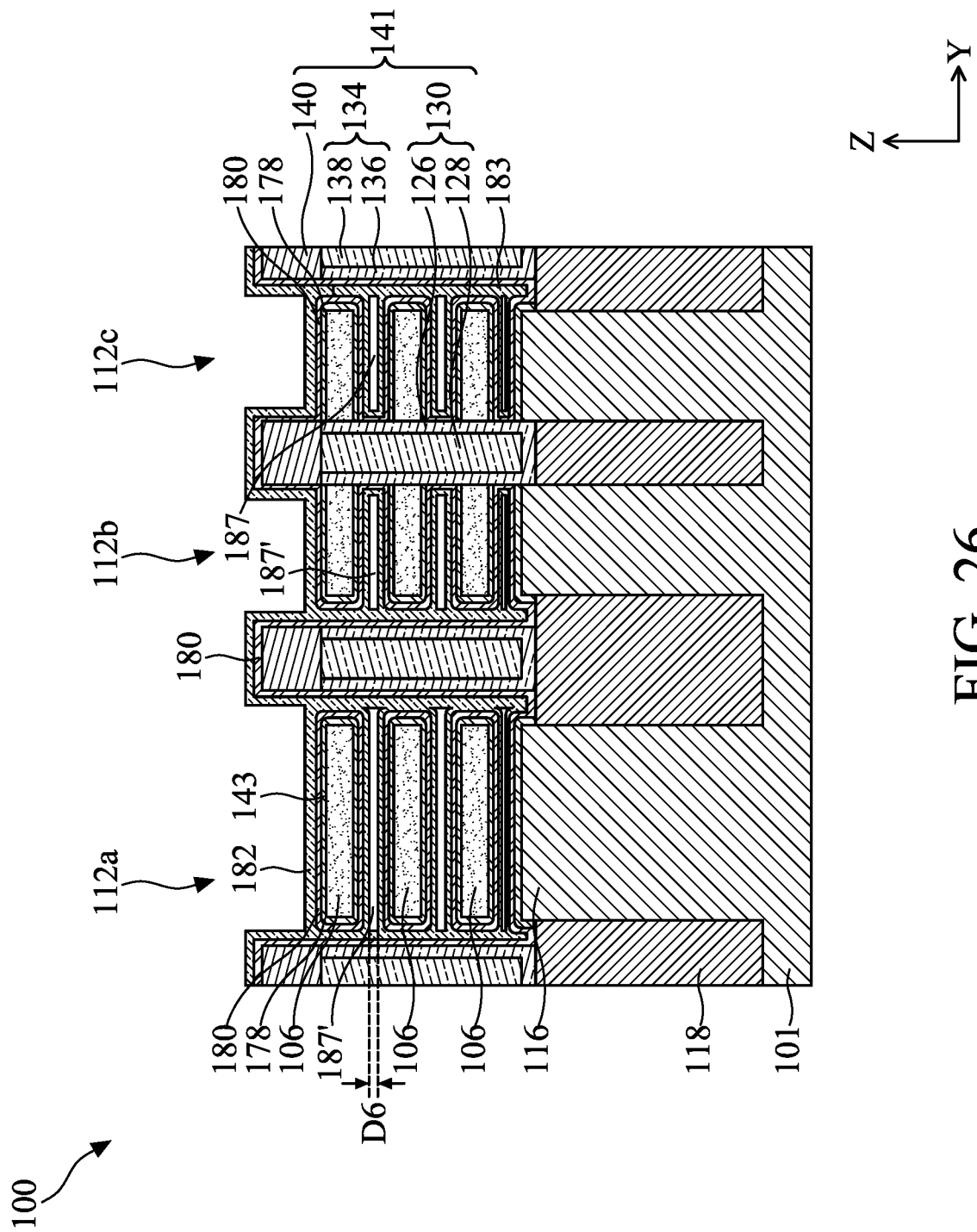

Next, a resist layer 191 is formed on one or more exposed portions of the mask layer 189. The resist layer 191 can be formed in the selected regions depending on the needs to control the gates at different FETs. In some embodiments, the resist layer 191 is formed to cover regions of the p-channel FETs, such as the p-channel FETs formed on the fin structures 112c as shown in FIG. 23. The resist layer 191 protects the one or more of the portions of the dummy material 183 and the mask layer 189 so that the unprotected portions of the dummy material 183 and the mask layer 189 are removed and replaced by the subsequently formed gate electrode layer 182 (FIG. 26). The resist layer 191 may be formed by first forming a blanket layer on the semiconductor device structure 100, followed by patterning and etching processes to remove portions of the blanket layer to form the resist layer 191. The resist layer 191 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique.

Figure 24:
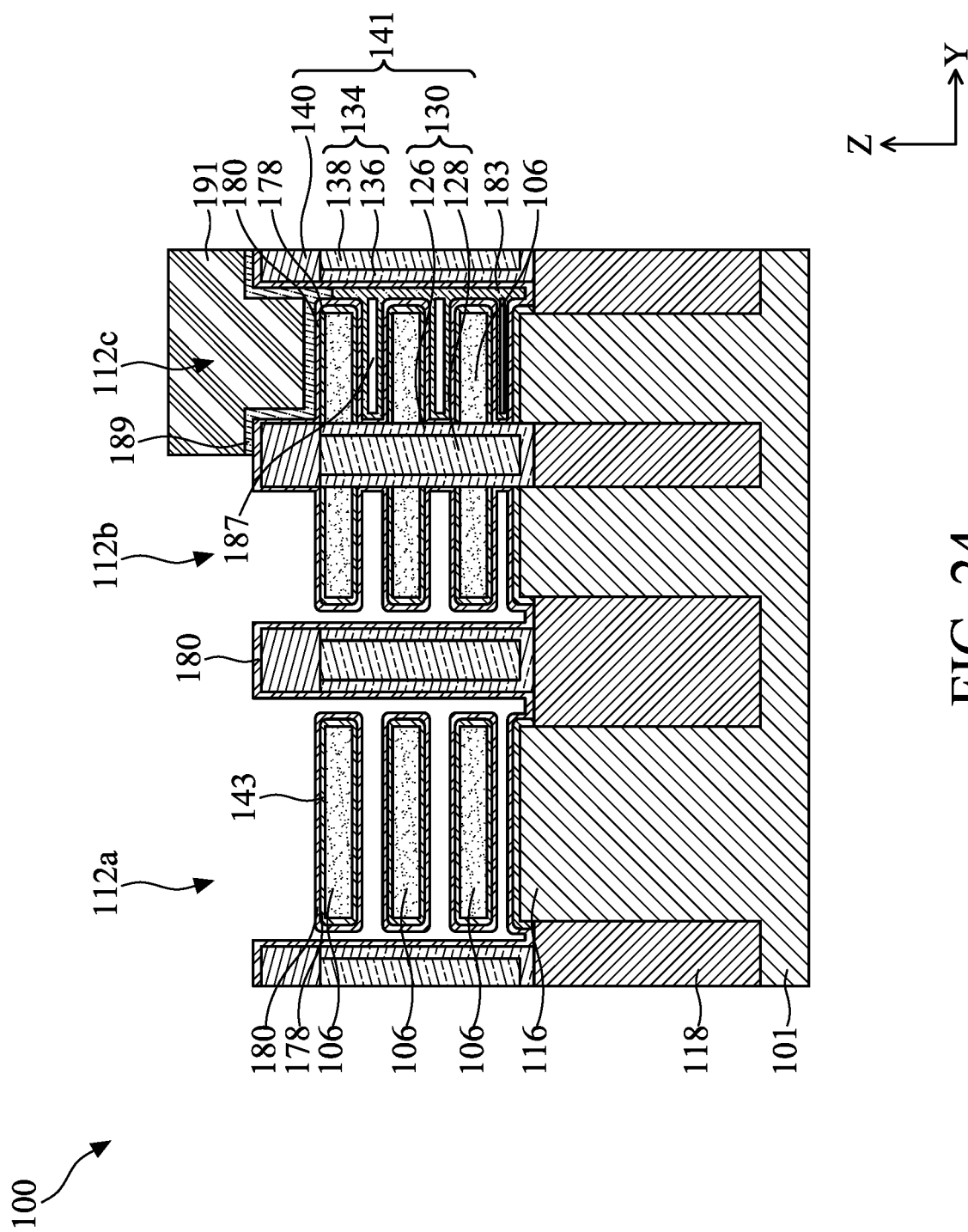

In FIG. 24, the portions of the mask layer 189 and the dummy material 183 not covered by the resist layer 191 are removed. The removal of the portions of the mask layer 189 and the dummy material 183 may reveal portions of the HK dielectric layer 180 over the fin structures 112a, 112b. The removal process used to remove the mask layer 189 and the dummy material 183 may be any suitable processes, such as dry etch, wet etch, or a combination thereof. The removal of the mask layer 189 and the dummy material 183 may be performed by multiple etch processes. In some embodiments, a first etch process is performed to remove the exposed portions of the mask layer 189. The first etch process may be a selective etch process that removes the mask layer 189 but not the HK dielectric layer 180. After the exposed mask layer 189 is removed, a second etch process is performed to remove the exposed portions of the dummy material 183. Likewise, the second etch process may be a selective etch process that removes the dummy material 183 but not the HK dielectric layer 180. Due to the narrow spacing at the end cap regions 181 (FIG. 20), the second etch process may use an etchant heavier than the etchant used in the first etch process in order to etch through the materials at the end cap regions 181. As indicated previously, the mask layer 189 protects the dummy material 183 at the p-channel FETs (e.g., p-channel FETs on the fin structure 112c) from being over-etched during removal of the dummy material 183 at the n-channel FETs. If the removal process was performed without the mask layer 189 formed between the resist layer 191 and the HK dielectric layer 180, the etchant used during the removal of the dummy material 183 at the n-channel FETs (n-channel FETs on the fin structure 112b) may spread over to the dummy material 183 at the p-channel FETs along the dummy material 183 between the resist layer 191 and the HK dielectric layer 180 on the top surface of the dielectric layer 140, leading to unwanted etching of the dummy material 183 under the resist layer 191.

Figure 25:
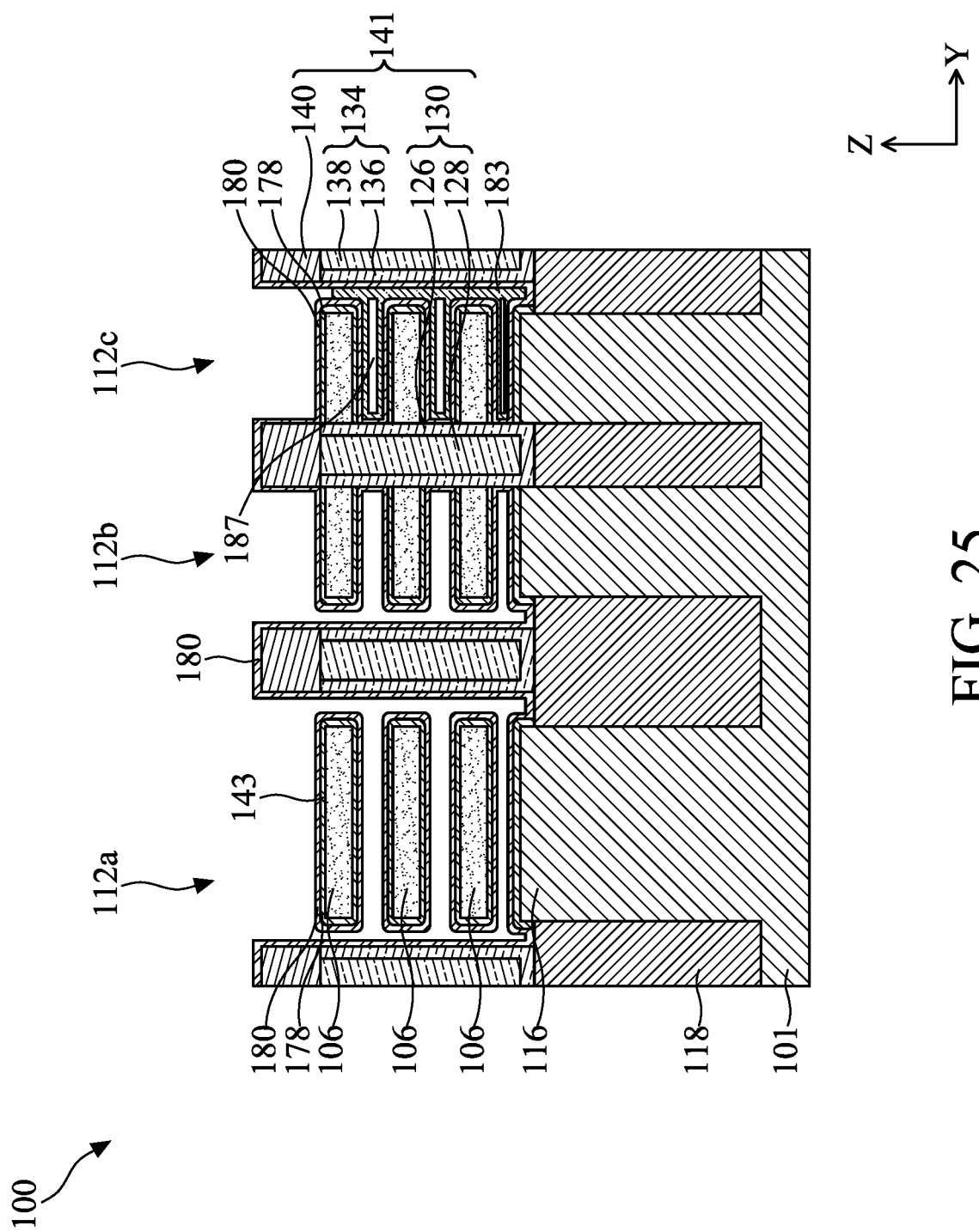

In FIG. 25, the resist layer 191 and the mask layer 189 are removed. The resist layer 191 may be removed by any suitable removal process, such as ashing, dry etch, wet etch, or a combination thereof. Then, the mask layer 189 remaining on the HK dielectric layer 180 is removed. The removal process for the mask layer 189 may be any suitable processes, such as dry etch, wet etch, or a combination thereof. The removal process may be a selective etch process that removes the mask layer 189 but does not remove the HK dielectric layer 180 and the dummy material 183 at the end cap region 181. The air gaps 187 remain intact since the removal process does not remove the dummy material 183 on the fin structure 112c. Upon removal of the resist layer 191 and the mask layer 189, the dummy material 183 at the end cap region 181 is exposed. The dummy material 183 remains in contact with portions of the HK dielectric layer 180 formed over the second dielectric feature 134 and the first semiconductor layers 106 of the fin structure 112c.

In FIG. 26, after the resist layer 191 and the mask layer 189 are removed, a first gate electrode layer 182 is formed on the exposed surfaces of the semiconductor device structure 100. The first gate electrode layer 182 is formed on the HK dielectric layer 180 to surround a portion of each first semiconductor layer 106 and on the HK dielectric layer 180 that is in contact with the dielectric layer 140 and the first and second dielectric features 130, 134. The first gate electrode layer 182 may be also deposited over the first and second dielectric features 130, 134. The first gate electrode layer 182 may have a thickness in a range of about 0.5 nm to about 2.5 nm. Since the spacing D3 (FIG. 19A) of the end cap regions 181 is smaller than the spacing D4 (FIG. 19A) of the channel-to-channel regions 185, the first gate electrode layer 182 formed over the first semiconductor layers 106 and the first gate electrode layer 182 formed over the first and second dielectric features 130, 134 are eventually merged as the thickness of the first gate electrode layer 182 increases. The first gate electrode layer 182 merged at the end cap regions 181 prevents the subsequent first gate electrode layer 182 from filling in the channel-to-channel regions 185 between the first semiconductor layers 106, resulting in air gaps 187' formed in the channel-to-channel regions 185. The air gaps 187' has a spacing D6 in a range about 2 nm to about 5 nm, which may vary according to the channel-to-channel spacing D4 (FIG. 19A) and the thickness of the IL 178, the HK dielectric layer 180, and the first gate electrode layer 182.

The first gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The first gate electrode layers 182 may be formed by PVD, CVD, ALD, electro-plating, or other suitable method. In some embodiments, the first gate electrode layer 182 includes an n-type gate electrode layer such as TiAlC, TaAlC, TiSiAlC, TiC, TaSiAlC, or other suitable material.

Figure 27:
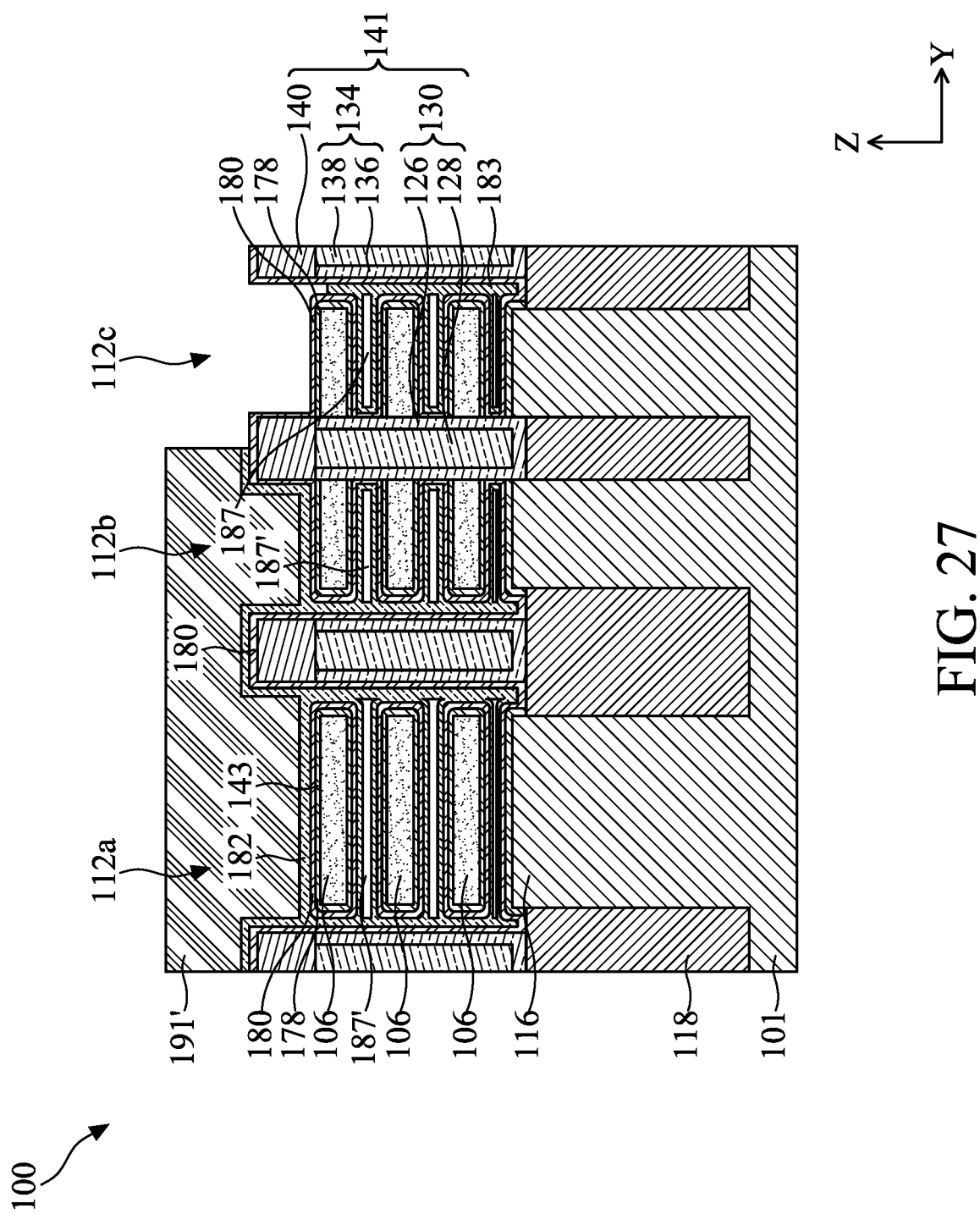
Figure 29:
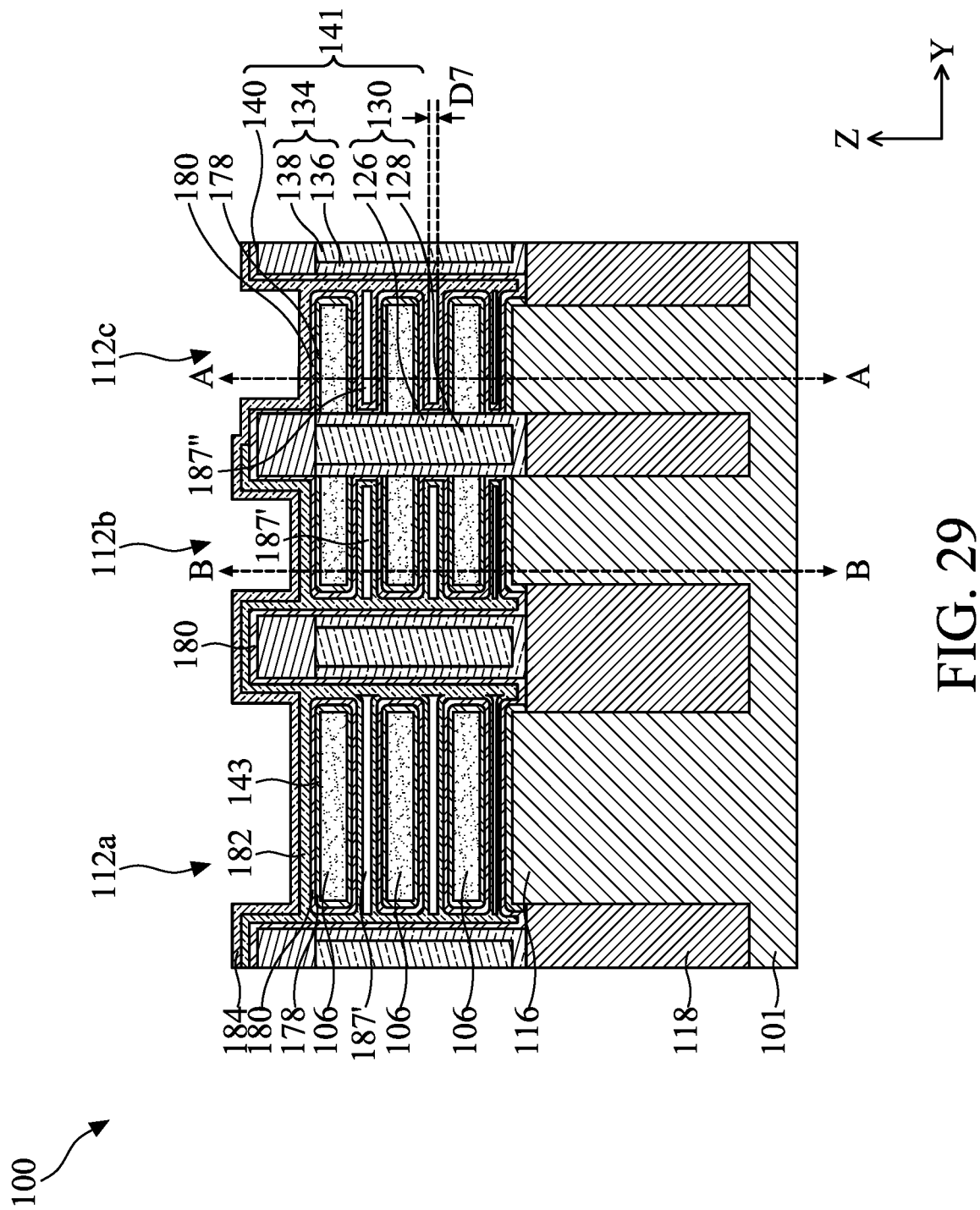

In FIG. 27, a resist layer 191' is formed on one or more exposed portions of the first gate electrode layer 182. The resist layer 191' can be formed in the selected regions depending on the needs to control the gates at different FETs. In some embodiments, the resist layer 191' is formed to cover regions of n-channel FETs and p-channel FETs, such as the n-channel FET formed on the fin structure 112b and p-channel FET formed on the fin structure 112a as shown in FIG. 27. The resist layer 191' protects the one or more of the portions of the first gate electrode layer 182 so that the unprotected portions of the first gate electrode layer 182 are removed and replaced by the subsequently formed second gate electrode layer 184 (FIG. 29). The resist layer 191' may include or be formed of the same material as the resist layer 191 discussed above and may be deposited by the same deposition process.

Next, portions of the first gate electrode layer 182 not covered by the resist layer 191' are removed. The removal process uses an etchant that selectively removes the first gate electrode layer 182 but not the HK dielectric layer 180 and the dummy material 183. The exposed first gate electrode layer 182 is removed to expose the dummy material 183 at the end cap region 181 of the first semiconductor layer 106. Since the first gate electrode layer 182 is not merged at the end cap region 181, the removal process may use a lighter etchant for removing the first gate electrode layer 182. While removing the dummy material 183, a small portion of the exposed first gate electrode layer 182 between the resist layer 191' and the HK dielectric layer 180 over the first dielectric feature 130 may be slightly etched. Since the etchant is lighter, it does not get spread over to the first gate electrode layer 182 at the n-channel FET formed on the fin structure 112b and p-channel FET formed on the fin structure 112a.

Figure 28:
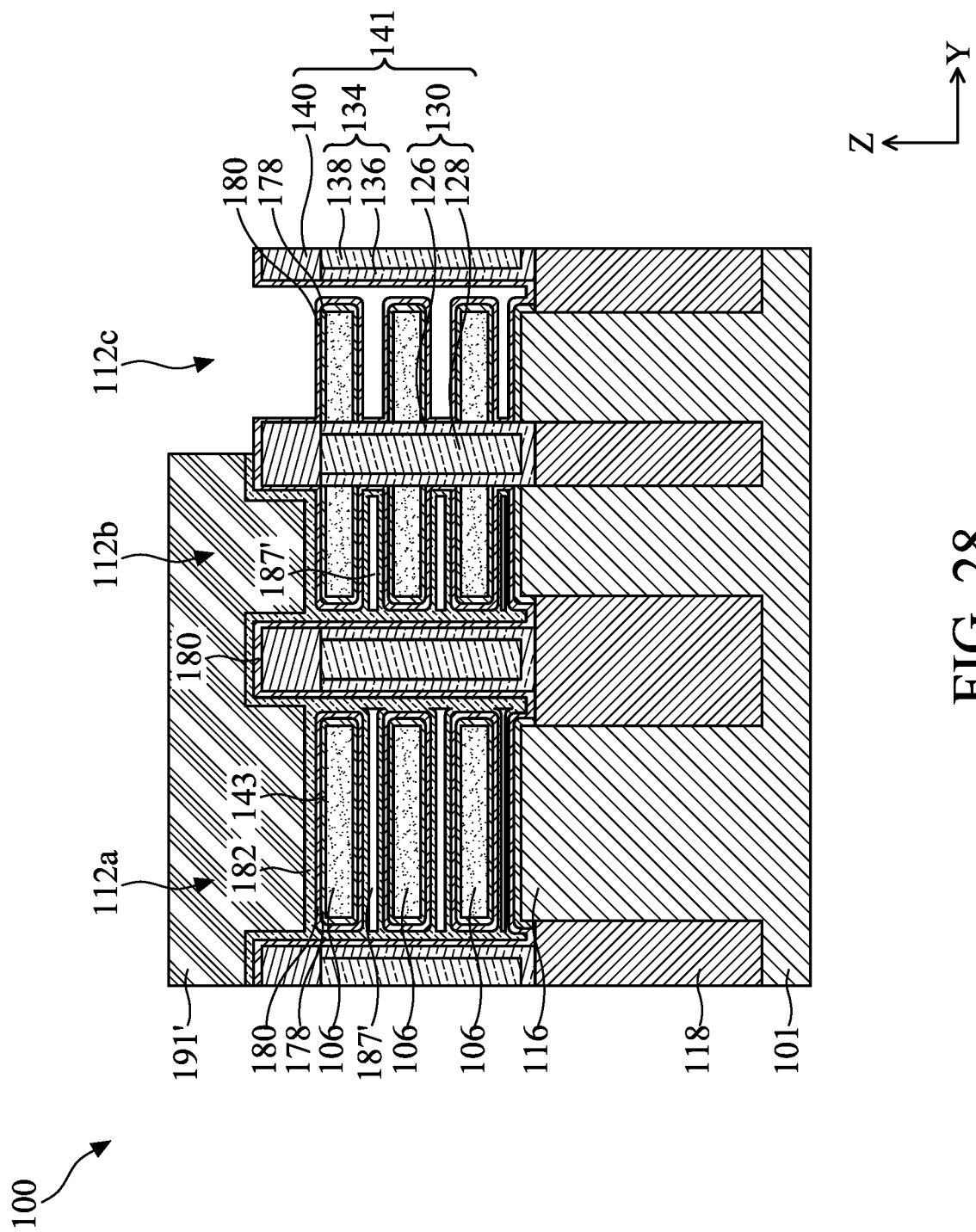

In FIG. 28, after the portions of the first gate electrode layer 182 is removed, a removal process is performed to remove the exposed dummy material 183. The removal process may be any suitable processes, such as dry etch, wet etch, or a combination thereof. The removal process may be a selective etch process that removes the dummy material 183 but not the HK dielectric layer 180 and the first gate electrode layer 182. Due to the narrow spacing at the end cap regions 181 (FIG. 20), the selective etch process may use an etchant heavier than the etchant used for removing the first gate electrode layer 182 in order to etch through the materials at the end cap regions 181. Upon removal of the dummy material 183, the HK dielectric layer 180 not covered by the resist layer 191' (the HK dielectric layer 180 surrounding portions of the first semiconductor layers 106 of the fin structure 112c and on the dielectric structure 141) is exposed.

In FIG. 29, after the dummy material 183 is removed, a second gate electrode layer 184 is formed on the exposed surfaces of the semiconductor device structure 100. The second gate electrode layer 184 is formed on the HK dielectric layer 180 to surround a portion of each first semiconductor layer 106 of the fin structure 112c (i.e., p-channel FET formed on the fin structure 112c) and on the HK dielectric layer 180 that is in contact with the dielectric layer 140 and the second dielectric feature 134. The second gate electrode layer 184 is also in contact with the first gate electrode layer 182 of n-channel FETs and p-channel FETs, such as the n-channel FET formed on the fin structure 112b and p-channel FET formed on the fin structure 112a. The second gate electrode layer 184 may be also deposited over the first and second dielectric features 130, 134. The second gate electrode layer 184 may have a thickness in a range of about 0.5 nm to about 2.5 nm. Due to the narrower spacing at the end cap region 181 (between the dielectric structure 141 and the distal ends of the first semiconductor layers 106 of the fin structure 112c), the second gate electrode layer 184 is eventually merged at the end cap region 181 as the thickness of the second gate electrode layer 184 increases. The second gate electrode layer 184 merged at the end cap region 181 prevents the subsequent second gate electrode layer 184 from filling in the channel-to-channel regions 185 between the first semiconductor layers 106, resulting in air gaps 187" formed in the channel-to-channel regions 185. The air gaps 187" has a spacing D7 in a range about 2 nm to about 5 nm, which may vary according to the channel-to-channel spacing D4 (FIG. 19A) and the thickness of the IL 178, the HK dielectric layer 180, and the second gate electrode layer 184.

The second gate electrode layer 184 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layers 184 may be formed by PVD, CVD, ALD, electro-plating, or other suitable method. In some embodiments, the second gate electrode layer 184 includes a p-type gate electrode layer such as TiN, TaN, TSN, Mo, TiSiN, TiTaN, TiAlN, WCN, W, Ni, Co, or other suitable material.

Depending on the threshold voltage needed for the n-channel FETs and p-channel FETs at different regions of the semiconductor device structure 100, one or more p-type or n-type gate electrode layers may be further formed on the second gate electrode layer 184. It is contemplated that the thickness of each gate electrode layer may also be controlled to adjust the work function of the gate electrode.

Figure 30A:
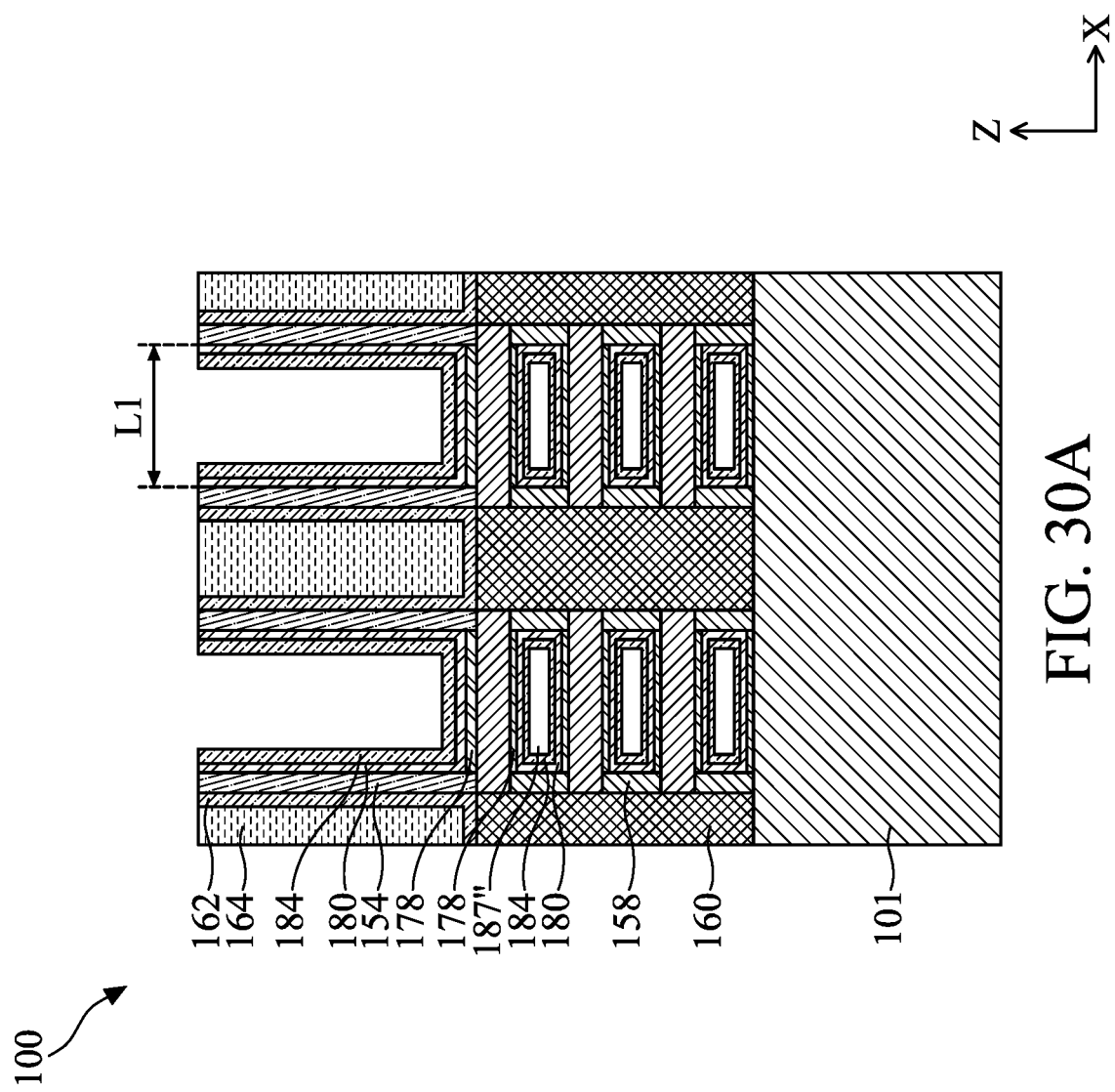
FIGS. 30A and 30B are cross-sectional side views of one of various stages of manufacturing the semiconductor device structure taken along cross-section A-A and cross-section B-B of FIG. 29, respectively, in accordance with some embodiments.
Figure 30B:
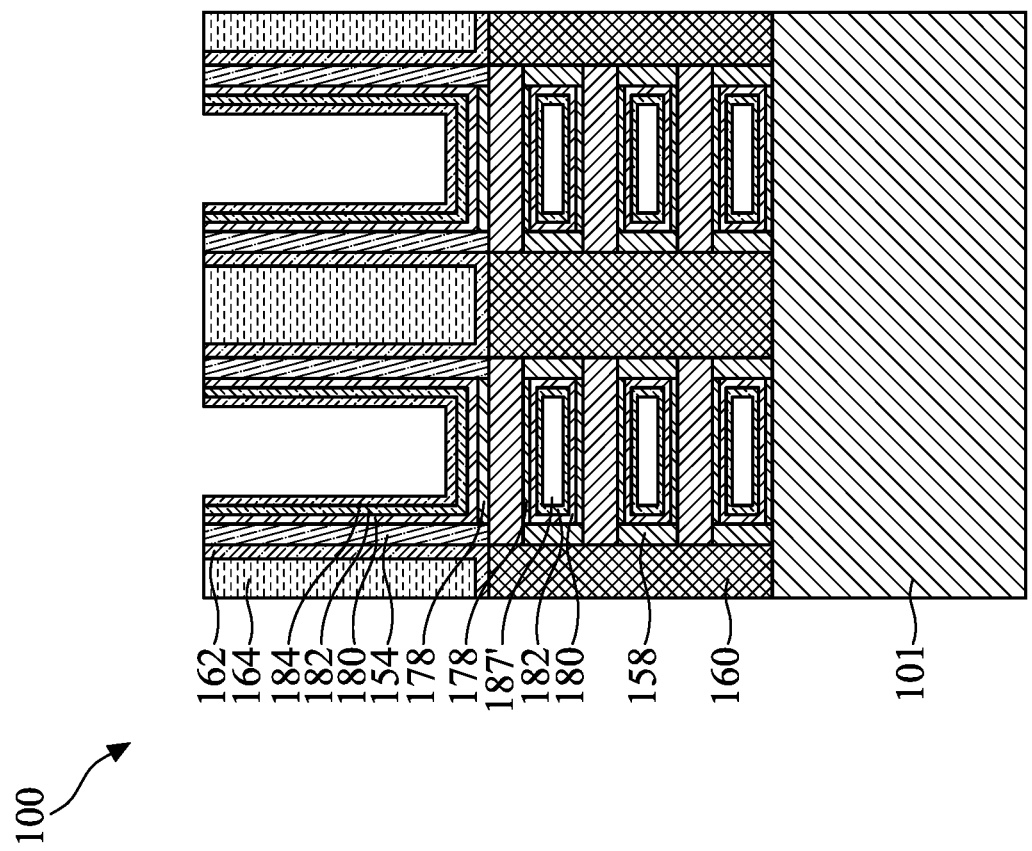

FIGS. 30A and 30B are cross-sectional side views of one of various stages of manufacturing the semiconductor device structure 100 taken along cross-section A-A and cross-section B-B of FIG. 29, respectively, in accordance with some embodiments. FIG. 30A shows each nanosheet channel has a length L1 in a range of about 6 nm to about 14 nm. The length of the nanosheet channel herein refers to a lateral length of the first semiconductor layers 106 between two adjacent spacers 154.

Figure 31:
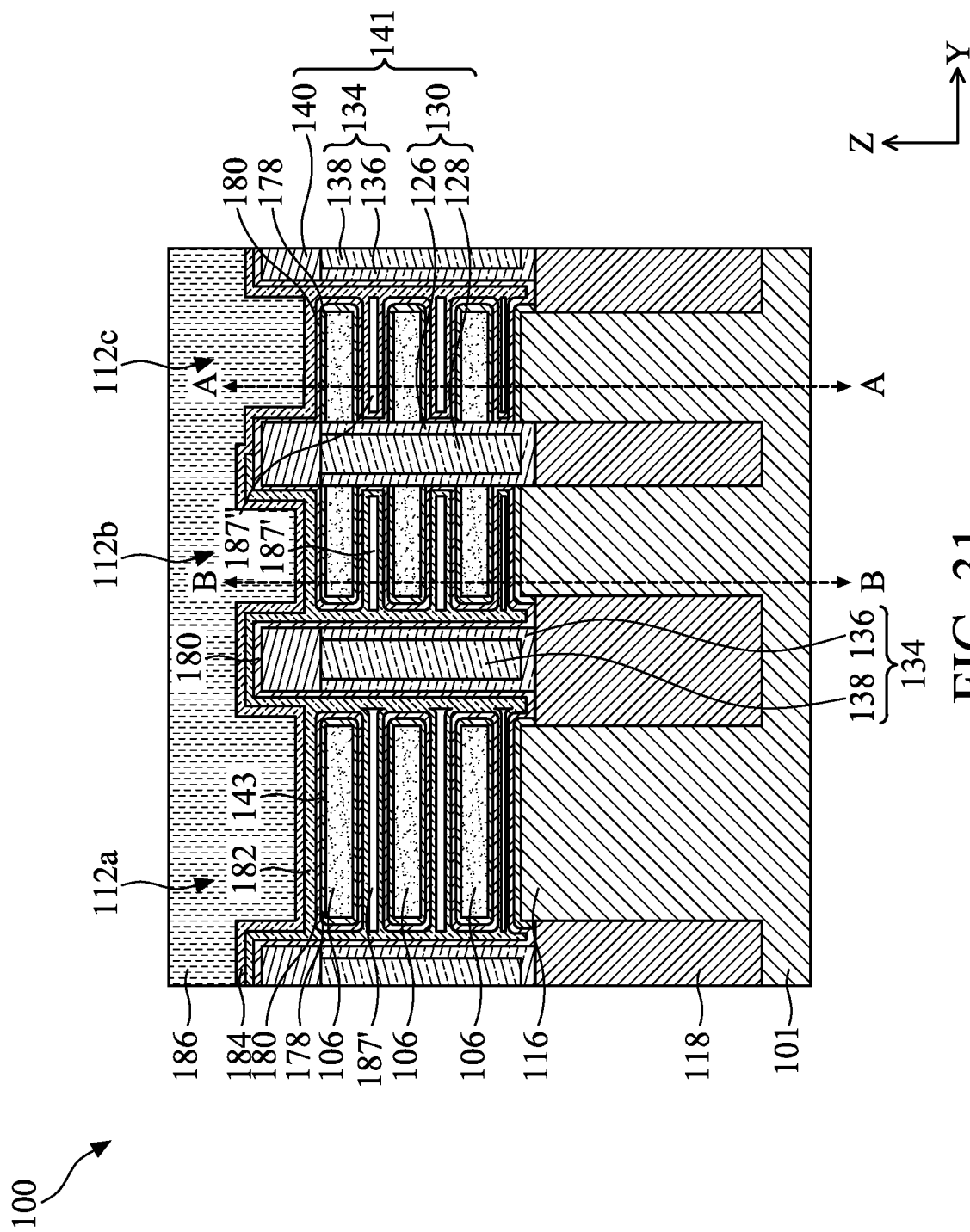
Figure 32A:
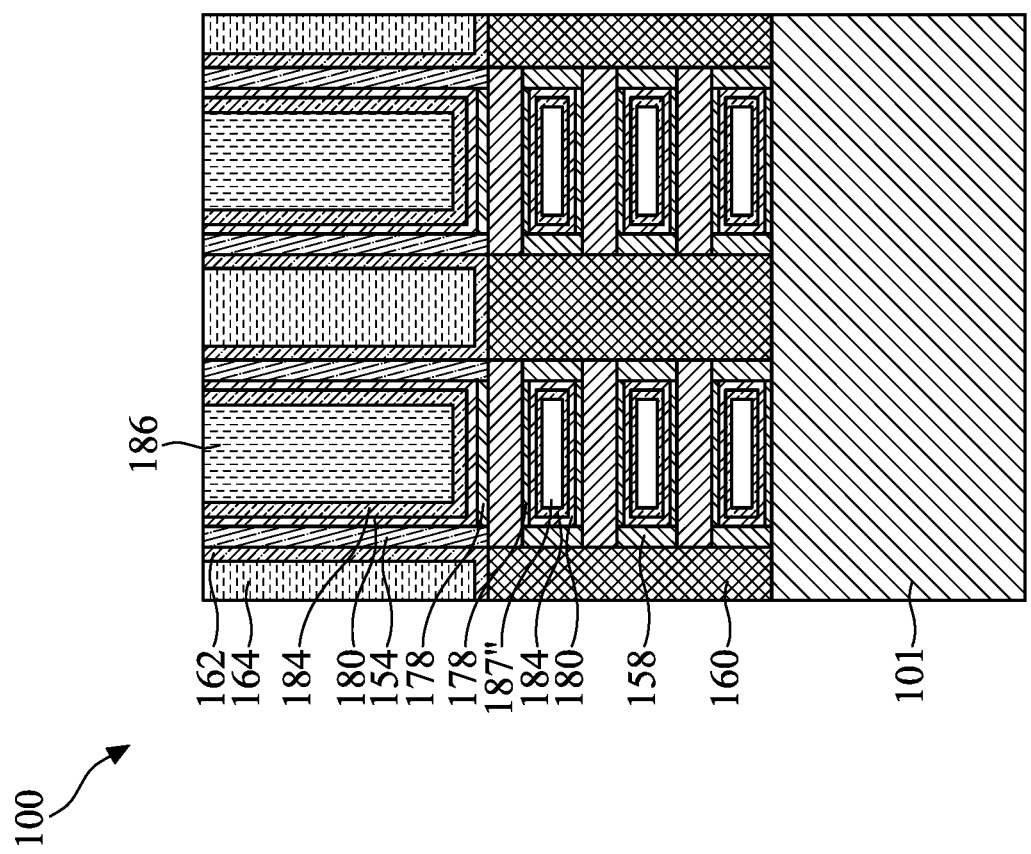
FIGS. 32A and 32B are cross-sectional side views of the semiconductor device structure taken along cross-section A-A and cross-section B-B of FIG. 31, respectively, in accordance with some embodiments.
Figure 32B:
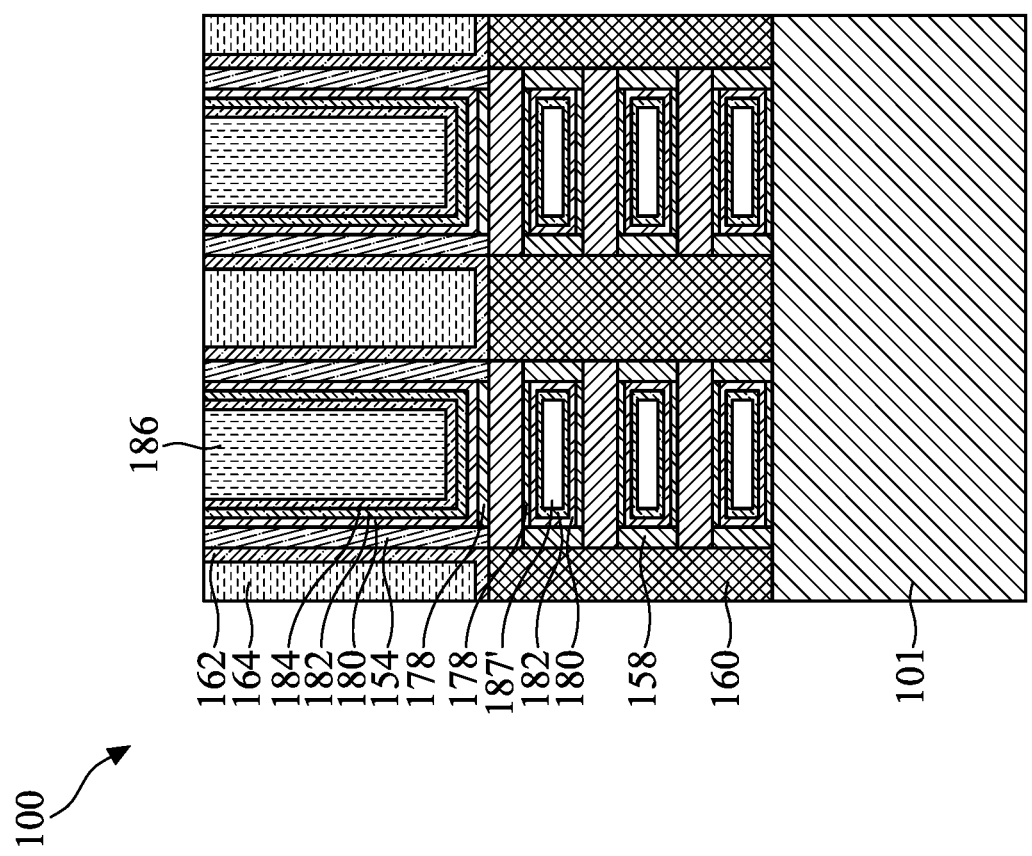

In FIG. 31, a metal layer 186 is formed on the exposed surfaces of the semiconductor device structure 100. FIGS. 32A and 32B are cross-sectional side views of the semiconductor device structure 100 taken along cross-section A-A and cross-section B-B of FIG. 31, respectively, in accordance with some embodiments. The metal layer 186 is formed in the space defined between two adjacent dielectric structures 141 (e.g., between the first and second dielectric features 130, 134, between two adjacent first dielectric features 130, or between two adjacent second dielectric features 134) and in contact with the first gate electrode layer 182, the second gate electrode layer 184, the HK dielectric layer 180, the spacers 154, and the CESL 162. The metal layer 186 may provide a signal, such as an electrical current, to the second gate electrode layer 184 located therebelow. In the embodiment shown in FIG. 31, since a portion of the first gate electrode layer 182 is in contact with the second gate electrode layer 184, the signal can be provided to both first and second gate electrode layers 182, 184 via the metal layer 186. In such a case, a single signal sent to the metal layer 186 may control nanosheet channel regions in both n-channel FET and p-channel FET.

The metal layer 186 may include or be formed of W, Ru, Mo, Co, TaN, Cu, Ti, Ta, TiN, or the like. The metal layer 186 may be formed by PVD, CVD, ALD, or other suitable process. The metallic surfaces of the multiple layers of work function of metal of the gate electrode layers 182, 184 promote preferential growth of the metal layer 186 on the first and second gate electrode layers 182, 184 over the dielectric material of the spacers 154 and the CESL 162. Thus, the metal layer 186 may be formed in a bottom-up fashion. In some embodiments, the metal layer 186 is optional and may not exist.

Figure 33A:
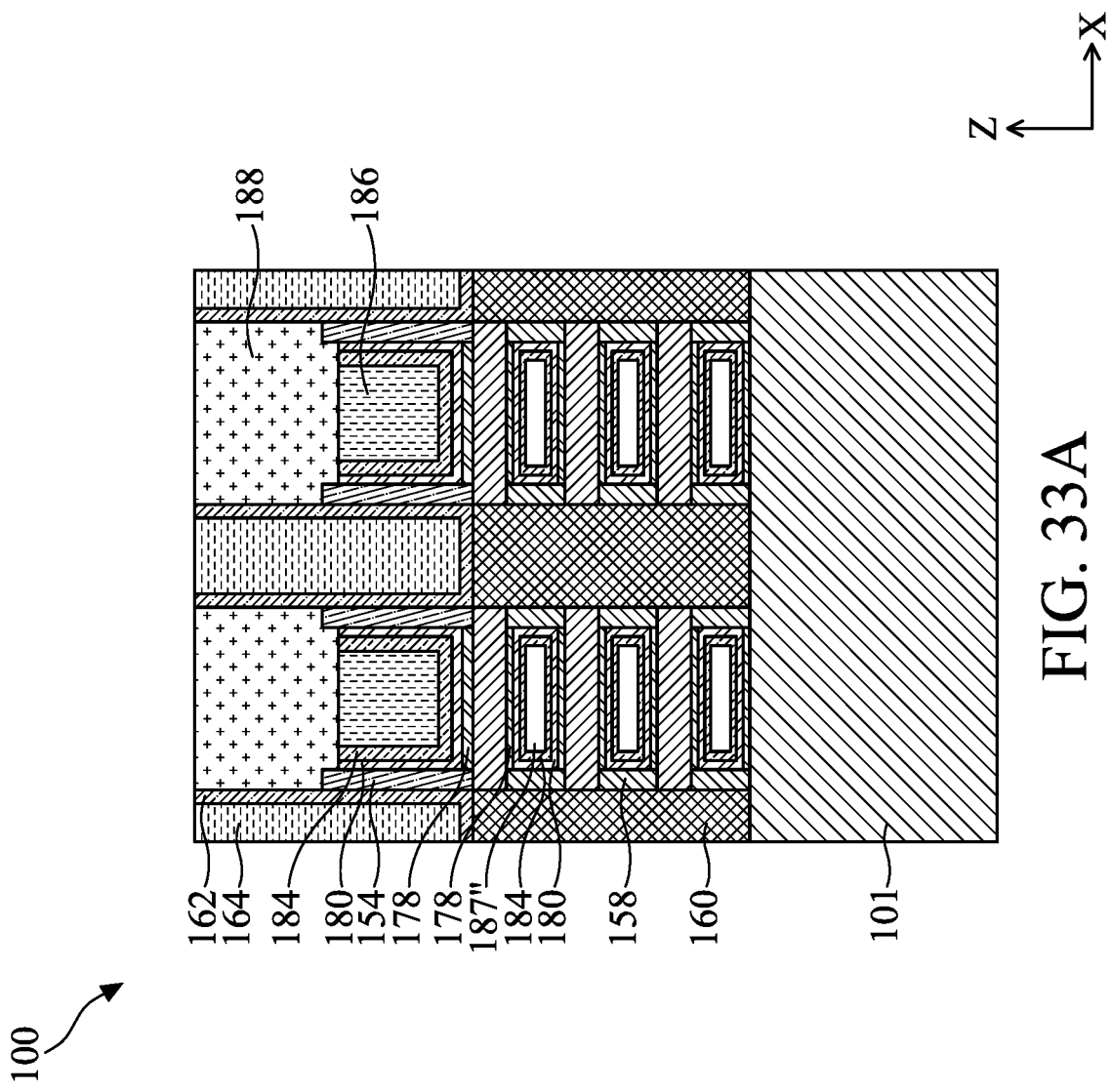
FIGS. 33A and 33B are cross-sectional side views of one of various stages of manufacturing the semiconductor device structure taken along cross-section A-A and cross-section B-B of FIG. 31, respectively, in accordance with some embodiments.
Figure 33B:
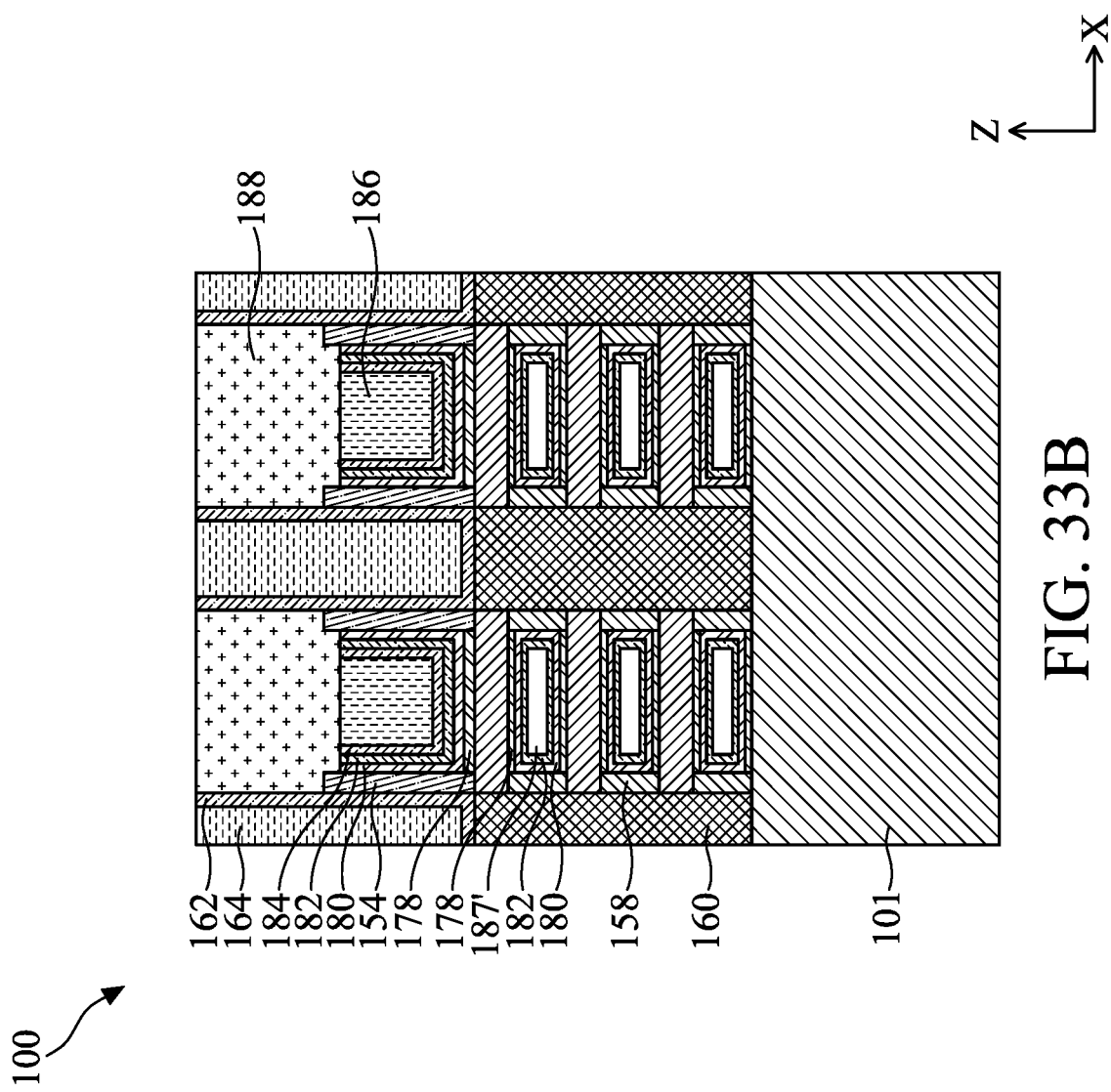

FIGS. 33A and 33B are cross-sectional side views of one of various stages of manufacturing the semiconductor device structure 100 taken along cross-section A-A and cross-section B-B of FIG. 31, respectively, in accordance with some embodiments. In FIGS. 33A and 33B, one or more metal gate etching back (MGEB) processes are performed to remove portions of the metal layer 186, the second gate electrode layer 184, and the HK dielectric layer 180 over the fin structure 112c. A resist layer, such as the resist layer 191' shown in FIG. 28, may be deposited over the n-channel FETs and p-channel FETs, such as the n-channel FET formed on the fin structure 112b and p-channel FET formed on the fin structure 112a, before performing the MGEB process on the p-channel FETs, such as the p-channel FET on the fin structure 112c. The MGEB processes are performed so that the top surfaces of the second gate electrode layer 184 and the HK dielectric layer 180 are substantially co-planar. In some embodiments, portions of the spacers 154 are also etched back so that the top surface of the spacers 154 is higher than the top surfaces of the second gate electrode layer 184 and the HK dielectric layer 180, as shown in FIG. 33A.

After the MGEB process is performed on the p-channel FETs, one or more MGEB processes are performed to remove the first gate electrode layer 182, the second gate electrode layer 184, and the HK dielectric layer 180. Likewise, a resist layer, such as the resist layer 191 shown in FIG. 24, may be deposited over the p-channel FETs, such as the p-channel FET on the fin structure 112c, before performing the MGEB process on the n-channel FETs and p-channel FETs, such as the n-channel FET formed on the fin structure 112b and p-channel FET formed on the fin structure 112a. The MGEB processes are performed so that the top surfaces of the first gate electrode layer 182, the second gate electrode layer 184, and the HK dielectric layer 180 are substantially co-planar. In some embodiments, portions of the spacers 154 are also etched back so that the top surface of the spacers 154 is higher than the top surfaces of the first gate electrode layer 182, the second gate electrode layer 184, and the HK dielectric layer 180, as shown in FIG. 33B.

By etching the spacers 154 below the CESL 162, the spacers 154 can be protected by the subsequently formed SAC layer 188 while forming source/drain metal contacts. In addition, keeping the spacers 154 at a level higher than the HK dielectric layer 180 and the first and second gate electrode layer 182, 184 allows the first and second gate electrode layer 182, 184 remain protected by the spacers 154.

Next, a self-aligned contact (SAC) layer 188 is filled in the trenches formed above the metal layer 186 as a result of the MGEB processes. The SAC layer 188 can be used as an etch stop layer during subsequent trench and via patterning for metal contacts. The SAC layer 188 may be any dielectric material that has different etch selectivity than the CESL layer 162 and the subsequently formed source/drain metal contact (e.g., S/D contacts 190 in FIGS. 34A and 34B). Suitable materials for the SAC layer 188 may include, but are not limited to, SiO, HfSi, SiOC, AlO, ZrSi, AlON, ZrO, HfO, TiO, ZrAlO, ZnO, TaO, LaO, YO, TaCN, SiN, SiOCN, SiOCN, ZrN, SiCN, or any combinations thereof. The SAC layer 188 may be formed by a suitable deposition process, such as CVD, FCVD, PVD, or ALD. Alternatively, the SAC layer 188 is optional and may not exist.

After filling the trenches with the SAC layer 188, a planarization process, such as a CMP process, is performed to remove excess deposition of the SAC layer 188 to expose the top surface of the ILD layer 164, as shown in FIGS. 33A and 33B.

Figure 34A:
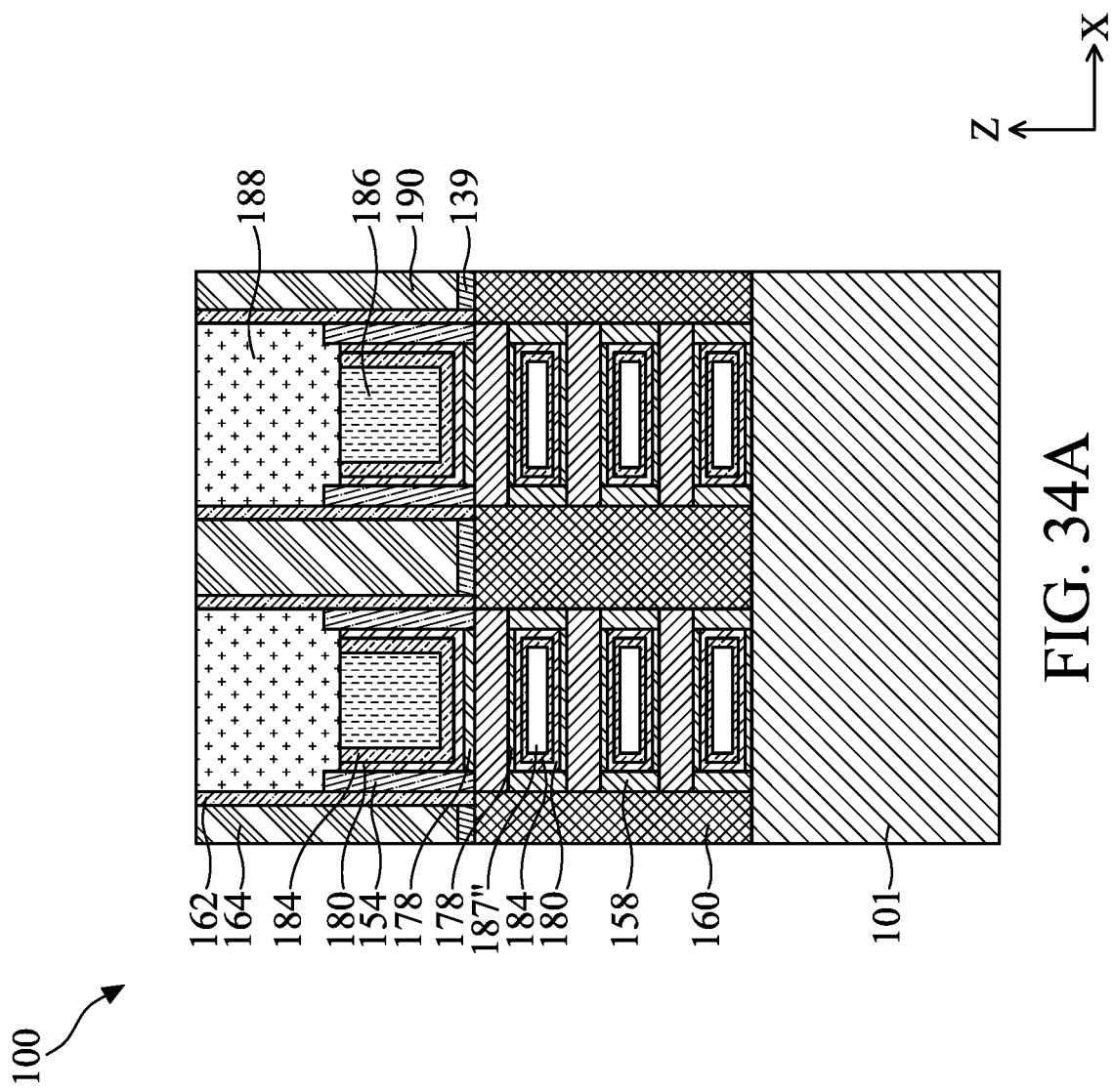
FIGS. 34A and 34B are cross-sectional side views of one of various stages of manufacturing the semiconductor device structure taken along cross-section A-A and cross-section B-B of FIG. 31, respectively, in accordance with some embodiments.
Figure 34B:
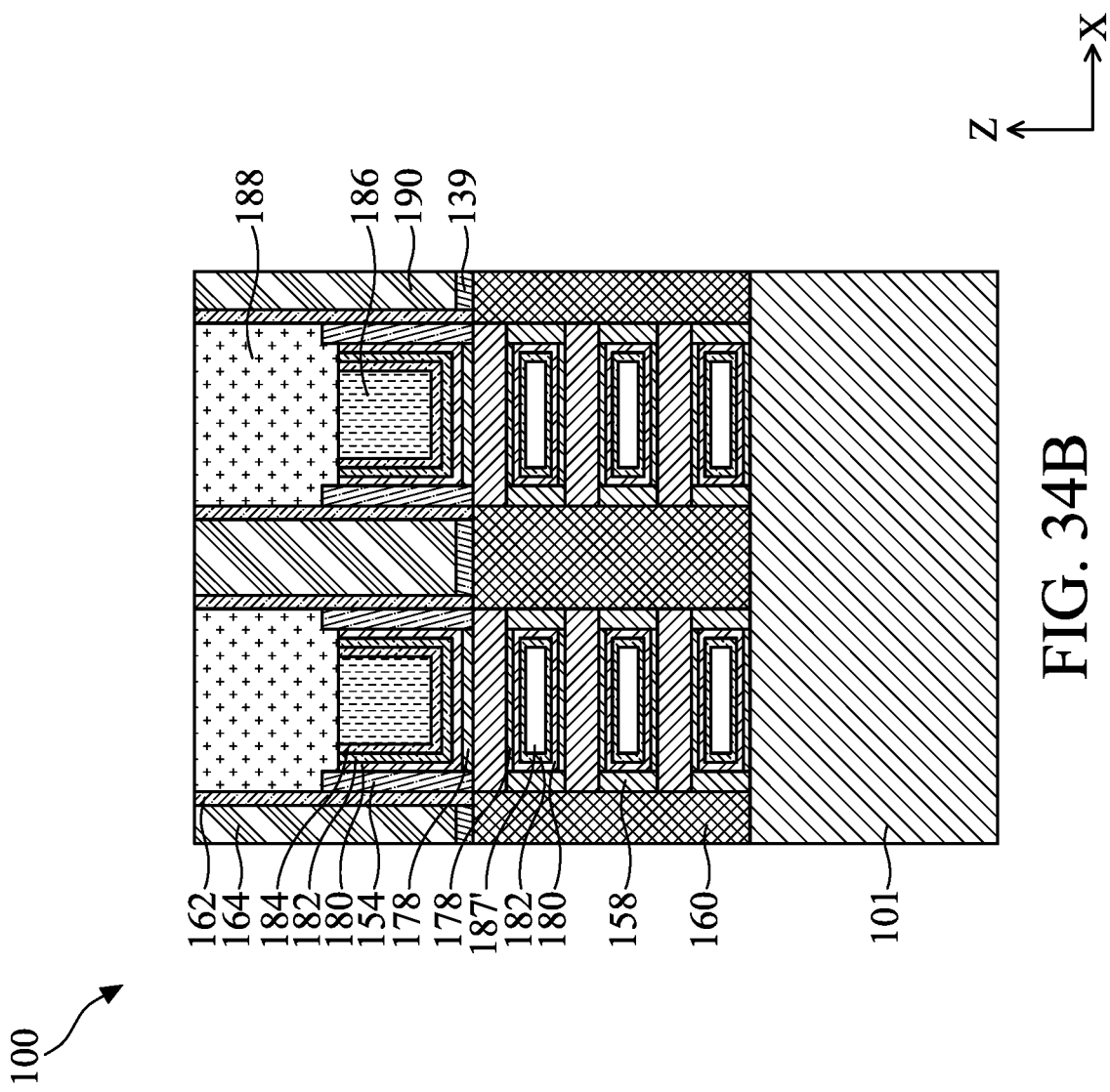

FIGS. 34A and 34B are cross-sectional side views of one of various stages of manufacturing the semiconductor device structure 100 taken along cross-section A-A and cross-section B-B of FIG. 31, respectively, in accordance with some embodiments. In FIGS. 34A and 34B, S/D contracts 190 are formed through the ILD layer 164 and the CESL 162 to be in contact with the epitaxial S/D features 160 via a silicide layer 139. The S/D contracts 190 may be made of a material including one or more of Ru, Mo, Co, Ni. W, Ti, Ta, Cu, Al, TiN and TaN, any suitable metal material, and can be formed by CVD, ALD, electro-plating, or other suitable deposition technique. The silicide layers 139 may be made of a metal or metal alloy silicide, and the metal includes a noble metal, a refractory metal, a rare earth metal, alloys thereof, or combinations thereof. For n-channel FETs, the silicide layers 139 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layers 139 may be made of a material including one or more of NiSi, CoSi, MnSi, Wsi, FeSi, RhSi, PdSi, RuSi, PtSi, IrSi, OsSi, or combinations thereof. Once the S/D contracts 190 are formed, a planarization process, such as CMP, is performed to expose the top surface of the SAC layer 188 (or top surface of the metal layer 186 if the SAC layer 188 was not used).

Figure 35:
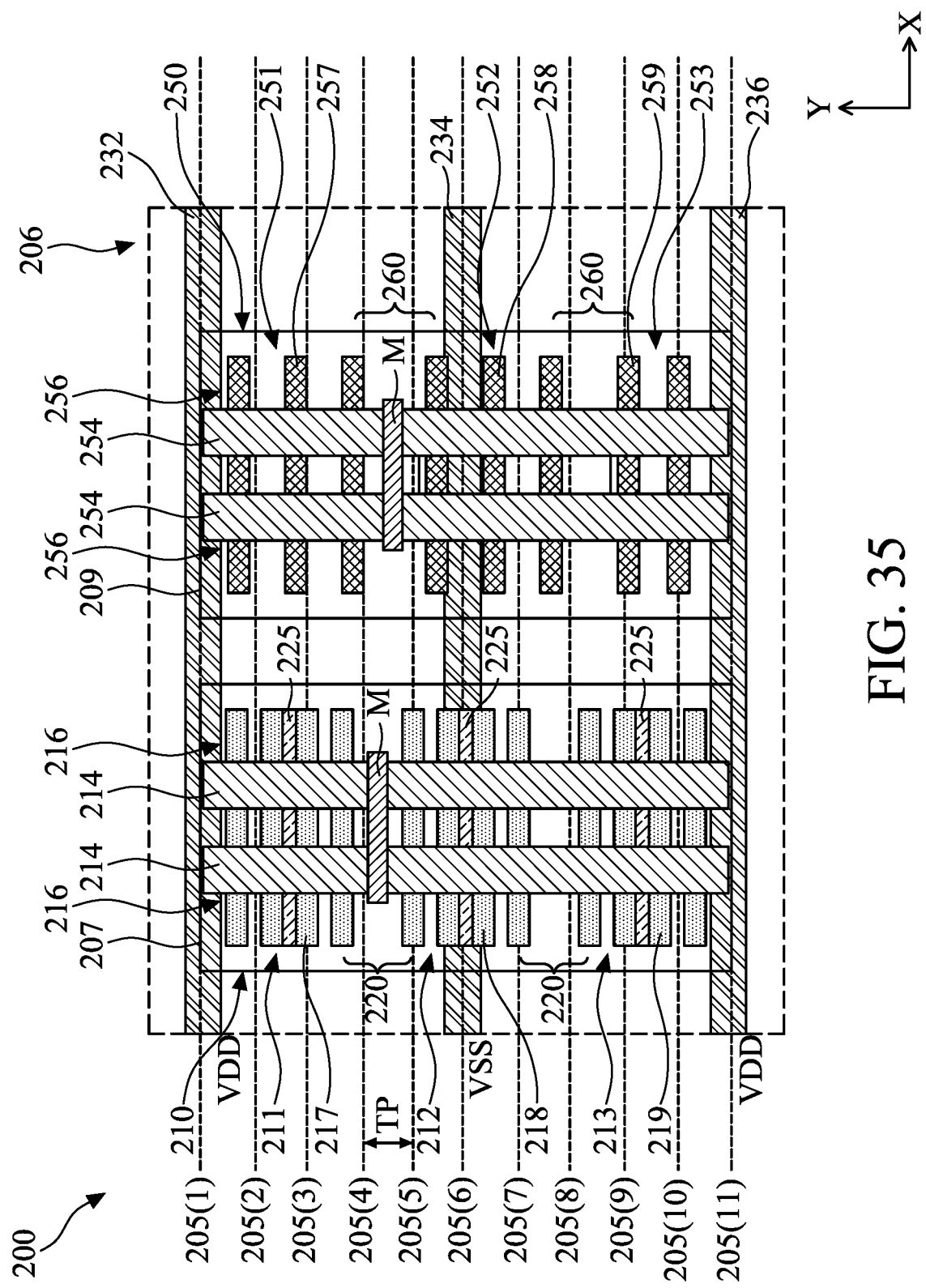
FIG. 35 is an exemplary layout diagram of a section of an IC circuit in accordance with some embodiments.

FIG. 35 is an exemplary layout diagram 200 of a section of an IC circuit in accordance with some embodiments. The layout diagram 200 includes a cell structure 206 having cells 210, 250. The cell 210 includes first, second, and third transistor regions 211, 212, 213, gates 214, source and drain (S/D) region 216, and active regions 217, 218, 219. The gates 214 have S/D region 216 disposed on either side thereof. The active regions 217, 218, 219 each includes fin structures, such as fin structures 112a, 112b shown in FIG. 31. The active regions 217, 218, 219 extend from left to right cell boundaries 207 of the cell 210. The active regions 217, 218, 219 are separated by either a portion of the substrate or an isolation structure 220. Metal portion "M" are coupled to the gates 214 to connect circuit elements. A dielectric feature 225, such as the dielectric feature 130 shown in FIG. 31, is formed between and coupled to two adjacent fin structures in the active regions 217, 218, 219 to form forksheet transistors.

The cell 250 includes first, second, and third transistor regions 251, 252, 253, gates 254, source and drain (S/D) region 256, and active regions 257, 258, 259. The gates 254 have S/D region 256 disposed on either side thereof. The active regions 257, 258, 259 each includes fin structures extending from left to right cell boundaries 209 of the cell 250. The active regions 257, 258, 259 are separated by either a portion of the substrate or an isolation structure 260. Metal portion "M" are coupled to the gates 254 to connect circuit elements.

The cell structure 206 further includes a plurality of conductors 232, 234, 236 alternately arranged and extended across the cell structure 206 along the X-axis. The conductors 232, 236 are coupled to power supply VDD, and the conductor 234 is coupled to power supply VSS. The layout diagram 200 are arranged with respect to track lines, including track lines 205(1), 205(2), 205(3), . . . , 205(10), and 205(11), which are oriented substantially parallel to the X-axis. Track lines 205(1)-205(11) have a pitch "TP", determined by the design rules and scale of the corresponding semiconductor process technology node. The track lines 205(1)-205(11) are formed in a metal layer at a different level (i.e., above the transistor level) and are used to route signal (interconnect) lines for passing signals between the cells. A standard cell's height is determined by the number of horizontal tracks extending between the uppermost and lowermost cell boundaries 207, 209 of the cells 210, 250, respectively. Standard cells typically range in height from approximately 7 to 15 tracks, for example.

In the embodiment shown in FIG. 35, each of the transistor regions 211, 212, 213 in the cell 210 employs forksheet transistors formed in accordance with various embodiments of the present disclosure, such as the forksheet transistor shown in the semiconductor device 100 of FIG. 31. That is, the nanosheet channels of the forksheet transistors in each of the transistor regions 211, 212, 213 in the cell 210 have distal ends formed at a reduced distance to adjacent dielectric features, that is, reduced end cap region (e.g., end cap region 181 between distal ends of the first semiconductor layers 106 and sidewalls of the dielectric features 130, 134 as shown in FIG. 19A). In contrast, each of the transistor regions 251, 252, 253 in the cell 250 employ traditional nanosheet transistor which does not require a dielectric isolation between n-type and p-type transistors. Therefore, while both cells 210, 250 occupy the same number of the track lines 205(1)-205(11), the overall density of the active transistors in each transistor region 211, 212, 213 is increased due to narrower end cap region of the inventive forksheet transistors. The increased density of the active transistors represents a reduction in cell's height of the cell 210 as compared to the cell 250.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 160 to a backside power rail (e.g., positive voltage VDD or negative voltage VSS) through the backside contacts.

The present disclosure provides a semiconductor device structure including one or more nanosheet channels extended from two opposing sides of a dielectric feature to form a forksheet transistor. The dielectric structure is disposed between p-channel FET and n-channel FET devices. The distal ends of nanosheet channels of the forksheet transistor are formed at a reduced distance to adjacent dielectric features so that a subsequent gate electrode layer is merged at a region formed between the distal ends of the nanosheet channels of the forksheet transistor and the adjacent dielectric features. The improved forksheet transistor allows a further reduction of cell-height and overall cell area reduction.

An embodiment is a semiconductor device structure. The structure includes a first dielectric feature extending along a first direction, the first dielectric feature comprising a first dielectric layer having a first sidewall and a second sidewall opposing the first sidewall, a first semiconductor layer disposed adjacent the first sidewall, the first semiconductor layer extending along a second direction perpendicular to the first direction, a second dielectric feature extending along the first direction, the second dielectric feature disposed adjacent the first semiconductor layer, and a first gate electrode layer surrounding at least three surfaces of the first semiconductor layer, and a portion of the first gate electrode layer is exposed to a first air gap.

Another embodiment is a semiconductor device structure. The structure includes a first dielectric feature having a first sidewall and a second sidewall opposing the first sidewall, a first semiconductor layer extending laterally from the first sidewall, a second semiconductor layer extending laterally from the second sidewall, a third semiconductor layer extending laterally from the first sidewall, the third semiconductor layer being parallel to and spaced apart from the first semiconductor layer by a first spacing, a fourth semiconductor layer extending laterally from the second sidewall and being parallel to the second semiconductor layer, a first gate electrode layer surrounding at least three surfaces of each of the first and third semiconductor layers, and a second dielectric feature disposed adjacent to the first and third semiconductor layers, the second dielectric feature being spaced apart from the first and third semiconductor layers by a second spacing, wherein the second spacing is smaller than the first spacing.

A further embodiment is a method. The method includes forming first and second fin structures from a substrate, wherein the first fin includes a first plurality of semiconductor layers, and the second fin includes a second plurality of semiconductor layers, wherein each of the first and second plurality of semiconductor layers comprises first semiconductor layers and second semiconductor layers, forming a first dielectric feature between the first plurality of semiconductor layers and the second plurality of semiconductor layers, forming a second dielectric feature adjacent the first plurality of semiconductor layers, forming a third dielectric feature adjacent the second plurality of semiconductor layers, forming a sacrificial gate stack on a portion of the first fin, the second fin, and the first, second, and third dielectric features, wherein a portion of the first fin, the second fin, and the first, second, and third dielectric features are exposed, removing a portion of exposed portions of the first and second fins not covered by the sacrificial gate stack, removing the sacrificial gate stack to expose portions of the first and second fins, removing the second semiconductor layers of the first and second plurality of semiconductor layers so that the first semiconductor layers are spaced apart from each other by a first spacing, and the second dielectric feature is spaced apart from the first semiconductor layers by a second spacing smaller than the first spacing, and forming a first gate electrode layer to surround at least three surfaces of the first semiconductor layers of the first plurality of semiconductor layers, wherein the first gate electrode layer is exposed to a first air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
forming first and second fin structures from a substrate, wherein the first fin includes a first plurality of semiconductor layers, and the second fin includes a second plurality of semiconductor layers, wherein each of the first and second plurality of semiconductor layers comprises first semiconductor layers and second semiconductor layers;
forming a first dielectric feature between the first plurality of semiconductor layers and the second plurality of semiconductor layers;
forming a second dielectric feature adjacent the first plurality of semiconductor layers;
forming a third dielectric feature adjacent the second plurality of semiconductor layers;
forming a sacrificial gate stack on a portion of the first fin, the second fin, and the first, second, and third dielectric features, wherein a portion of the first fin, the second fin, and the first, second, and third dielectric features are exposed;
removing a portion of exposed portions of the first and second fins not covered by the sacrificial gate stack;
removing the sacrificial gate stack to expose portions of the first and second fins;
removing the second semiconductor layers of the first and second plurality of semiconductor layers so that the first semiconductor layers are spaced apart from each other by a first spacing, and the second dielectric feature is spaced apart from the first semiconductor layers by a second spacing smaller than the first spacing; and
forming a dummy material over the first, second, and third dielectric features and to surround at least three surfaces of the first semiconductor layers of the first and second plurality of semiconductor layers;
removing a portion of the dummy material to expose a portion of the first, second, and third dielectric features;
forming a mask layer over the exposed portion of the first, second, and third dielectric features;

removing the mask layer and a portion of the dummy material to expose the third dielectric feature and at least three surfaces of the first semiconductor layers of the first plurality of semiconductor layers; and forming a first gate electrode layer to surround at least three surfaces of the first semiconductor layers of the first plurality of semiconductor layers, wherein the first gate electrode layer is exposed to a first air gap defined by the first spacing.

2. The method of claim 1, further comprising:
after forming the first gate electrode layer, removing the dummy material to expose the second dielectric feature and at least three surfaces of the first semiconductor layers of the second plurality of semiconductor layers; and forming a second gate electrode layer to surround at least three surfaces of the first semiconductor layers of the second plurality of semiconductor layers, wherein the second gate electrode layer is exposed to a second air gap.

3. A method for forming a semiconductor device structure, comprising:
forming a first dielectric wall between a plurality of first semiconductor layers and a plurality of second semiconductor layers, wherein the plurality of first and second semiconductor layers are vertically stacked and parallelly arranged;
forming a second dielectric wall adjacent to the plurality of first semiconductor layers;
forming a third dielectric wall adjacent to the plurality of second semiconductor layers;
forming a dummy material over the first dielectric wall, the second dielectric wall, the third dielectric wall, and the plurality of first and second semiconductor layers, wherein the dummy material is deposited so that the dummy material over the second and third dielectric walls and the dummy material over each of plurality of first and second semiconductor layers are merged, and the dummy material partially fills regions between adjacent first semiconductor layers and regions between adjacent second semiconductor layers such that an air gap is formed in the regions between adjacent first semiconductor layers of the plurality of first semiconductor layers and regions between adjacent second semiconductor layers of the plurality of second semiconductor layers; and
after forming a dummy material over the first dielectric wall, the second dielectric wall, the third dielectric wall, and the plurality of first and second semiconductor layers, performing an etch-back process so that a top of the dummy material is recessed to a level between a top surface and a bottom surface of a topmost first semiconductor layer of the plurality of first semiconductor layers.

4. The method of claim 3, further comprising:
forming a mask layer over the first, second, and third dielectric walls and over the topmost semiconductor layer of the plurality of first semiconductor layers.

5. The method of claim 4, wherein a portion of the mask layer is disposed between the second dielectric wall and the topmost first semiconductor layer and in contact with the dummy material.

6. The method of claim 4, further comprising:
removing a portion of the mask layer and the dummy material formed over the plurality of second semiconductor layers.

7. The method of claim 6, further comprising:
selectively removing the mask layer over the plurality of first semiconductor layers without removing and dummy material over the plurality of first semiconductor layers.

8. The method of claim 7, further comprising:
surrounding at least three surfaces of each of the plurality of second semiconductor layers with a first gate electrode layer, wherein the first gate electrode layer partially fills regions between adjacent second semiconductor layers.

9. The method of claim 8, wherein a portion of the first gate electrode layer is disposed between the second dielectric wall and the topmost first semiconductor layer and in contact with the dummy material.

10. The method of claim 8, further comprising:
removing a portion of the first gate electrode layer and the dummy material over the plurality of first semiconductor layers; and
surrounding at least three surfaces of each of the plurality of first semiconductor layers with a second gate electrode layer, wherein the first gate electrode layer and the first gate electrode layer are chemically different from each other, and the second gate electrode layer partially fills regions between adjacent first semiconductor layers.

11. The method of claim 10, wherein the second gate electrode layer is deposited so that the second gate electrode layer over the second dielectric wall and the second gate electrode layer over each of plurality of first semiconductor layers are merged.

12. The method of claim 3, wherein each of the first, second, and third dielectric walls comprises:
a first dielectric layer in contact with the plurality of first semiconductor layers and the plurality of second semiconductor layers; and
a second dielectric layer disposed on the first dielectric layer.

13. The method of claim 12, wherein the first dielectric layer comprises a high-K material and the second dielectric layer comprise a low-K material.

14. A method for forming a semiconductor device structure, comprising:
forming first and second fin structures from a substrate, wherein each of first and second fin structures comprises first plurality of semiconductor layers and second plurality of semiconductor layers vertically stacked;
forming an insulation region around a portion of exposed surfaces of the first and second fin structures;
fondling a first dielectric wall over the insulation region between the first fin structures and the second fin structures;
forming a second dielectric wall and a third dielectric wall so that the second dielectric wall is separated from an end of the first semiconductor layer by a first distance;
removing the second plurality of semiconductor layers from the first and second fin structures, wherein at least the two adjacent first semiconductor layers of the first fin structure define a second distance greater than the first distance;
depositing an interfacial layer (IL) over exposed surfaces of the first plurality of semiconductor layers of the first and second fin structures;
depositing a high-K (HK) dielectric layer on the IL and exposed surfaces of the first, second, and third dielectric walls;
forming a dummy material over the first dielectric wall, the second dielectric wall, the third dielectric wall, and the first plurality of semiconductor layers so that the dummy material over the second and third dielectric walls and the dummy material over the first plurality of semiconductor layers are merged, and the dummy material partially fills regions between adjacent first semiconductor layers of the first fin structure;

removing a portion of the dummy material over the first plurality of semiconductor layers of the second fin structure; and surrounding at least three surfaces of each of the first plurality of semiconductor layers with a first gate electrode layer, and the first gate electrode layer partially fills regions between adjacent first semiconductor layers of the first plurality of semiconductor layers of each first and second fin structure.

15. The method of claim 14, wherein the third dielectric wall is separated from an end of the first semiconductor layer by a third distance less than the second distance.

16. The method of claim 15, further comprising:

after forming a dummy material over the first dielectric wall, the second dielectric wall, the third dielectric wall, and the first plurality of semiconductor layers, performing an etch-back process so that a top of the dummy material is recessed to a level between a top surface and a bottom surface of a topmost first semiconductor layer of the of first plurality of semiconductor layers.

17. The method of claim 16, further comprising:

removing a portion of the dummy material over the first plurality of semiconductor layers of the first fin structure; and surrounding at least three surfaces of each of the first plurality of semiconductor layers with a second gate electrode layer, wherein the first gate electrode layer and the first gate electrode layer are chemically different from each other, and the second gate electrode layer partially fills regions between adjacent first semiconductor layers of the first plurality of semiconductor layers of the first fin structure.

* * * * *